United States Patent
Tzatzov et al.

(10) Patent No.: US 6,436,252 B1
(45) Date of Patent: Aug. 20, 2002

(54) METHOD AND APPARATUS FOR MAGNETRON SPUTTERING

(75) Inventors: Konstantin K. Tzatzov; Alexander S. Gorodetsky, both of Sherwood Park (CA)

(73) Assignee: Surface Engineered Products Corp., Fort Saskatchewan (CA)

( * ) Notice: Subject to any disclaimer, the term of this patent is extended or adjusted under 35 U.S.C. 154(b) by 0 days.

(21) Appl. No.: 09/545,817

(22) Filed: Apr. 7, 2000

(51) Int. Cl.$^7$ ............................................. C23C 14/34
(52) U.S. Cl. ........................... 204/298.22; 204/298.21; 204/298.26; 204/192.12
(58) Field of Search ....................... 204/298.12, 298.21, 204/298.22, 192.12

(56) References Cited

U.S. PATENT DOCUMENTS

| | | | |
|---|---|---|---|
| 3,878,085 A | 4/1975 | Corbani | 204/298 |
| 4,031,424 A | 6/1977 | Penfold et al. | 313/146 |
| 4,126,530 A | 11/1978 | Thornton | 204/192 EC |

(List continued on next page.)

FOREIGN PATENT DOCUMENTS

| | | | | |
|---|---|---|---|---|
| EP | 0 313 750 A1 | 3/1989 | | C23C/14/34 |
| EP | 0 918 351 A1 | 5/1999 | | H01L/37/34 |
| GB | 2 340 845 | 1/2000 | | C23C/14/35 |
| JP | 51 117 986 | * | 10/1976 | |
| JP | 55-27627 | | 11/1977 | |
| JP | 01 244 668 A | * | 10/1989 | 204/298.22 |

OTHER PUBLICATIONS

Denton, A. Richard, "Three Modes of Magnetron Sputtering", Metal Finishing, Jun., 1979, p. 53–57.

(List continued on next page.)

Primary Examiner—Nam Nguyen
Assistant Examiner—Gregg Cantelmo
(74) Attorney, Agent, or Firm—Greenlee, Winner & Sullivan

(57) ABSTRACT

A cathode assembly for magnetron sputtering of a workpiece, and sputtering apparatus and methods of sputtering using same are provided. The cathode assembly includes a tubular cathode, which may be cylindrical in cross section along its length, or which may be curved or flexible, depending on the shape of workpiece that is to be sputtered, and which has a sputtering length of $L_s$. The cathode assembly also includes a magnet package, or a plurality of spaced magnet packages, each magnet package including either one magnet or a plurality of spaced magnets of alternating polarity, and having a magnet package length $L_{pkg}$ which is less than $L_s$. The cathode assembly further includes one or more means for positioning, and preventing radial displacement of, the cathode along the axis of symmetry of the cathode. The magnet package is held within the cathode such that a driving force applied to the magnet package or to the cathode, or to both independently, imparts relative longitudinal movement between the magnet package and the cathode. The cathode assembly preferably includes cooling means. Furthermore, the magnet package(s) is preferably held within the cathode for shuttle movement. The cathode assembly allows for variations of one or more of the magnet package length, number, and spacing, and the relative displacement distance or shuttle distance, in order to tailor the erosion profile along the axis of symmetry of the cathode.

290 Claims, 20 Drawing Sheets

U.S. PATENT DOCUMENTS

| | | | | |
|---|---|---|---|---|
| 4,128,466 | A | 12/1978 | Harding et al. | 204/192 C |
| 4,179,351 | A | 12/1979 | Hawton, Jr. et al. | 204/298 |
| 4,221,652 | A | 9/1980 | Kuriyama | 204/298 |
| 4,243,505 | A | 1/1981 | Penfold | 204/298 |
| 4,309,261 | A | 1/1982 | Harding et al. | 204/192 R |
| 4,339,484 | A | 7/1982 | Harding | 428/36 |
| 4,356,073 | A | 10/1982 | McKelvey | 204/192 R |
| 4,376,025 | A | 3/1983 | Zega | 204/192 R |
| 4,407,713 | A | 10/1983 | Zega | 204/298 |
| 4,417,968 | A | 11/1983 | McKelvey | 204/192 R |
| 4,422,916 | A | 12/1983 | McKelvey | 204/192 R |
| 4,443,318 | A | 4/1984 | McKelvey | 204/298 |
| 4,445,997 | A | 5/1984 | McKelvey | 204/298 |
| 4,471,003 | A | 9/1984 | Cann | 427/34 |
| 4,492,845 | A | 1/1985 | Kljuchko et al. | 219/121 P |
| 4,525,264 | A | 6/1985 | Hoffman | 204/298 |
| 4,572,759 | A | 2/1986 | Benzing | 156/345 |
| 4,600,492 | A | 7/1986 | Ooshio et al. | 204/298 |
| 4,851,095 | A * | 7/1989 | Scobey et al. | 204/192.12 |
| 4,904,362 | A | 2/1990 | Gaertner et al. | 204/192.12 |
| 4,995,958 | A | 2/1991 | Anderson et al. | 204/298.2 |
| 5,047,131 | A | 9/1991 | Wolfe et al. | 204/192.23 |
| 5,106,474 | A | 4/1992 | Dickey et al. | 204/298.14 |
| 5,162,296 | A | 11/1992 | Yamazaki | 505/1 |
| 5,188,717 | A | 2/1993 | Broadbent et al. | 204/192.12 |
| 5,194,131 | A | 3/1993 | Anderson | 204/192.12 |
| 5,298,137 | A | 3/1994 | Marshall, III | 204/192.12 |
| 5,301,211 | A | 4/1994 | Bryan et al. | 376/260 |
| 5,320,728 | A | 6/1994 | Tepman | 204/192.12 |
| 5,328,585 | A | 7/1994 | Stevenson et al. | 204/298.2 |
| 5,382,344 | A | 1/1995 | Hosokawa et al. | 204/298.2 |
| 5,415,754 | A | 5/1995 | Manley | 204/192.12 |
| 5,529,674 | A | 6/1996 | Hedgcoth | 204/298.21 |
| 5,538,609 | A | 7/1996 | Hinterschuster et al. | 204/298.2 |
| 5,571,393 | A | 11/1996 | Taylor et al. | 204/298.21 |
| 5,591,313 | A | 1/1997 | Barber, Jr. et al. | 204/192.12 |
| 5,685,959 | A | 11/1997 | Bourez et al. | 204/192.2 |
| 5,725,746 | A | 3/1998 | Dickey et al. | 204/298.21 |
| 5,855,744 | A | 1/1999 | Halsey et al. | 204/192.12 |
| 5,873,989 | A | 2/1999 | Hughes et al. | 204/298.2 |
| 5,876,573 | A | 3/1999 | Moslehi et al. | 204/192.12 |
| 5,876,576 | A | 3/1999 | Fu | 204/298.2 |
| 6,193,853 | B1 | 2/2001 | Yumshtyk et al. | 204/192.12 |

OTHER PUBLICATIONS

Mattox, D. M. et al., "Technical Note: Design and Performance of a Moveable Post–Cathode Magnetron Sputtering System for Making PBFA II Accelerator Ion Sources", *Surface and Coating Technology*, 33(1987) 425–432.

John A. Thornton and Alan S. Penfold, "Cylindrical Magnetron Sputtering", Academic Press, Inc., 1978, Chapter 11–2, 75–113.

S. J. Walker and D. R. McKenzie, "Magnetron sputtering of solar coatings inside tubes", J. Vac. Sci. Technol., 19(3), Sep./Oct. 1981.

John A. Thornton, "Magnetron sputtering: basic physics and application to cylindrical magnetrons", J. Vac. Sci. Technol. 15(2) Mar./Apr. 1978.

S. Schiller, U. Heisig and K. Goedicke, "On the use of ring gap discharges for high–rate vacuum coating", J. Vac. Sci. Technol. vol. 14, No. 3, May/Jun. 1977.

S. Schiller, U. Heisig and K. Goedicke, "Advances in High Rate Sputtering with Magnetron–Plasmatron Processing and Instrumentation", *Thin Solid Films*, 64 (1979) 455–467.

Tsutomu Tsukada, "Increase of Substrate Temperature in High Rate Coaxial Cylindrical Magnetron Sputtering", Japanese Journal of Applied Physics, vol. 17, No. 5, May, 1978, pp. 787–796.

I. G. Petrov et al., "An Estimation of the Possibilities of the Cylindrical Magnetron Sputtering Systems for Coating of Wires", Bulg. J. Phys. 13 (1986), 3.

Vakuum–Technik, "Processing and Instrumentation in PVD Techniques", 35(1986), pp. 35–47, 50–54.

Bergauer, A. et al. "Post magnetron sputtering of alloys onto inner surfaces of cylindrical substrates", Vacuum v 40 n 1–2 1990, p. 233.

John A. Thornton, "End–effects in cylindrical magnetron sputtering sources", J. Vac. Sci. Technol. 16(1), Jan./Feb. 1979.

Hoffman, D. W., "Desing and Capabilities of a Novel Cylindrical–Post Magnetron Sputtering Source", *Thin Solid Films*, 96 (1982) 217–224.

Kumar, N. et al. "Summary Abstract: Aluminum deposition on optical fibers by a hollow cathode magnetron sputtering system", J. Vac. Sci. Technol A 6 (3), May/Jun. 1988.

Hoshi, Y. et al., "Thin Film Coating Techniques on Wires and Inner Walls of Small Tubes via Cylindrical Magnetron Sputtering", Electrical Engineering in Japan, vol. 103, No. 1, 1983.

* cited by examiner

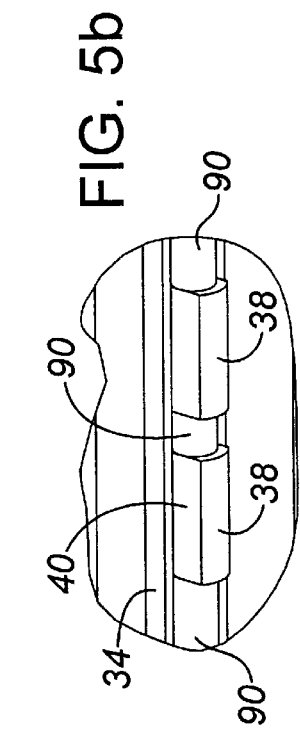
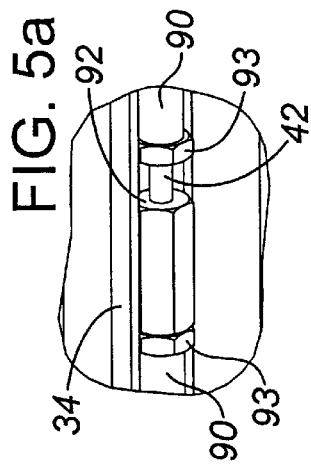
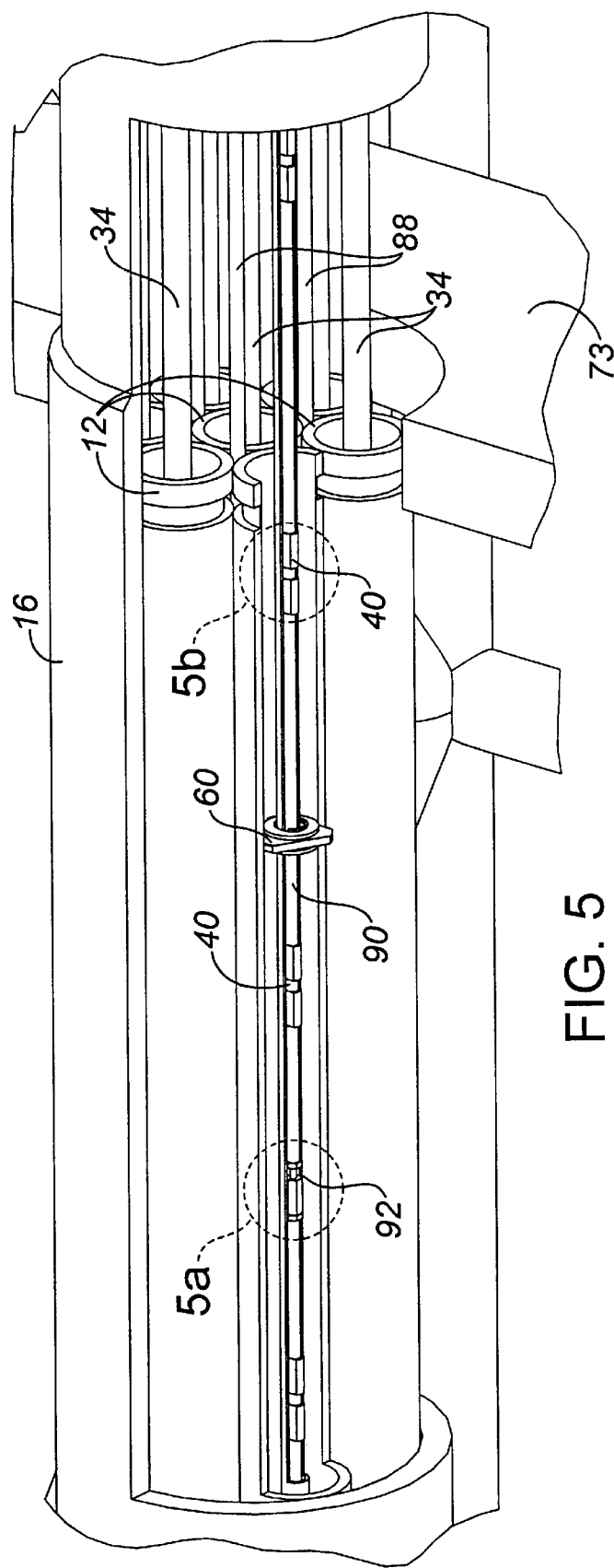

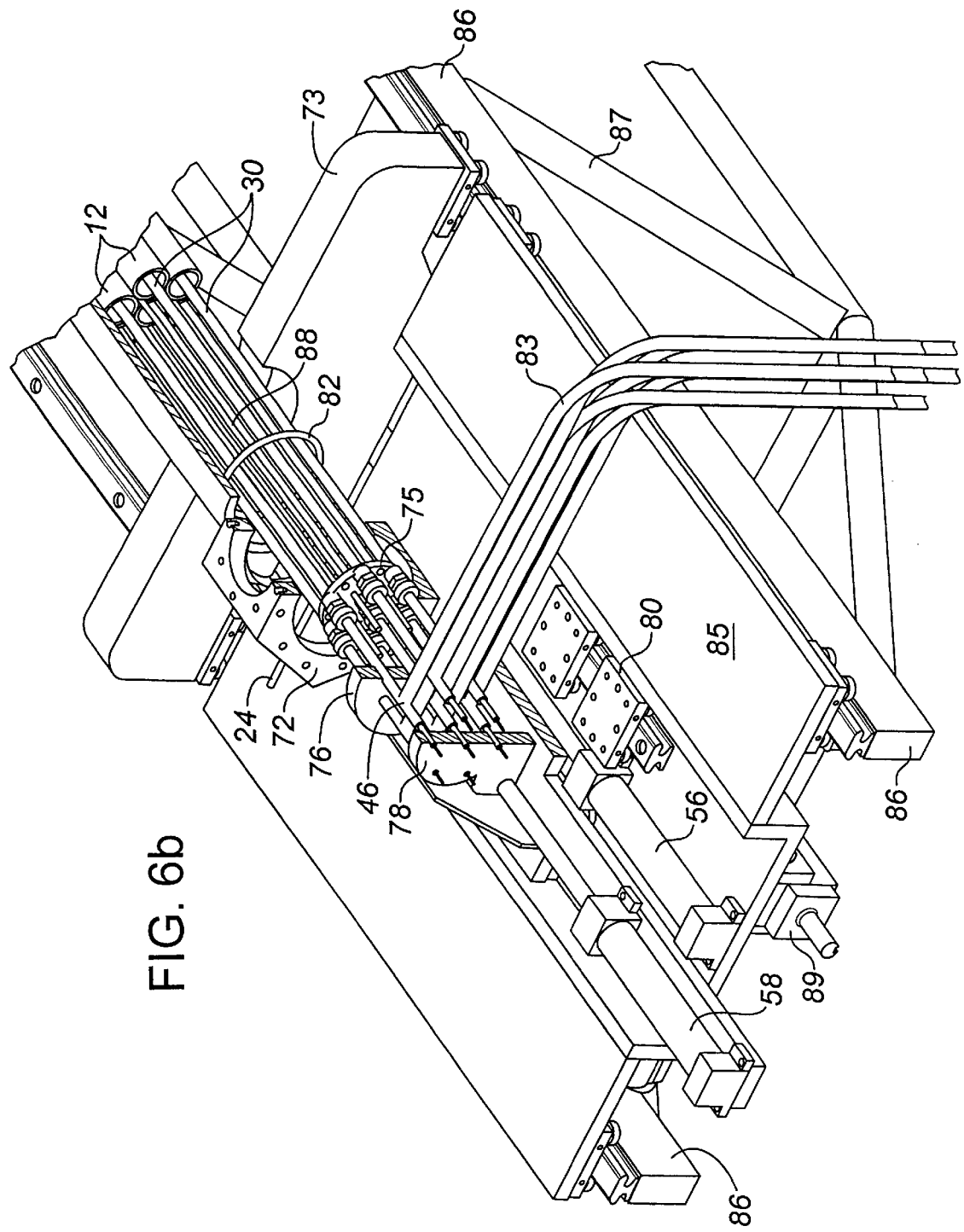

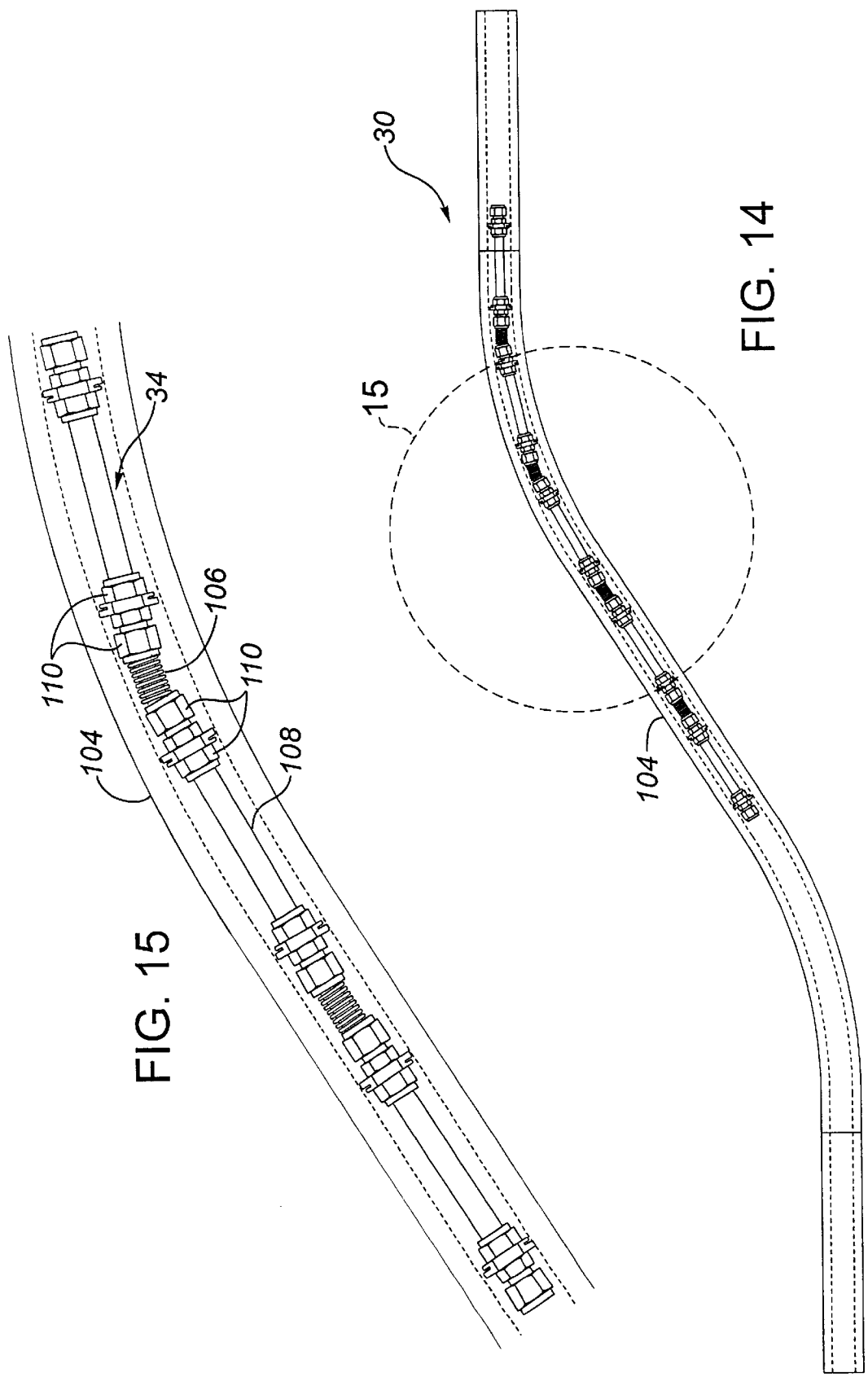

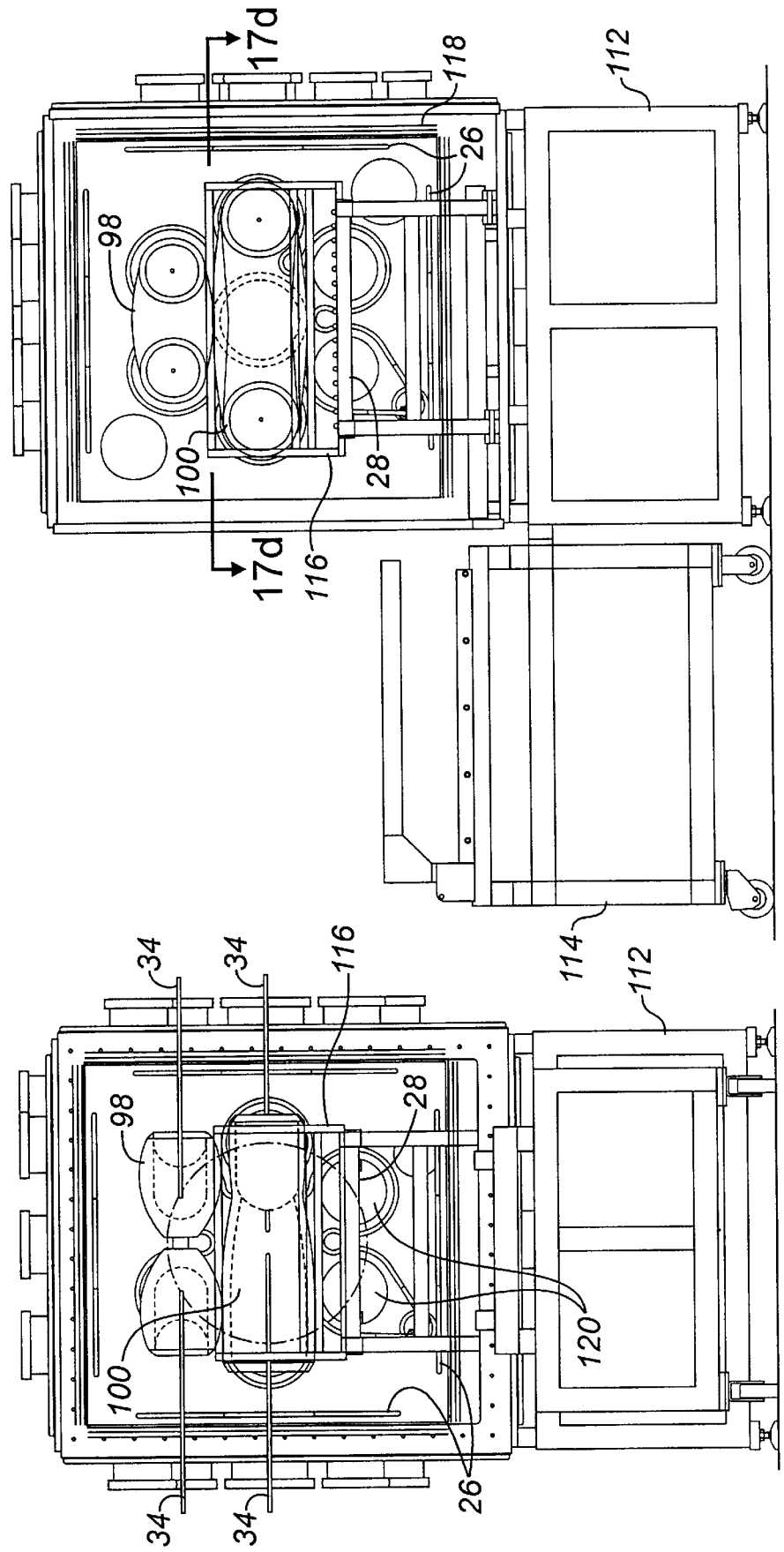

METHOD AND APPARATUS FOR MAGNETRON SPUTTERING

FIELD OF THE INVENTION

The invention relates to the field of magnetron sputtering, more particularly to methods and apparatus for producing coatings on the inside surfaces of cylindrical, curved or irregularly shaped objects, such as the internal surfaces of pipes.

BACKGROUND OF THE INVENTION

Sputter deposition is a process in which the surface of a workpiece is coated with a film/coating of material that is sputtered, i.e., physically eroded by ion bombardment of a target, which is formed of, or coated with, a consumable material (often termed a target material) to be sputtered. Sputtering is conventionally implemented by creating a glow discharge plasma over the surface of the target material in a low pressure gas atmosphere, termed the sputtering gas. Gas ions from the plasma are accelerated by an electric field to bombard and eject atoms from the surface of the target material. These atoms travel through the gas environment until they impact the surface of the workpiece or substrate to be coated where they are deposited, creating a coating layer. For reactive sputtering, the sputtering gas includes a small proportion of a reactive gas, such as oxygen, nitrogen etc., which reacts with the atoms of the target material to form an oxide, nitride etc. coating. DC and pulse (example AC) sputtering techniques are well known, over a wide range of frequencies, including RF sputtering.

In a typical sputtering operation, a target of, or coated with, the consumable material to be sputtered is placed within the low pressure gas plasma and is connected as the cathode. Ions from the sputtering gas, usually a chemically inert noble gas such as argon, bombard the surface of the target and knock off atoms from the target material. The workpiece to be coated is typically placed proximate to the cathode, i.e., within sputtering proximity, such that it is in the path of the sputtered target atoms, such that a film of the target/consumable material is deposited on the surface of the workpiece. The sputtered atoms leave the target surface with relatively high energies and velocities, so that when the atoms bombard the workpiece surface, they intermix into the atomic lattice of the workpiece surface, creating a strong bond.

While the overall yield of the sputtering process, that is the number of atoms sputtered per incident ion, depends on the energy of the incident ions, the overall sputtering rate not only depends on the energies of the incident ions, but also on the number of ions impacting the surface. Both the ion energy and the number of ions are dependent both on the level of ionization in the gas plasma (glow discharge) and on the location of this plasma with respect to the target surface. Therefore, it is desirable that the ions in the plasma be produced adjacent to the target surface, so that their energies are not dissipated by collisions with intervening gas atoms. While the number of gas atoms available for ionization (residual gas pressure) needs to be high, the requirement for minimum interference with sputtered particles acts in opposite direction. Consequentially, there is a need for high ionization efficiency and relatively low gas atom concentration.

One known way to improve the efficiency of glow discharge sputtering is to use magnetic fields to confine electrons to the glow region in the vicinity of the cathode/target surface. This process is termed magnetron sputtering. The addition of such magnetic fields increases the rate of ionization. In magnetron sputtering devices, electrons emitted from the target surface accelerate to a drift velocity that is orthogonal to both the directions of the electric field and the magnetic field as measured near the surface of the target. In most magnetron sputtering devices, the paths traveled by these electrons form a closed loop. Furthermore, such devices are typically designed so that the magnetic field lines form arches along which the electrons drift. As the electrons are emitted from the target surface, they move in proximity to the target surface, "frozen by the magnetic field", thereby increasing the average ionization probability, but typically cause uneven erosion of the target material as a result of the non-uniform ionization probability along the target surface.

Magnetron sputtering increases the efficiency of the plasma generation because all of the electrons caught in the magnetic field have an increased effective path length in the proximity of the target, that is, each electron emitted from the target surface has a much longer distance of travel while in proximity to the target. The result is that the electrons have collisions with a much higher number of gas atoms, while still near the target. Accordingly, the resulting higher intensity plasma has more ions available to bombard the surface, resulting in a higher sputtered flux.

Magnetron sputtering processes are classified as planar or cylindrical. The planar (circular, rectangular and triangular shaped) magnetron sputtering devices generally suffer from non-uniform erosion, with the area of maximum erosion in the shape of a racetrack centered around the magnet position, rendering the target unusable after use, even while relatively large amounts of useful target material still remain. Also, planar magnetrons often employ large magnet structures, making them generally useless for creating films inside structures with hollow workpieces having annular cavities, such as narrow diameter pipes etc.

Several different types of cylindrical magnetron sputtering devices have been developed, as disclosed and summarized by Thornton et al., "Cylindrical Magnetron Sputtering", 1978 Academic Press, Inc., pp. 75–113. Cylindrical magnetron sputtering devices are used to coat cylindrical workpieces, such as the inside surfaces of pipes. Basically, the target material in a cylindrical magnetron sputtering device is in the form of an elongated tube. In U.S. Pat. No. 4,031,424, issued to Penfold, solenoid coils are disposed around the outside of the magnetron chamber to provide the confining magnetic fields, and to create magnetic fields having flux lines parallel to the axis of the elongated cathode target. Such cylindrical magnetrons tend to be somewhat more even in their erosion patterns, however, they suffer from undesirable end effects, and the solenoid coils are complex and bulky. In a cylindrical magnetron, the electron drift in direction perpendicular to both the electrical and magnetic fields causes the electrons to orbit around a central target post. Unfortunately, the electrons tend to leak out or escape their orbits near each end of the central post, resulting in lower ionization intensities, and thus lower sputtering rates at each end of a cylindrical target. Furthermore the Penfold magnetron sputtering device uses an elongated target that may not be bent or shaped to follow the contours of irregularly shaped objects. If the targets in such magnetrons were to be bent or shaped to the contours of irregularly shaped objects, the magnetic field strength over the target surface would not be uniform, resulting in marked non-uniformity in the plasma sheet, and thus in a non-uniformly sputtered flux along and around the surface of the target.

U.S. Pat. No. 4,376,025 issued to Zega attempts to solve some of the problems associated with the Penfold cylindrical magnetron sputtering apparatus by reorienting the magnetic flux lines circularly around the axis of the elongated rod-like target material, as opposed to the axial orientation used by Penfold. Zega discloses a cylindrical magnetron device utilizing a tubular current-carrying electrode disposed within a tubular target cathode.

Instead of using a separate solenoid coil to generate the plasma confining magnetic field, Zega uses a high current carrying hollow electrical conductor disposed within a tubular target to generate a circumferential magnetic field that surrounds the tubular target. The disadvantage of this approach is that, while very efficient with small diameter targets, it becomes less efficient as the target diameter increases. A further disadvantage of this high current approach is the considerable additional power input needed for the target.

U.S. Pat. No. 4,407,713 issued to Zega discloses a magnetron sputtering device which substitutes a permanent magnet for the tubular cathode, however, the device is cumbersome for use in small diameter pipes, and has little application for hollow workpieces having complex shapes.

Alternative cylindrical sputtering devices are disclosed in U.S. Pat. No. 4,221,652 to Kuriyama, and in U.S. Pat. No. 4,179,351 to Hawton et al. In both devices, a cylindrical cathode comprising the material to be deposited is placed within a substantially cylindrical workpiece. Within the cylindrical cathode are cylindrical magnets oriented symmetrically about the axis of the cylinder for generating a torroidal magnetic field. The cathode surface is located in close proximity of the magnet poles such that magnetic field lines penetrate the cathode and form a closed ring gap. Within the cylindrical cathode also exists a pipeline for introducing a coolant. The multiple permanent magnets produce multiple torroidal volumes or particle racetracks, in which the charged particles are concentrated. This results in multiple erosion zones, each zone being centered upon the center of a magnet, rather than in a single erosion zone, as would be obtained from a single magnet.

Rotating cylindrical magnetrons were developed to overcome some of the effects of non-uniformity of target erosion, see for example U.S. Pat. Nos. 4,356,073 and 4,422,916 issued to McKelvey. However, these devices were cumbersome and limited to the coating of large diameter workpieces.

U.S. Pat. No. 4,904,362 issued to Gaertner et al. attempts to solve the problem of non-uniform erosion described above for the Hawton and Kuriyama patents by introducing an axial movement of the workpiece. In an additional effort to improve the erosion pattern, the permanent magnets inside the target are cut at an angle of 45° to 75° slants to the longitudinal axis of the cathode arrangement and, therefore, have inclined end faces. The magnets generate a stray magnetic field, which causes annular plasma confinement running at an angle to the longitudinal axis. Rotation of the magnets causes a rotation of the plasma zones, a more even sputtering away of the target surface being achieved through this tumbling motion. The disadvantage of the apparatus described by Gaertner et al is the necessity of movement of the work pieces inside the vacuum chamber and/or relatively complicated design of the permanent magnets.

The concept of moving a magnet within a cylindrical magnetron has been suggested by researchers, see for instance U.S. Pat. No. 4,221,652 to Kuriyama; JP Patent Publication No. 55-27627, corresponding to JP Patent 52095581 A, listing inventors Misumi, Takashi and Hosokawa, Naokichi; and S. J. Walker et al., J. Vac. Sci. Technol. 19(3), September/October 1981, 700–703. While these references recognize the possibility of increasing the uniformity of target erosion with moving magnets, none have addressed a commercial process wherein thick coatings are desired on long cylindrical workpieces, or workpieces having complex shapes, II and using significant power densities with adequate cooling. Rather, these references are directed to thin coatings on such materials as integrated circuits or glass tubes, where cooling and power needs are modest.

In summary, there is a still a need for an inexpensive device that can be used to provide uniform coatings on the inside surfaces of simple cylindrical devices such as pipes, and do so with generally uniform target erosion. Despite many efforts to provide a cylindrical magnetron sputtering devices to coat even simple internal cylindrical surfaces, most of the designs have not been commercially developed, and thus exist as laboratory, small scale designs. Furthermore, to the inventors' knowledge, none of these designs has addressed the much more complex problems associated with coating irregular, annular surfaces, such as U-bends in pipes or Y-joints and the like. Neither does there exist a simple cylindrical magnetron sputtering device for simultaneous coating of multiple workpieces, in a cost-effective manner.

SUMMARY OF THE INVENTION

In accordance with the present invention, there is provided a magnetron sputtering apparatus and method with a novel cathode assembly which is capable of achieving uniform deposition rates over an entire surface of annular cavities within hollow workpieces, while at the same time achieving a uniform and/or controlled erosion rate over the entire surface of the target. The cathode assembly of this invention can be used to coat the inside surfaces of annular cavities such as cylindrical pipes, and even complex shaped hollow workpieces such as U-bends, Y-joints, reducing elbows in pipes and fittings, and S-shaped pipes. Furthermore, the cathode assembly of this invention can be used for simultaneous coating of the annular cavities of a plurality of hollow workpieces. The cathode assembly of this invention can also be adapted for the sequential, multilayer coatings of materials of different target materials.

In one broad aspect, the invention provides a cathode assembly for magnetron sputtering the annular cavity of a hollow, curved workpiece, for instance a U-bend or reducing elbow pipe fitting. This cathode assembly comprises:

a tubular cathode generally shaped to follow an axis of symmetry of the annular cavity of the workpiece;

one or a plurality of magnets held within the cathode such that a driving force applied to the one or plurality of magnets imparts relative longitudinal movement between the magnets and the cathode;

in the case of a plurality of magnets, said magnets being arranged in one or more magnet packages with each magnet package including one magnet, or a plurality of spaced magnets arranged with alternating polarity; and preferably means for cooling the cathode.

In another aspect of the invention, there is provided a flexible cathode assembly for magnetron sputtering an annular cavity of a hollow workpiece such as an S-shaped pipe. The flexible cathode assembly comprises:

a tubular cathode generally shaped to follow an axis of symmetry of the annular cavity of the workpiece, the cathode being flexible to allow the cathode to be inserted into the annular cavity of the workpiece and to position, and optionally to move, the cathode generally along the axis of symmetry of the annular cavity of the workpiece;

one or a plurality of magnets held within the cathode such that a driving force applied to the one or plurality of magnets, or to the cathode, or to both the one or plurality of magnets and to the cathode independently, imparts relative longitudinal movement between the one or plurality of magnets and the cathode;

in the case of a plurality of magnets, said magnets being arranged in one or more magnet packages with each magnet package including one magnet, or a plurality of spaced magnets arranged with alternating polarity; and preferably means for cooling the cathode.

Another aspect of the invention broadly provides a cathode assembly for magnetron sputtering of a workpiece, whether it be a hollow workpiece or a planar workpiece. The cathode assembly includes, within a tubular cathode, one or a plurality of spaced magnets arranged in a plurality of spaced magnet packages, arranged for relative longitudinal movement between the magnet package and the cathode, and more particularly comprises:

a tubular cathode having a sputtering length of $L_s$;

a plurality of spaced magnet packages, each of the magnet packages including either one magnet or a plurality of spaced magnets of alternating polarity, and having a magnet package length $L_{pkg}$;

the magnet packages being held within the cathode, generally along the axis of symmetry of the cathode, such that a driving force applied to the magnet package or to the cathode, or to both independently, imparts relative longitudinal movement between the magnet package and the cathode a tubular cathode having a sputtering length of $L_s$; and preferably means for cooling the cathode.

Preferably, for embodiments of the cathode assembly which include multiple magnet packages, the spacing between the magnet packages, $L_{spc}$, is sufficiently large compared to $L_{pkg}$, that, during sputtering, the time averaged magnetic field over the cathode surface remains substantially uniform. Generally, the combined length of all the magnet packages and the spaces between the magnets is less than half of $L_s$, and the spacing between the magnet packages, $L_{pkg}$, is equal to or greater than $L_{pkg}$.

Furthermore, the cathode assembly preferably includes a plurality of spaced magnets of alternating polarity within each magnet package, and the magnet packages are held within the cathode such that a push and pull driving force applied to the magnet packages, imparts relative longitudinal shuttle movement between the magnet packages and the cathode.

Another broad aspect of the invention provides a cathode assembly for magnetron sputtering of a workpiece, comprising:

a tubular cathode having a sputtering length of $L_s$;

a magnet package including either one magnet or a plurality of spaced magnets of alternating polarity, and having a magnet package length $L_{pkg}$ which is less than $L_s$, the magnet package being held within the cathode such that a driving force applied to the magnet package or to the cathode, or to both independently, imparts relative longitudinal movement between the magnet package and the cathode;

means for positioning, and preventing radial displacement of, the cathode generally along the axis of symmetry of the cathode; and preferably means for cooling the cathode.

For coating short workpieces, it is possible to form the cathode of sufficiently strong and stiff materials that the cathode is itself self supporting and no additional means of positioning the cathode along the axis of symmetry of the workpiece may be needed. However, for longer cylindrical cathodes, or cathodes which need to follow the axis of symmetry of complex shapes, one or more means for positioning and preventing radial displacement of the cathode is included. In the case where the cathode is cylindrical, such as for sputtering the inside surface of long cylindrical pipes, the means for positioning and preventing radial displacement of the cathode comprises a cathode tension device at each end of the cylindrical cathode for holding the cathode in tension. In addition, and for the cases where the cathode is shaped, the means for positioning and preventing radial displacement of the cathode comprises one or more ring-shaped electrically insulating stand-offs along the outer surface of the cathode sized to contact the inner surface of the workpiece to position the cathode generally along the axis of symmetry of the workpiece. Preferably, the electrically insulating stand-offs include channels or cut-outs to allow for evacuation and the flow of process gas in the annular space between the workpiece and the cathode. Furthermore, the stand-offs preferably are formed with one or more annular grooves which are shadowed from a line of sight of the sputtering so as to prevent electrical shorting during sputtering. In order to coat the area of the workpiece which is shadowed by the insulating stand-offs, the cathode is preferably adapted for translating movement relative to the workpiece to be coated.

The present invention also extends to magnetron sputtering apparatus and methods using one or more of the cathode assemblies.

The present invention can produce uniform coatings of thicknesses up to 1000 $\mu$m, and can achieve high local power densities over significant lengths of workpieces which are considerably higher than the prior art. This allows for high power sputtering for thick coatings. The preferred embodiments of the present invention, with multiple spaced magnet packages, and the relative shuttle movement between the magnet packages and the cathode, facilitate low flow resistance to achieve adequate cooling for such high power sputtering application.

Definitions

"Annular cavity" as used herein and in the claims as applied to hollow workpieces means the cavity formed by the inner wall of a generally tubular body, which cavity is generally ring shaped or cylindrical as in a pipe, but which could have a non-circular cross-section such as an elliptical cross section. The term "annular cavity" is also meant to include cavities within curved bodies such as half pipes, Y-shaped fittings, U-bend pipes or fittings, S-shaped pipes and fittings, elbows of pipes and fittings with equal or unequal diameter sections, sections of cylinders and spheres etc., that is cavities formed by a wall which closes in on itself, without necessarily being completely closed.

"Bendable" as used herein and in the claims as applied to the tubular cathode means that it is formed to allow the cathode to be bent to generally follow a non-linear axis of symmetry of a hollow workpiece having an annular cavity, but is otherwise rigid so as to retain that bent shape, once formed.

"Curved" as used herein and in the claims as applied to a hollow workpiece having an annular cavity or as applied to a tubular body means that the workpiece or body has a non-linear axis of symmetry.

"Displacement Distance, Ld" as used herein and in the claims means the distance over which the cathode, substrate or magnets are moved during coating in order to coat the desired length of the workpiece.

"Flexible" as used herein and in the claims as applied to the tubular cathode or the rod on which one or magnets are mounted, means that it is formed to allow the cathode or rod to continuously flex as it is positioned or moved along a non-linear axis of symmetry, while still being sufficiently rigid to be generally self supporting along that axis of symmetry.

"Rod" as used herein and in the claims with reference to the rod on which the magnets are mounted is not meant to be limited to solid rods, but rather is meant to refer only to a rod-like shape, and thus includes solid rods, or hollow rods, such as tubes.

"Sputtering" as used herein and in the claims is meant to extend to all types of sputtering, including DC or pulse (ex. AC) magnetron sputtering at a wide range of frequencies, including RF sputtering, which uses a radio frequency (RF) field in the discharge chamber. As well, sputtering extends to "reactive" sputtering.

"Shuttle movement" means a to and fro or oscillating movement generally along an axis of symmetry.

"Shuttle Distance $L_{sh}$" as used herein and in the claims means the distance of the to and fro movement.

"Sputtering Length $L_s$," as used herein and in the claims means the length of erosion of the consumable material (target material) from the cathode surface.

"Time averaged exposure to the magnetic field along the cathode surface" as used herein and in the claims means the exposure of the cathode surface to the magnetic field as measured in close proximity to the cathode surface at points along the cathode surface, and averaged over the sputtering time.

BRIEF DESCRIPTION OF THE DRAWINGS

FIG. 5 is an enlarged view of the partially cut away section of the vacuum housing of FIG. 4, showing the multiple cathode assemblies within multiple workpieces;

FIG. 5a is an enlarged view of a partially cut away section of a cathode of FIG. 5, showing the detail of a joint in the central rod between the magnet packages;

FIG. 5b is an enlarged view of a partially cut away section of a cathode of FIG. 5, showing the detail of the spaced magnet packages;

FIG. 6b is top perspective view of the coolant end of the apparatus of FIG. 6, with the vacuum pump, vacuum table and vacuum chamber partially cut away to show the detail of the linear magnet and cathode actuators;

FIG. 14 is a schematic cross-sectional view of a flexible cathode of this invention within an S-shaped pipe workpiece to be coated;

FIG. 15 is an enlarged cross-sectional view of the dotted portion of the flexible cathode of FIG. 14;

FIGS. 17a, 17b, 17c and 17d are of a magnetron sputtering apparatus of this invention adapted to coat multiple shaped workpieces with curved cathode assemblies, with FIG. 17a being a front cross-sectional view, FIG. 17b being a side cross-sectional view, FIG. 17c being a top cross-sectional view, and FIG. 17d being a cross-sectional view taken along line 17d–17d of FIG. 17b;

DESCRIPTION OF THE PREFERRED EMBODIMENTS

Several embodiments of the invention will now be described with reference to the drawings, in which like parts are labeled with the same numbers in the various Figures.

Figure 1:
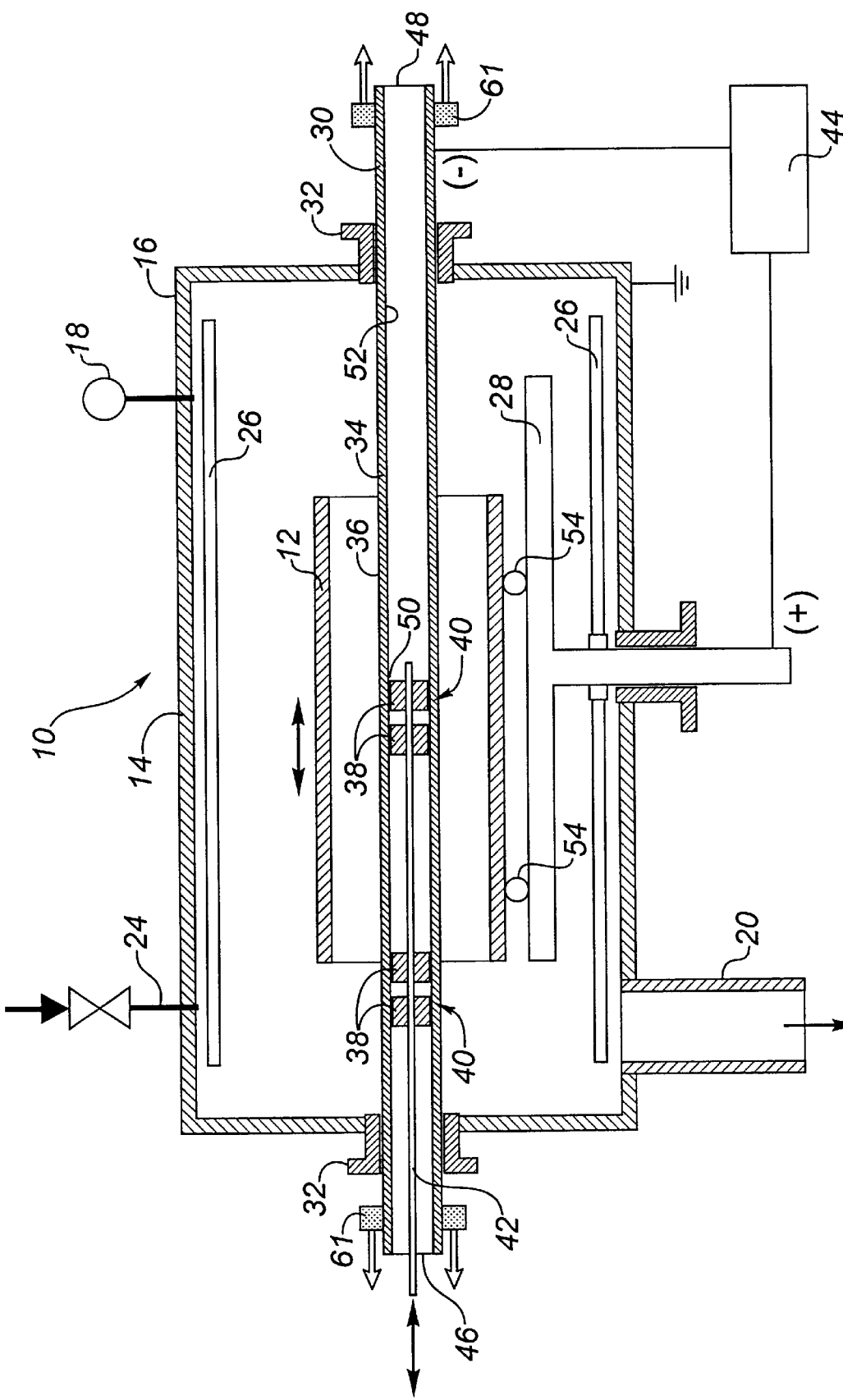
FIG. 1 is a schematic elevational cross-sectional view of multiple embodiments of the magnetron sputtering apparatus of the present invention shown in an arrangement for coating the inner wall of a tubular shaped workpiece, and also showing schematically the relative longitudinal movement of the magnet packages, tubular cathode and/or workpiece.
Figure 4:
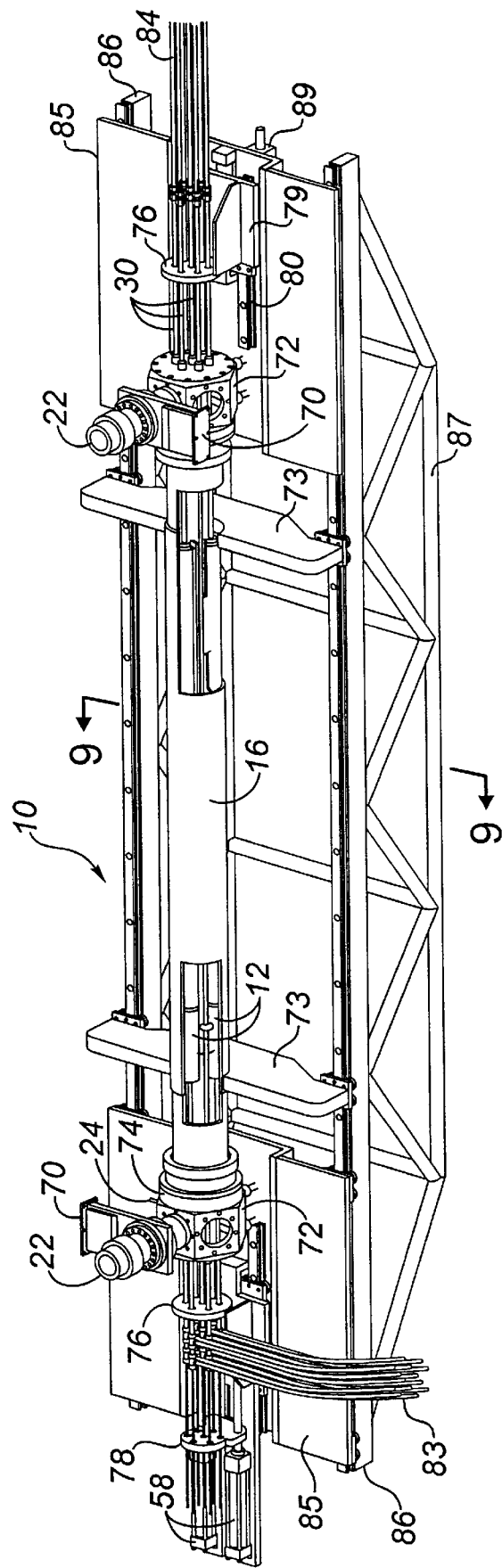
FIG. 4 is a top perspective view of a magnetron sputtering apparatus using multiple through-type cathode assemblies to coat multiple cylindrical workpieces.
Figure 6:
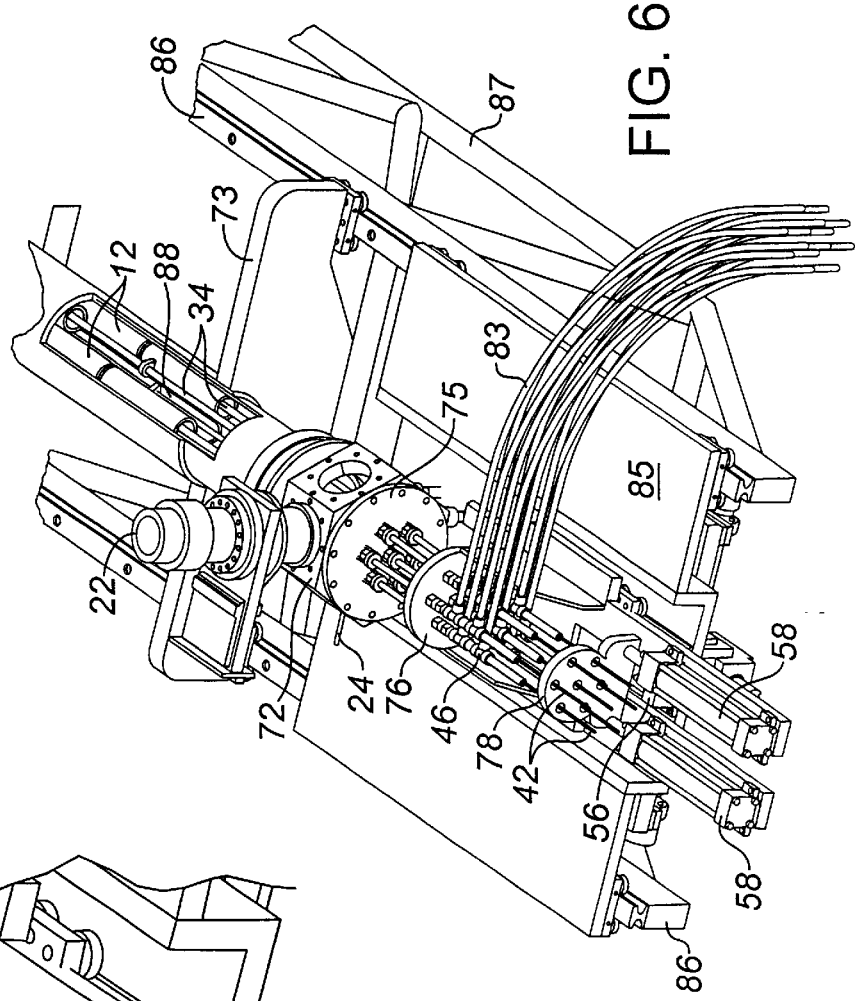
FIG. 6 is a top perspective view of the coolant inlet end of the apparatus of FIG. 4.
Figure 6A:
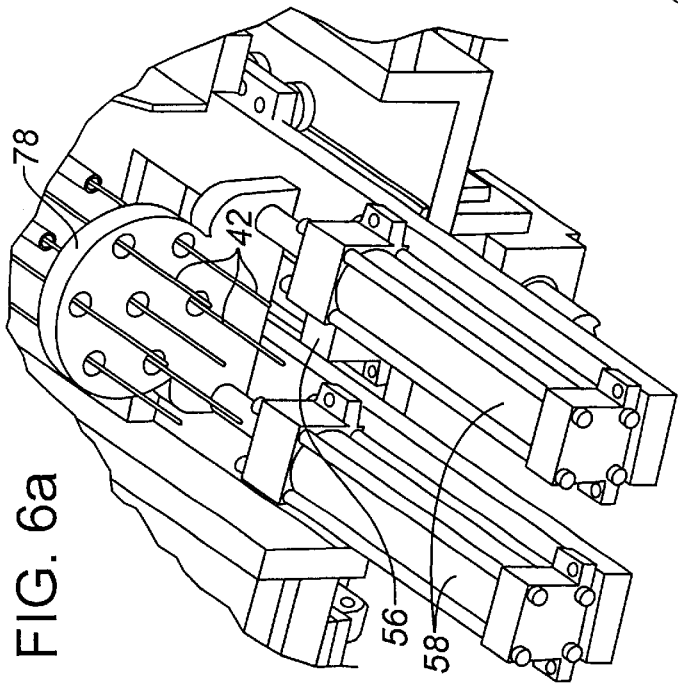
FIG. 6a is an enlarged view of a partially cut away section shown in the circle in FIG. 6, illustrating the detail of the linear magnet and cathode actuators.
Figure 7:
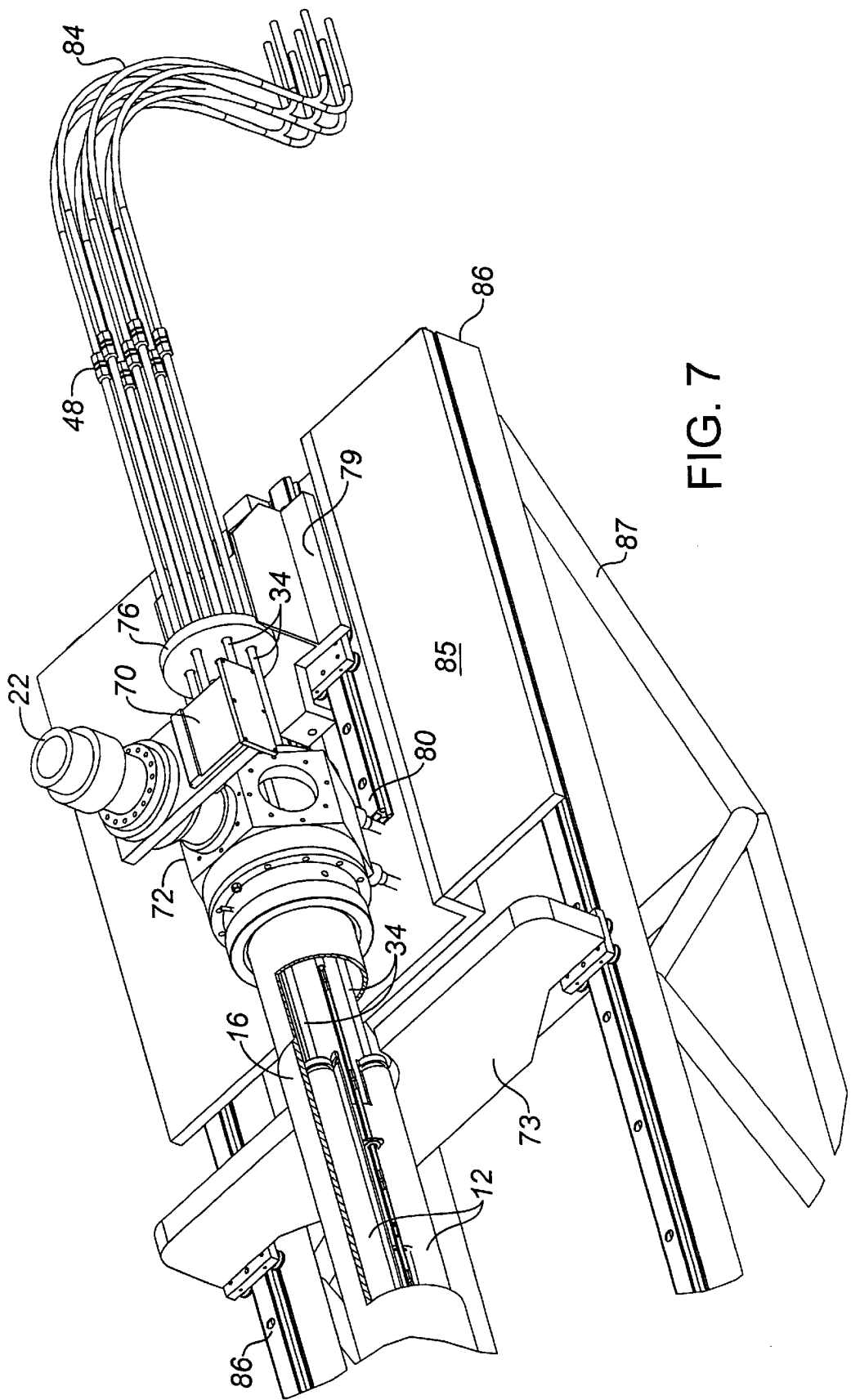
FIG. 7 is a top perspective view of the coolant outlet end of the apparatus of FIG. 4.

The magnetron sputtering apparatus of the present invention is shown generally at 10 in FIG. 1 in an arrangement for coating the inner wall of a tubular shaped workpiece 12, such as a cylindrical pipe. An evacuable housing is shown at 14 to include a grounded, cylindrical vacuum chamber 16 sized to hold the workpiece, a vacuum gauge 18, and a vacuum line 20 connected to turbo-molecular vacuum pumps 22 (see FIG. 4). In some cases, the workpiece itself may serve as a the evacuable housing. One or more process gases for sputtering such as argon may be introduced through process gas inlet 24. Heating elements 26 are located around the circumference of the workpiece 12. In some embodiments, the heating may be provided by the plasma generated in sputtering, in which case, the heating elements 26 may not be needed. The workpiece is held on a stage 28. The cathode assembly 30 of this invention is located along the central axis of the workpiece 12, and extends into the vacuum chamber 16 through vacuum tight seals 32 at either end of the chamber 16. The cathode assembly 30 is shown in FIG. 1 to include a tubular cathode 34, which is generally made from, or coated with, a consumable material 36 (not shown in FIG. 1, see FIG. 2) with which the workpiece 12 is to be coated. The cathode assembly 30 is further shown to include a plurality of spaced cylindrical permanent magnets 38 arranged in magnet packages 40. In FIG. 1, two magnet packages 40 are shown, each magnet package 40 including two spaced magnets 38. The magnets 38 are held on a central actuator rod 42. A DC or pulse voltage power supply 44 is connected to the stage 28 and the cathode 34 in order to provide a means for applying a voltage to the cathode 34. In this manner, the workpiece 12, which rests on the stage 28, acts as an anode. Coolant inlet and outlets 46, 48 are provided at either end of the cathode, in this "through-type" embodiment of the invention, such that a fluid coolant such as water may be flowed in the annular space 50 (shown better in FIG. 2) between the magnets 38 and the inner cathode wall 52.

As shown schematically in FIG. 1, one or more of the cathode 34, the magnet packages 40 and the workpiece 12 may be driven in a longitudinal direction in order to impart relative longitudinal movement between the magnet packages and the cathode. In order to move the workpiece 12, the stage 28 may include rollers 54. Linear cathode and magnet actuators 56, 58 (shown in latter Figures) provide longitudinal movement to the cathode 34 and magnet packages 40 respectively.

In order to impart this relative longitudinal movement, a driving force may be applied to the workpiece 12, cathode 34 and/or magnet packages 40 in any of the combinations set out below in Table 1, with an X indicating a driving force to impart longitudinal movement is applied to that part. The last two columns of Table 1 indicate that these combinations of movement provide both uniform erosion of the consumable material 36 on the cathode 34 and uniform deposition on the workpiece, two advantages of the present invention which can be achieved simultaneously.

TABLE 1

| Magnet Package | Cathode | Workpiece | Uniform Erosion | Uniform Deposition |
|---|---|---|---|---|
| x | | | yes | yes |
| | x | x | yes | yes |
| x | x | x | yes | yes |
| x | x | | yes | yes |
| x | | x | yes | yes |

The invention will hereinafter be described in accordance with a preferred embodiment in which the magnet packages 40 are moved longitudinally while the workpiece 12 remains stationary, but as set above, the invention is not so limited. Furthermore, in most embodiments of the invention, the cathode 34 is moved longitudinally only a short distance in order to coat areas of workpiece 12 which have been shadowed by ceramic stand-offs 60 (see later Figures) used as a means for positioning, and preventing radial displacement of, the cathode 34 generally along the axis of symmetry of the workpiece 12. In some embodiments, such as for the coating of short workpieces, the ceramic stand-offs 60 may not be needed to position the cathode 34. In those embodiments, the cathode 34 may be made of a material which is sufficiently strong and stiff to be self-supporting in use. Also, in some embodiments, such as with long cylindrical cathodes 34 used to coat cylindrical pipes, the means for positioning, and for preventing radial displacement of, the cathode along the axis of symmetry of the workpiece 12 may include, optionally in addition to the stand-offs 60, a cathode tension device 61 which holds the cathode 34 in tension at both ends. As set out below, this cathode tension device 61 is preferably provided by the same device used to move the cathode 34.

The cathode 34 is generally formed from an electrically conductive metal, which also has good thermal conductivity, such as copper, stainless steel, aluminum and the like. The cathode 34 is generally formed with a tubular shape. When the cathode 34 is bendable, it may be formed with a metal thickness to allow for bending, but to still provide sufficient rigidity to retain the bent shape once formed. When the cathode 34 is flexible, it is generally formed with at least sections of these metals which are in a flexible bellow shape (see FIGS. 15 and 16). Commercially available vacuum bellows of stainless steel are suitable for this purpose.

The magnets 38 may be electromagnets or permanent magnets, with the latter being most preferred. Preferred magnets are permanent rare earth magnets, e.g., SaCo, magnetized in the axial direction. If the permanent magnets are sensitive to the coolant being used, they may be coated or otherwise protected.

Figure 2A:
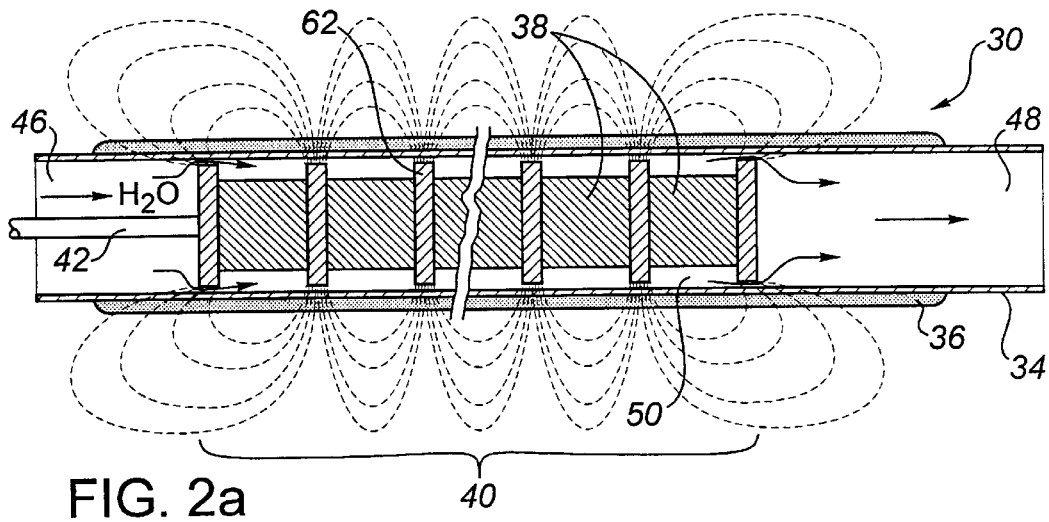
FIG. 2a is a schematic elevational cross-sectional view of a "through-type" cathode assembly of this invention, showing a single magnet package of axially aligned ring-type permanent magnets joined with ferromagnetic spacers, mounted on a central actuator rod within the cathode assembly, and showing the cooling means providing for flow through cooling with a fluid coolant.

FIGS. 2 and 3 show different magnet arrangements in cathode assemblies 30 of the present invention. FIG. 2a shows a "through-type" cathode assembly 30 of this invention, that is one in which the fluid coolant, preferably water, is circulated through coolant inlet and outlet 46, 48 at either end of the cathode 34. The cathode 34 preferably includes a coating of a consumable material 36 formed on the outer surface of the cathode 34, for instance by thermal spraying or other suitable coating methods. As set out above, the consumable material 36 need not be provided as a coating, the cathode could be formed of the desired consumable material, or the consumable material may be otherwise provided in thermal contact with the cathode, such as in a sleeve. The consumable material 36 will generally be provided on the cathode 34 over a length just slightly greater than the sputtering length $L_s$, which corresponds to the length of erosion of the consumable material from the cathode surface. $L_s$ will generally be slightly longer than the length of the workpiece which needs to be coated, and will be preferably achieved by moving the magnets 38 beneath that length of the coated cathode corresponding to $L_s$. In FIG. 2a a single magnet package 40 is held within the cathode 34. The magnet package 40 is formed of a plurality of axially aligned ring-type permanent magnets (five are shown) 38 mounted on a central actuating rod 42. The magnets 38 are arranged with alternating polarity and joined with ferromagnetic spacers 62 which are examples of soft magnetic material. It is preferable to use soft steel or iron for the soft magnetic material.

The magnets 38 are spaced from the inner cathode wall 52 so as to allow for the flow of coolant through the cathode 34 in the annular space 50. The resulting ring-shaped magnetic field is shown in dotted lines in FIG. 2a. When coating a short workpiece, the ceramic stand-offs 60 may not be needed to position the cathode 34 and prevent radial displacement within the workpiece, and so are not shown in any of FIGS. 2 and 3.

Figure 2B:
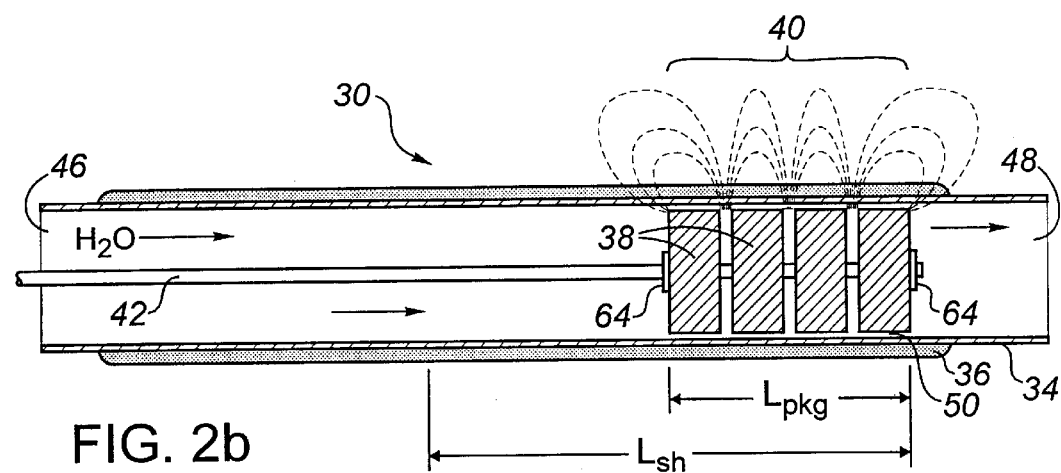
FIG. 2b is a schematic elevational cross-sectional view of an alternate single magnet package configuration in which the plurality of magnets are maintained in a uniform spaced relationship due to the repulsion between the magnets and the clips holding the magnets in place on the central actuating rod.

FIG. 2b shows a single magnet package 40 in a through-type cathode 34, as in FIG. 2a, but the plurality of magnets 38 in the package 40 are maintained in a uniform spaced relationship due to the repulsion between the magnets and the clips 64 holding the magnets 38 in place on the central actuating rod 42.

Figure 2C:
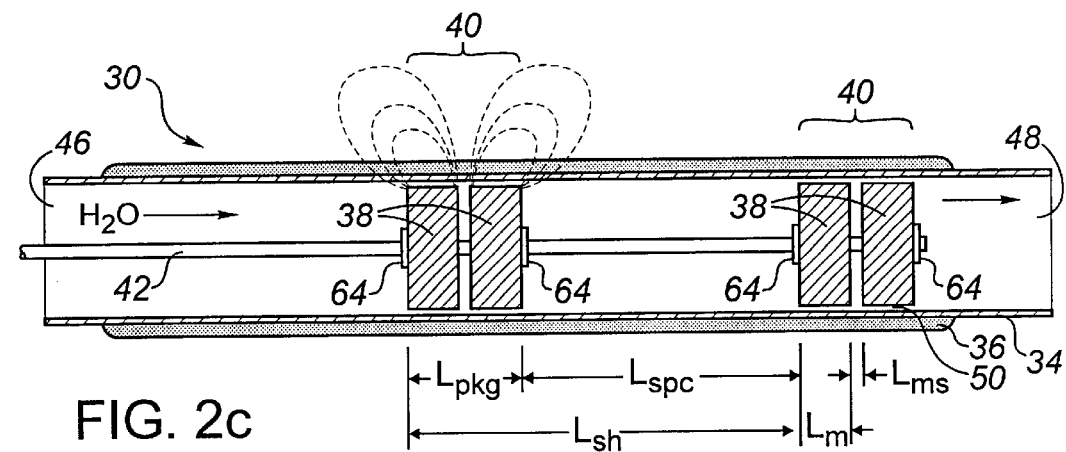
FIG. 2c is a schematic elevational cross-sectional view of a further alternative magnet package configuration in which two magnet packages with two magnets in each package, the magnets being maintained in a uniform spaced relationship within a package, and each magnet package being uniformly spaced on the central actuator rod.

FIG. 2c is a further alternative magnet package configuration in which a plurality of magnet packages 40 are shown (two in the drawing), each package 40 comprising a plurality of magnets 38 (two in the drawing) arranged with alternating polarity and maintained in a uniform spaced relationship. Each magnet package 40 is uniformly spaced on the central actuating rod 42 with magnet clips 64. In this embodiment, as shown in the drawing, the magnet packages 40, each having a length of $L_{pkg}$ are spaced at repeating intervals along the actuating rod, the spacing of the packages being $L_{spc}$, such that, in order to coat the entire length of the substrate, the actuating rod is moved by a shuttle distance of $L_{sh}$. Within the magnet package 40, the magnets 38 have a length shown as $L_m$, and are spaced by a distance $L_{ms}$.

Figure 3A:
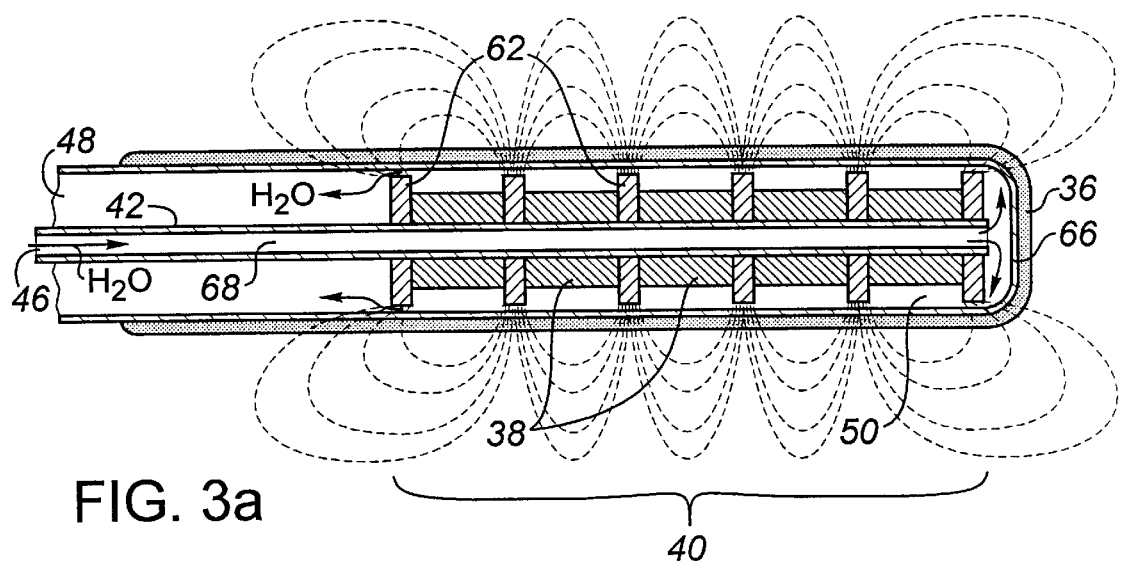
FIG. 3a is a schematic elevational cross-sectional view of a "finger-type" cathode assembly of the present invention, in which the cathode is closed at one end, the magnet arrangement being as in FIG. 2a, and the cooling means showing coolant fluid being flowed in through the central actuator rod, and back in the annular space between the magnet package and the inner wall of the cathode.

FIG. 3a shows a "finger-type" cathode assembly 30 of the present invention, in which the cathode 30 is closed at its closed end 66. In this embodiment, the magnet package 40 of FIG. 2a is mounted on a central, hollow actuating rod 42, which is formed from a tube to allow coolant water to be flowed in through a fluid conduit 68 in the rod 42, and back in the annular space 50.

Figure 3B:
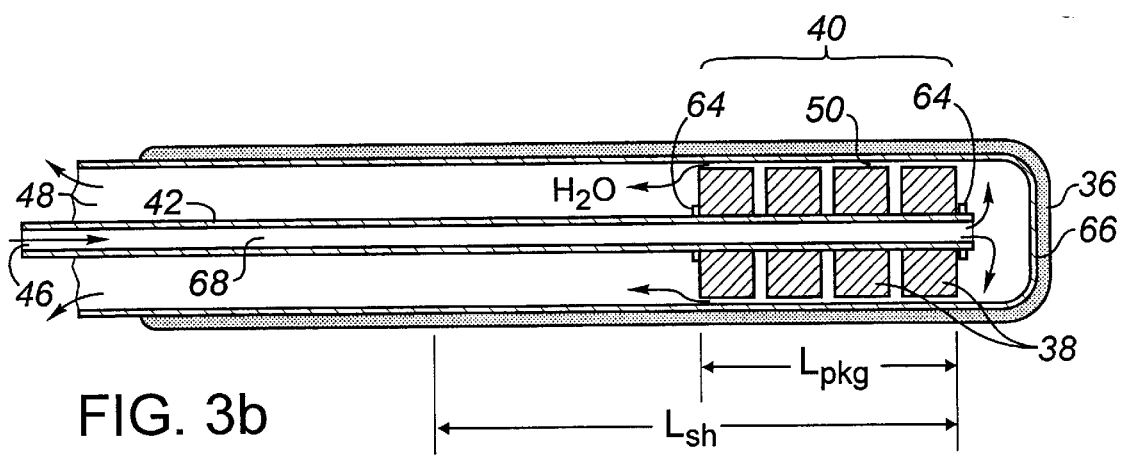
FIG. 3b is a schematic elevational cross-sectional view of the finger-type cathode assembly fitted with the magnet package of FIG. 2b.
Figure 3C:
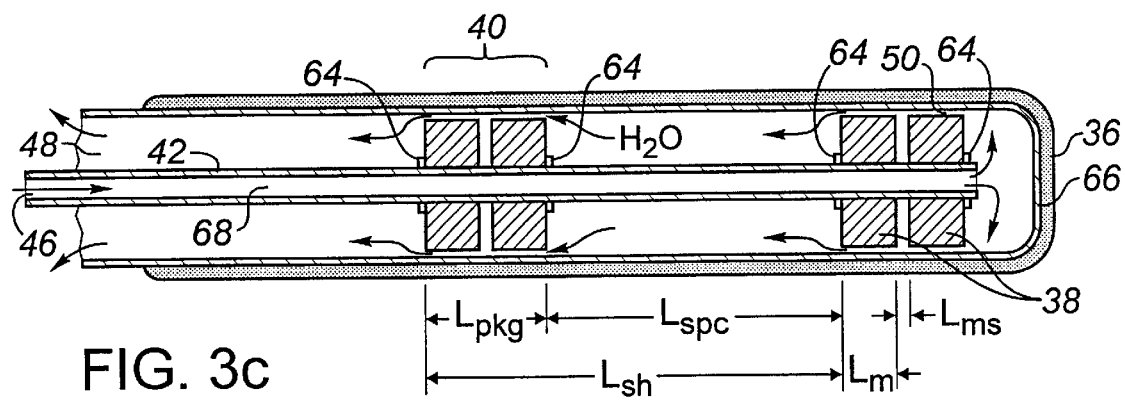
FIG. 3c is a schematic elevational cross-sectional view of the finger-type cathode assembly fitted with the magnet package of FIG. 2c.

FIG. 3b shows a finger-type cathode assembly 30 fitted with the magnet package 40 of FIG. 2b. FIG. 3c shows a finger-type cathode assembly 30 fitted with the magnet package 40 of FIG. 2c.

In accordance with the present invention, it is not necessary that the magnets be the same size, or that the magnets or magnet packages be uniformly spaced as shown in the above Figures. In fact, variation of some of these parameters allows for coating of complex shaped workpieces. It is desirable, in order to coat a workpiece using the relative longitudinal movement of one or more parts as set out in Table 1 above, that the spacing between the magnet packages, $L_{spc}$ is sufficiently large compared to the magnet package length, $L_{pkg}$, that, during sputtering, the time averaged magnetic field over the cathode surface remains substantially uniform. More preferably, the combined length of all the magnet packages and the spaces between the magnets is less than half of the sputtering length $L_s$. More preferably, $L_{spc}$ is equal to or greater than the magnet package length $L_{pkg}$, and the shuttle distance $L_{sh}=m(L_{spc}+L_{pkg})$, wherein m is an integer, preferably 1. It is also preferable that the following relationships exist:

$$L_{pkg}^i \approx \sum_{j=1}^{k} L_m^{ij} + \sum_{j=1}^{k-1} L_{ms}^{ij}$$

$$L_\Sigma \approx \sum_{i=1}^{n} L_{pkg}^i + \sum_{i=1}^{n-1} L_{spc}^i$$

wherein,
k=the number of magnets in a magnet package,
n=the number of magnet packages,
$L_m$=the length of the magnet, equal or unequal in length
$L_{ms}$=the space between the magnets in a package, equal or unequal in length,
$L_{pkg}$=the magnet package length, equal or unequal,
$L_{spc}$=the space between the magnet packages,
$L_\Sigma$=the combined length of the magnet packages.

The combined length of the magnet packages and the spaces between the magnets is preferably less than $L_s$, and will most preferably be less than about half of $L_s$. For the case in which a magnet package 40 has only one magnet, $L_{spc}$ is preferably greater than one half of $L_m$. For the case in which a magnet package 40 has multiple spaced magnets, $L_{apc}$ is preferably greater than $L_{ms}$. Most preferably, in accordance with the present invention, the magnet packages 40 are held within the cathode for shuttle movement of the magnet packages 40 in order to coat the workpiece, and the shuttle distance $L_{sh}$ should be approximately equal to $L_s-L_\Sigma$.

When the number of magnet packages is n, and the magnet packages are generally of equal length and are generally equally spaced, and when the magnets within a package are generally equally spaced, and when the magnet packages are shuttled a shuttle distance $L_{sh}$, in order to sputter over the length $L_s$, the number of magnet packages and the magnet spacing is preferably such that $L_s=n*L_{pkg}+(n-1)*L_{spc}+L_{sh}$, wherein $L_{sh}=m(L_{spc}+L_{pkg})$, with m being an integer, preferably 1.

To minimize end effects, in accordance with the present invention, the sputtering distance, $L_s$, is slightly greater than the length of the workpiece 12 to be coated.

Turning now to FIGS. 4–10, an embodiment of the invention will be described for coating multiple cylindrical workpieces 12 such as pipes. The vacuum chamber 16 is shown with vacuum pumps 22 at either end. The vacuum pumps 22 have gate valves 70 and connected above a vacuum end chamber 72. The vacuum chamber 16 is clamped to a chamber clamp 73 and is sealed to chamber tube connector 74 with O-seals (not shown). A vacuum flange 75, made of suitable material such as stainless steel with ceramic feedthroughs or high temperature nylon, is bolted to the end chamber 72 and allows the ends of the cathodes 34 to slide there through in sealing arrangement through Ultra-torr® fitting seals (not shown). Both ends of the cathodes 34 are secured with compression fittings (Swagelok® fittings) (not shown) to cathode actuator flanges 76, which are made of an insulator such as high temperature nylon. Power is supplied to the cathodes 34 at the cathode actuator flange 76. The central actuator rods 42 extend beyond the cathode actuator flanges 76 at one end of the apparatus 10, and are secured with fittings (Swagelok®) to an actuator rod flange 78, also made of an insulator material such as high temperature nylon. At both ends of the cathodes 34, linear cathode actuators 56 are connected to the cathode actuator flange 76 to provide for longitudinal movement. In the case of long cylindrical cathodes used to coat cylindrical workpieces such as pipes, the linear cathode actuators 56 also serve as the cathode tension device 61, which holds the cathode in tension, with a pulling force from both ends. This tensioning of the cathodes provides a means for positioning and preventing radial displacement of the cathodes 34 along the axis of symmetry of the workpiece. Each linear cathode actuators 56 includes a hydraulic cylinder (not shown), whose cylinder end is bolted to a cathode platform 79, which is inset in the vacuum table 85, and slides on cathode platform rails 80, located beneath the table 85, best seen in FIG. 7. The piston end of the cathode actuator cylinder (not shown) is connected to the cathode actuator flange 76. With hydraulic cylinders at both ends of the cathodes 34, the cathode can be maintained in tension. A differential pressure between the hydraulic cylinders provides the driving force for moving the cathodes 34, in order coat to the areas of the workpiece 12 which are shadowed by the ceramic stand-offs. Linear magnet actuator 58 is connected to the actuator rod flange 78 for longitudinal movement of the actuator rod 42, and the magnet packages 40 therewith.

Process gas such as argon (or reactant gases in the event of reactive sputtering) is introduced through process gas inlet 24, which is connected to a gas manifold supply ring 82, to introduce process gas into the annular space formed between the workpieces 12 and the cathodes 34.

Coolant inlet pipes 83, suitably insulated, are connected to coolant inlets 46, which are sealed to each cathode 34 through O-rings (not shown). Coolant outlet pipes 84, suitably insulated, are connected to coolant outlets 48, which are sealed at the other end of each cathode 34, through O-rings (not shown).

The entire apparatus 10, is mounted on a vacuum table 85 on rails 86 on a frame 87, which is grounded. Thermocouple probes 88 are provided to extend between the workpieces 12 being coated, to monitor the internal temperature of the sputtering process. Below the vacuum table 85 is a table actuator 89, which can be used to adjust the vacuum table for loading and unloading of workpieces 12.

Figure 8:
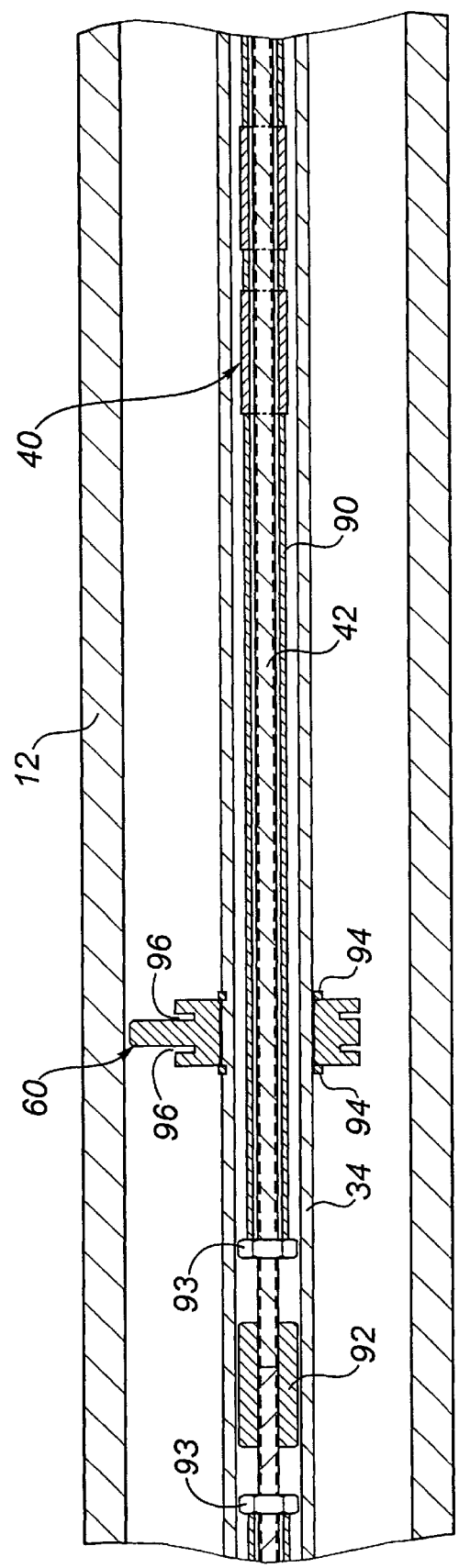
FIG. 8 is a partial cross-sectional view of one of the cathode assemblies of FIG. 4, showing the details of the magnet arrangement on a central actuator rod, and a ceramic stand-off as a means to position the cathode along the axis of symmetry of the workpiece.
Figure 9:
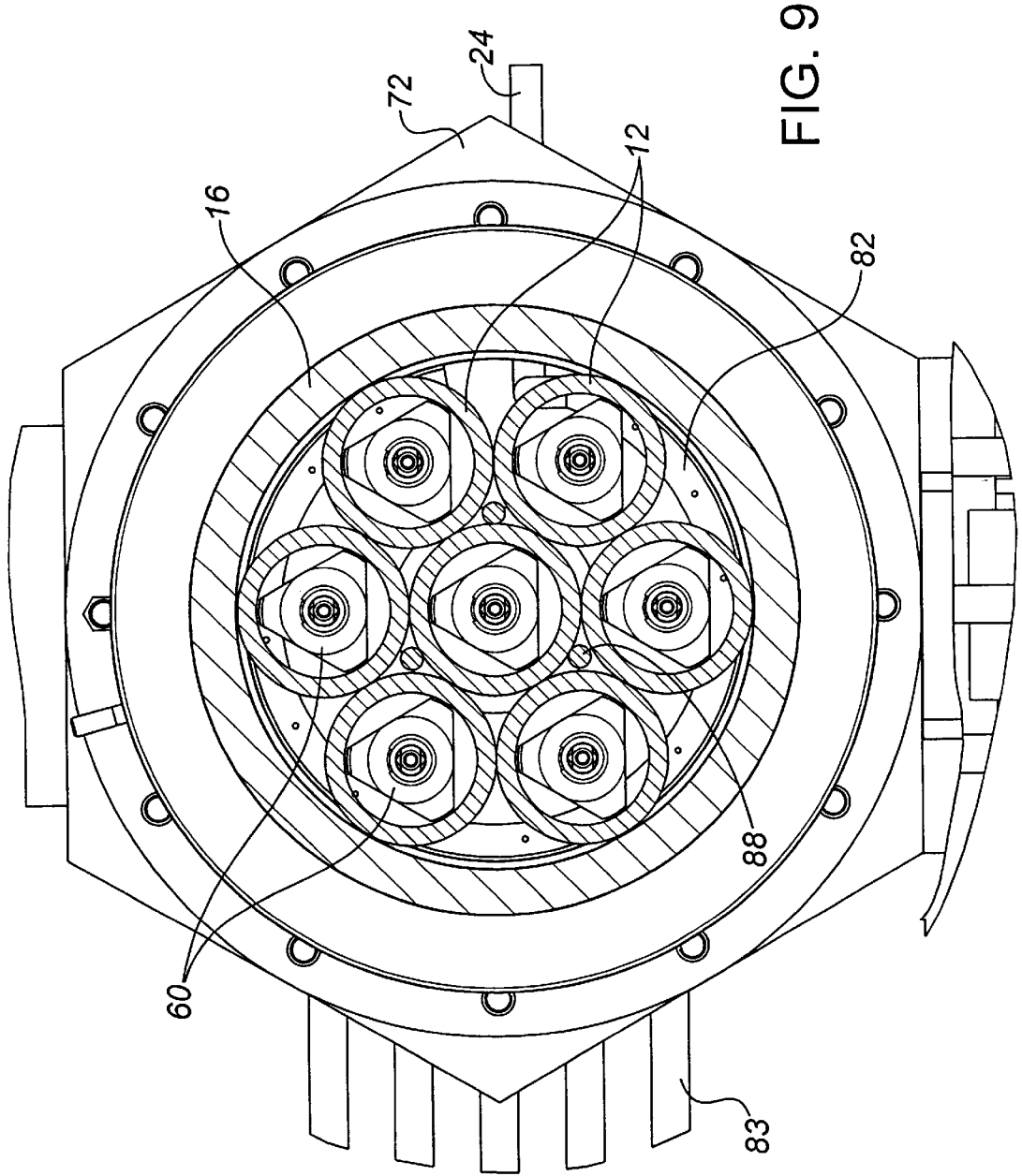
FIG. 9 is a cross-sectional view taken along line 9—9 of what FIG. 4, showing seven cathode assemblies within seven workpieces to be coated, and showing the ceramic standoffs and clips holding same, in greater detail.
Figure 10:
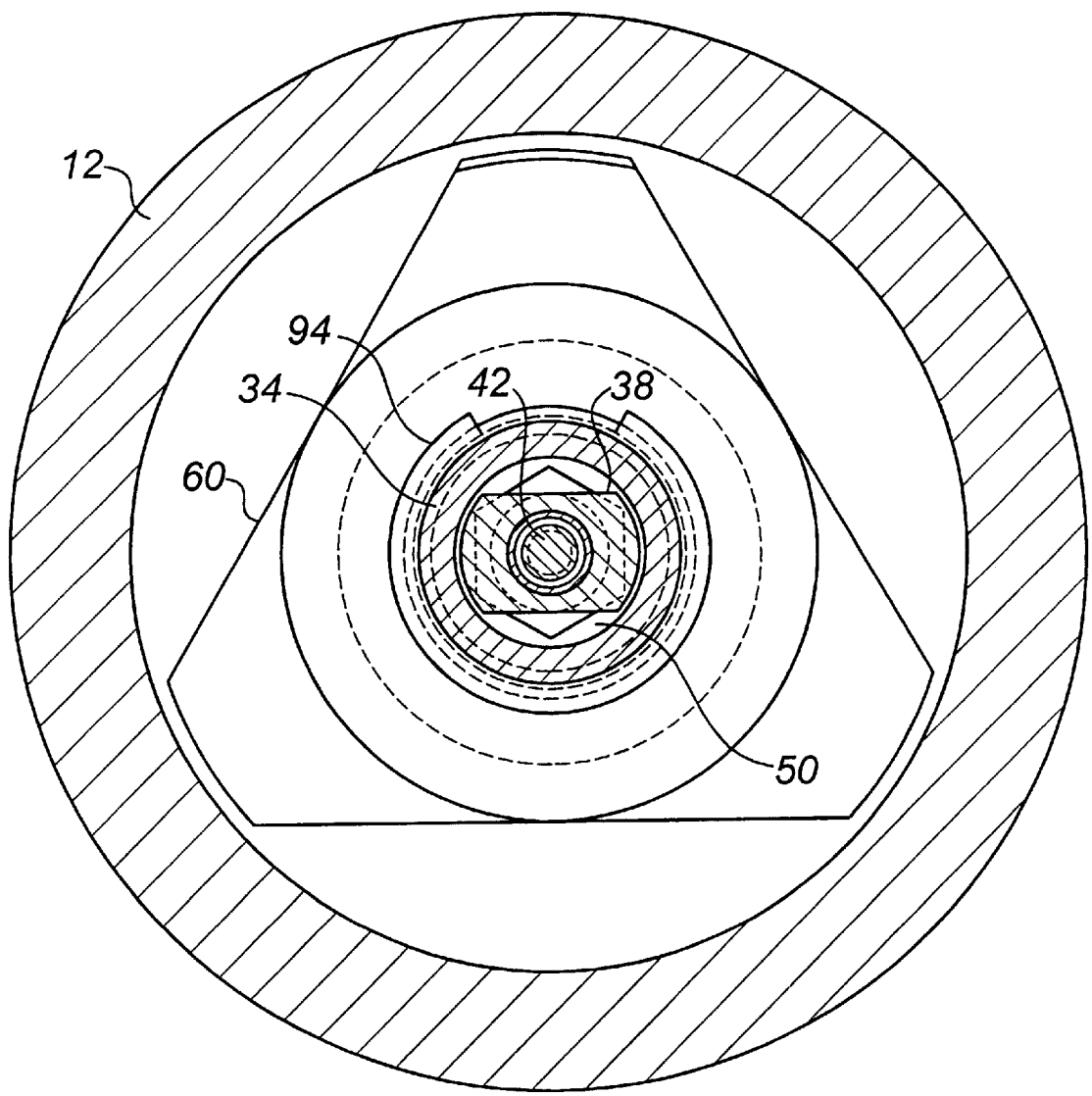
FIG. 10 is an enlarged cross-sectional view of one of the cathode assemblies of FIG. 9, showing the ceramic standoffs and clips in still greater detail.

In FIG. 5, the magnet packages 40 are shown to be fixed on a central actuator rod 42. The magnets are held in spaced relationship between magnet packages by plastic tubing sections 90 (or other means such as copper tubing or clips) over the actuator rod 42 between the magnet packages. In FIGS. 5 and 8, the actuator rod 42 is formed of several threaded sections which are joined at a joint 92 with hex nuts 93 around the actuator rod 42. In FIGS. 5b and 10, the magnets 38, can be seen in cross-section to be flattened from their cylindrical shape, by for example grinding, which allows more coolant water into the annular space 50 within the cathode 34. The annular space 50 should be understood to refer to the annular space within the cathode 34 which is not occupied by magnets 38 and the central rod 42.

Ceramic stand-offs 60 are shown around each cathode, held in place by stand-off snap clips 94 (see FIG. 8). The stand-offs 60 are shown in cross-section in FIG. 9 and 10 to be formed with cut-away portions so as to be generally triangular, to allow for evacuation and the flow of process gas in the annular space between the workpiece 12 and the cathode 34. The stand-offs 60 are formed with an annular groove 96 on each side which are shadowed from a line of sight of the sputtering so as to prevent electrical shorting during sputtering.

In this preferred embodiment, wherein the magnet packages 40 are shuttled back and forth to coat the workpieces 12, the workpieces are held stationary and the cathodes 34 only need to be moved a short distance, with the linear cathode actuator 56, to allow the workpieces 12 to be covered in the areas shadowed by the ceramic stand-offs 60.

Figure 11:
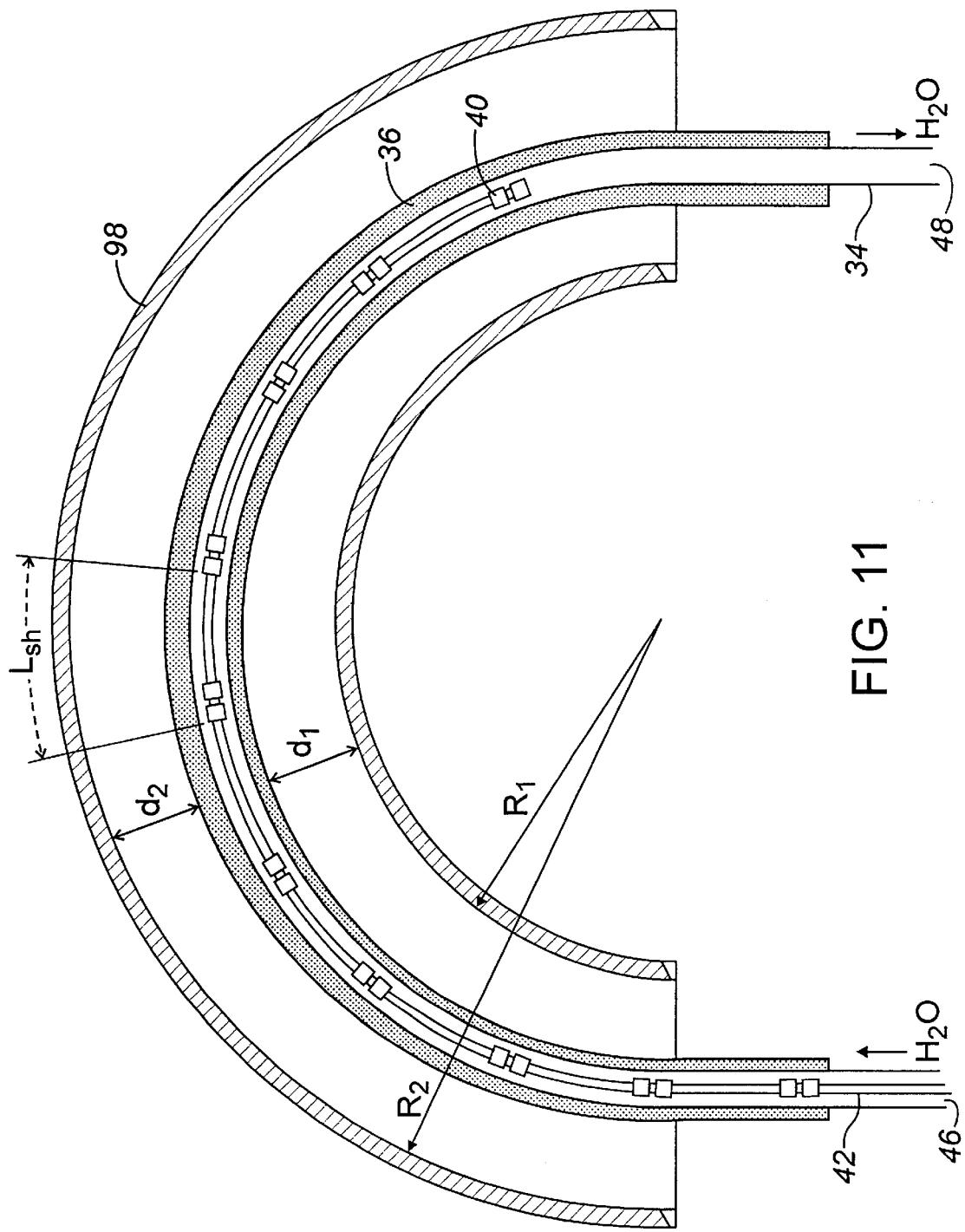
FIG. 11 is a schematic cross-sectional view of a curved through-type cathode assembly of the present invention shown in place for coating the inner surface of a U-bend workpiece, the cathode assembly being shaped and positioned to follow the axis of symmetry of the workpiece.

Turning to FIG. 11, there is illustrated a curved cathode assembly 30 for coating shaped workpieces such as the U-bend pipe joint or fitting 98. The cathode 34 is formed from a bendable material such as metal tubing, to generally follow the axis of symmetry of the U-bend 98. A plurality of magnet packages 40 are mounted on an actuator rod 42 made from a flexible material such as plastic tubing, to allow for flexible movement within the cathode as the magnet packages are shuttled. The shuttle distance $L_{sh}$ is shown in FIG. 11. In order to uniformly coat the inner wall of the U-bend 98, the cathode 34 is positioned only generally along the axis of symmetry of the workpiece 98, such that $d_1/d_2=R_2/R_1$, wherein $d_1$ and $d_2$ are respectively the distances between the cathode 34 and the inner walls of the U-bend having the smaller and larger radius of curvature, as shown in the Figure, and $R_1$ and $R_2$ are respectively the smaller and larger bending radius of the inner walls of the U-bend 98, again as shown in the Figure. Since the exact axis of symmetry may not be followed by the cathode 34, a thicker coating of consumable material 36 can be provided on the cathode 34 in the areas farthest from the surface of the U-bend 98 to be coated. Ceramic stand-offs (not shown in the Figure) may be used to position the cathode along the axis of symmetry of the U-bend.

Figure 12:
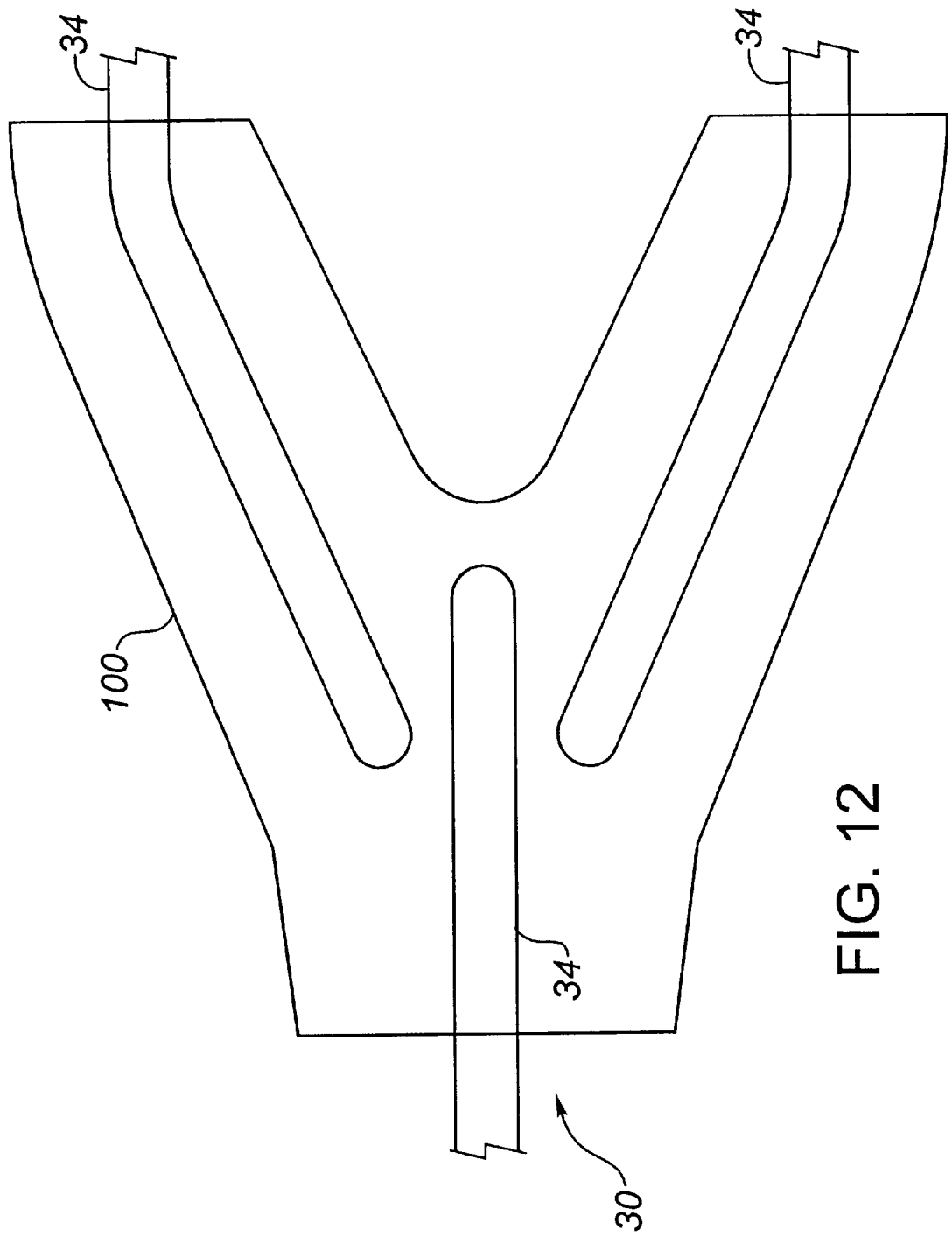
FIG. 12 is a schematic cross-sectional view of a curved cathode assembly arrangement for sputtering a Y-joint workpiece using three finger-type cathode assemblies of the present invention, each of the finger-type cathode assemblies being shaped and positioned in an arm of the Y-fitting along the axis of symmetry of each arm.

FIG. 12 shows a cathode assembly 30 arranged as multiple finger type cathodes 34 to coat the inside walls of a Y-joint 100. Each of the finger type cathodes 34 may be of the type shown in FIGS. 3a–3c, but is curved and positioned in an arm of the Y-joint 100, to follow the axis of symmetry of each arm of the Y-join 100. In practice, this arrangement has been effective in coating the entire inner surface of the Y-joint with uniformity of coatings of 25±5 μm.

Figure 13:
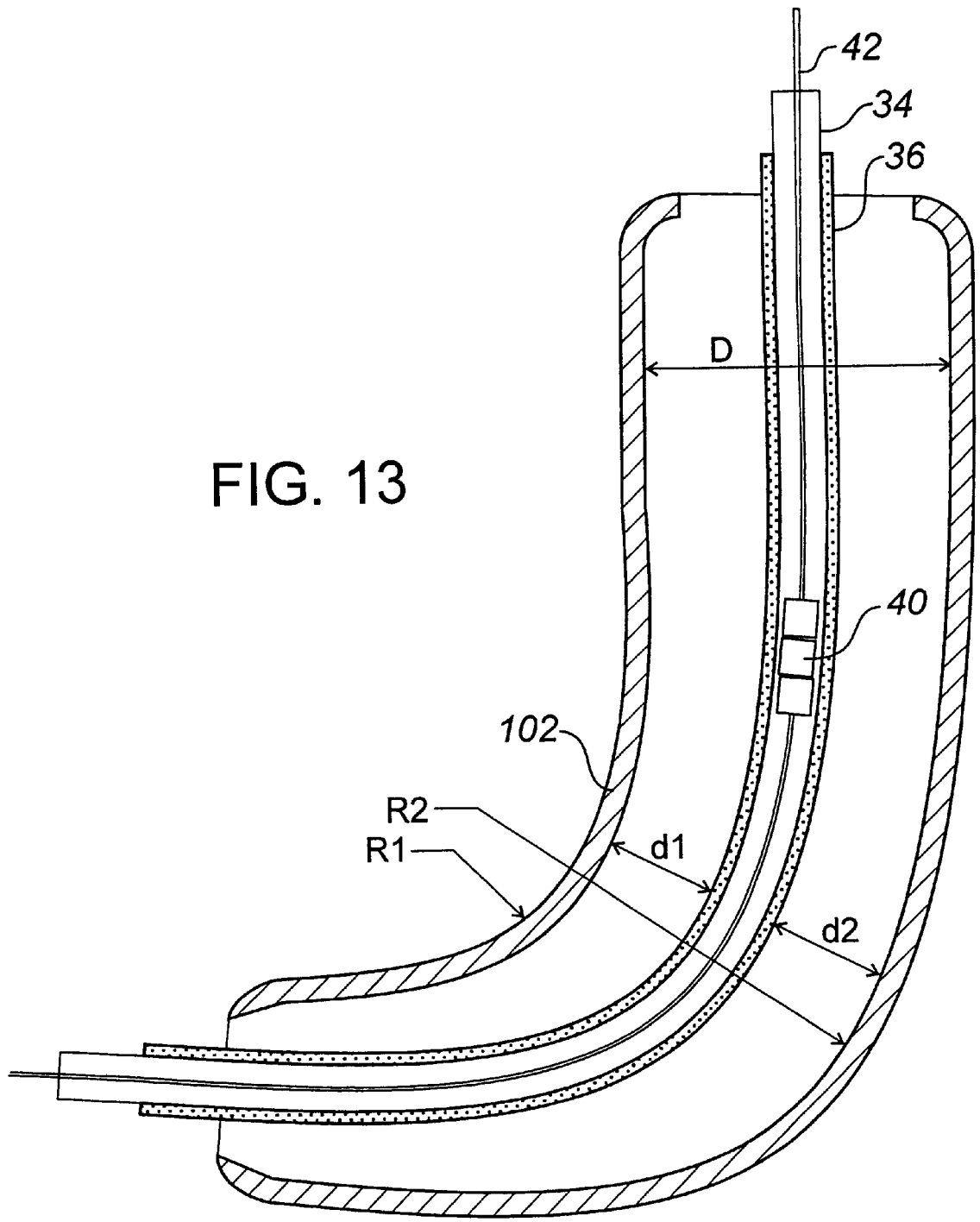
FIG. 13 is a schematic cross-sectional view of a curved cathode assembly arrangement to coat the inner wall of a reducing elbow workpiece having internal diameter variations along its axis of symmetry, illustrating how the shuttle velocity of the magnets can be varied in order to uniformly coat the workpiece.

FIG. 13 shows a further embodiment of a curved cathode 34, using a through-type cathode 34 curved to generally follow the axis of symmetry of a reducing elbow fitting 102. A reducing elbow 102 has internal diameter variations along its axis of symmetry. As shown, the cathode 34 is curved to conform as closely as possible to the axis of symmetry, being positioned such that $d_1/d_2=R_2/R_1$, as set out above, for the U-bend sputtering arrangement. However, for the reducing elbow 102, in order to obtain uniform coating thickness, the speed of the moving the actuator rod 42 and the magnet package or packages 40, i.e., the shuttle velocity $V_{sh}$, is varied in inverse proportion to the internal diameter of the part D at each point along the axis of symmetry, that is $V_{sh}$ 1/D, to move more slowly in inverse proportion to the diameter.

Figure 16A:
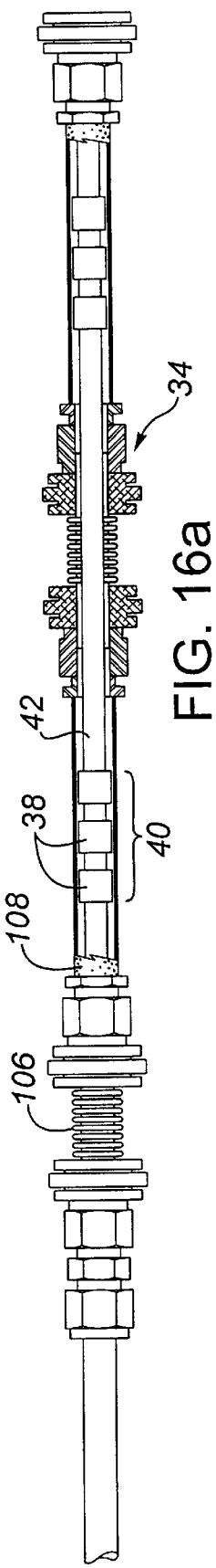
FIGS. 16a, 16b and 16c are side views, with partial cut-away sections showing cross-sectional sections of the flexible cathode of FIG. 14 in greater detail.
Figure 16B:
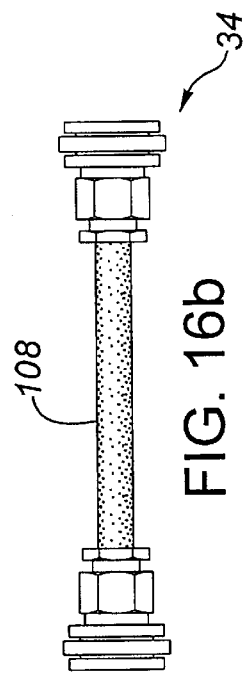
Figure 16C:
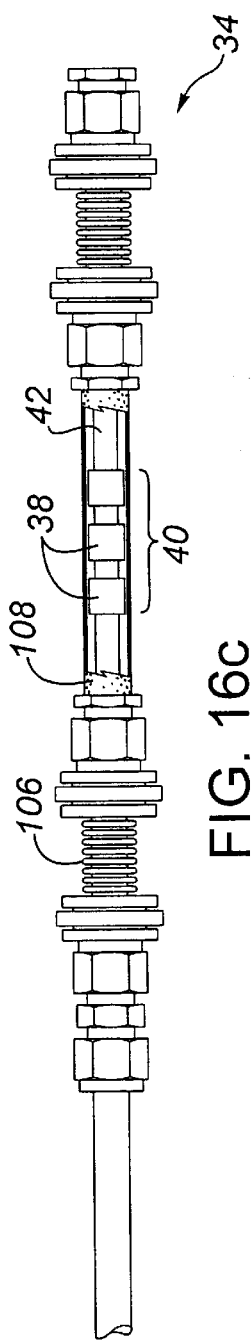

FIGS. 14–16 illustrate a flexible cathode assembly 30 of the present invention, designed to coat complex curved shapes such as S-shaped pipe sections 104, where flexibility of the cathode 34 itself, as well as the actuator rod 42 is provided. The tubular cathode 34 is flexible to follow an axis of symmetry of the annular cavity of the S-pipe 104, that is, it is flexible to allow the cathode to be inserted into the annular cavity of the S-pipe, and to allow the cathode to be positioned and/or moved generally along that axis of symmetry. In the Figures, the flexible cathode assembly is seen to include flexible vacuum tight bellow joint sections 106 connecting rigid cylindrical cathode sections 108. The sections 106 and 108 are connected with compression fittings (Swagelok®) unions) 110. On either side of the bellow joint sections 106, the cathode 34 includes ceramic stand-offs 60, as above described, in order to position the cathode 34 along the axis of symmetry of the S-pipe 104. The cathode 34 includes at least one magnet package 40 with one or more magnets 38 within each rigid cylindrical cathode section 108. In FIGS. 16a and 16c the magnet package 40 is seen to include three spaced magnets 38. The magnet packages are held on an actuator rod 42 formed of flexible material such as plastic tubing. In order to coat the S-pipe 104 in the non-active cathode zones formed by the bellow joint sections 106, the cathode 34 is moved longitudinally during the coating process with a linear cathode actuator 56 (not shown in FIGS. 14–16) as described above for FIGS. 4–10. The length of the rigid cylindrical sections 108 will depend on the smallest bending radius of the S-pipe 104.

Figure 17C:
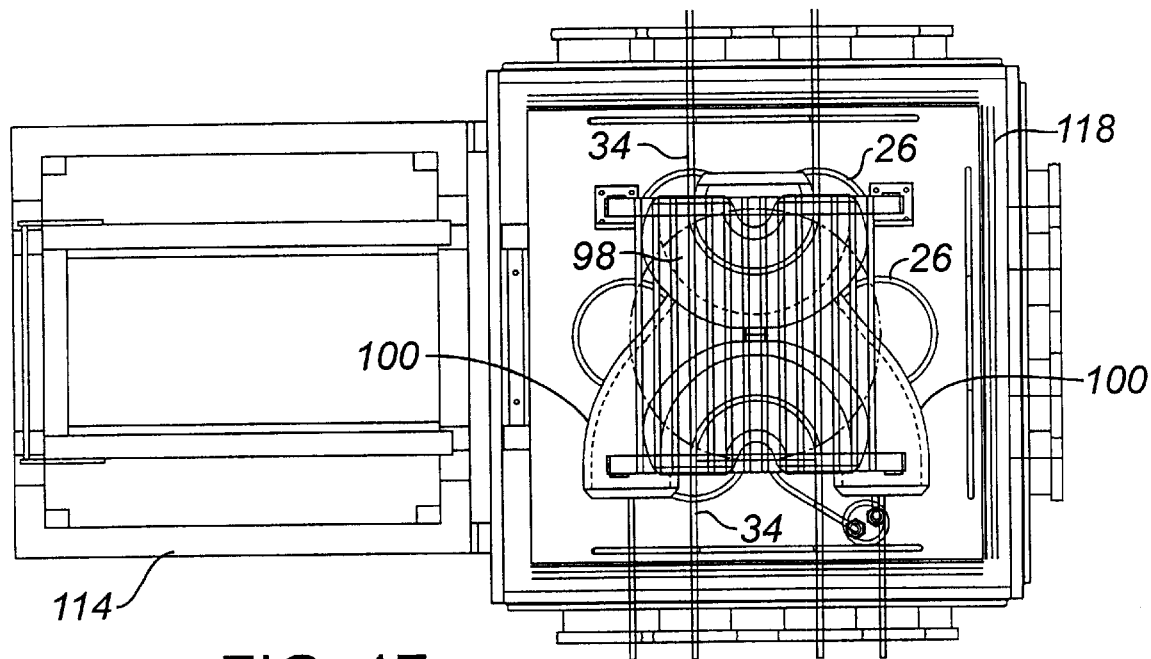
Figure 17D:
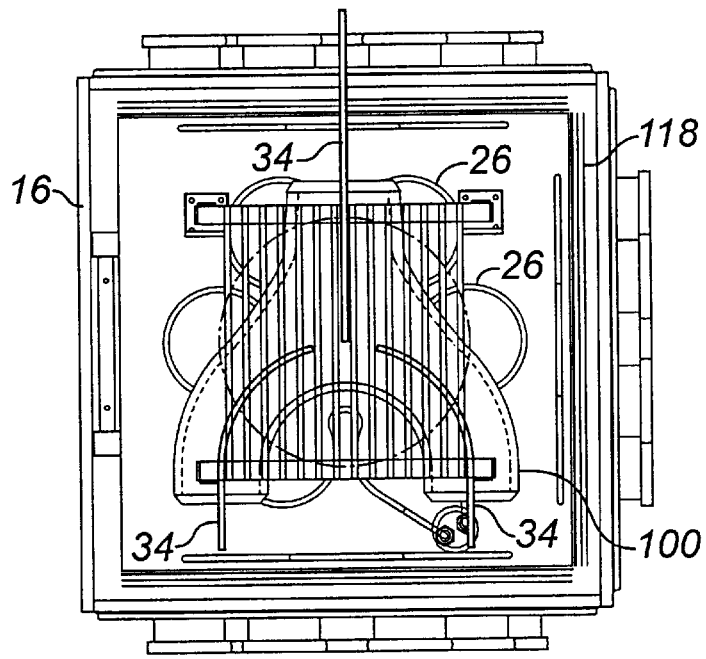

FIGS. 17a–17d illustrate a magnetron sputtering apparatus 10 of this invention adapted to coat multiple complex shapes such as the Y-joints 100 of FIG. 12, and the U-bend pipes 98 of FIG. 11. A vacuum chamber 16 is provided on a support 112 with heating elements 26 located on its inner walls. A wheeled cart 114 is provided to preassemble the Y-joint and U-bend workpieces 100, 98 onto a workpiece support 116 with the cathodes 34 mounted withing the workpieces, and then transfer them into the vacuum chamber 16. In FIG. 17d, finger-type cathodes 34 as shown in FIG. 12 are provided for the Y-joint 100. In FIG. 17c, curved cathodes 34 as shown in FIG. 11 are provided for coating the U-bend 98. Radiation shields 118 of spaced plates of insulation, are provided around the walls of the vacuum chamber 16. To allow for the insertion of the cathodes 34, the vacuum chamber 16 is provided with multiple sealed flange holes 120 at appropriate locations.

The cathode assemblies 30 of the present invention can be used to produce sequential, multilayer coatings of different target materials (consumable materials). To that end, the cathode 34 is provided with alternating repeating sections of two or more different target materials (consumable materials) to create two or more sets of sections of different target materials. Thus, if it is desired to coat a layer of a target material A, followed by a layer of a target material B, the cathode 34 can be coated with one or more repeating sets of sections of A,B target materials. During sputtering, magnet packages 40 are aligned for shuttle movement only with one of the sets of the sections of target material at a time, say with the A sections of target material. At least one of the workpiece 12 or cathode 34 is adapted for longitudinal movement in order to coat the entire workpiece 12 with the target material A. After A is sputtered, the magnet packages 40 are moved, or the cathode 34 is moved, longitudinally, such that the magnet packages 40 will only be shuttled within the sections of the B target material. Again the workpiece 12 is moved longitudinally in order to coat the entire workpiece 12 with the target material B.

The invention is further illustrated by the following non-limiting example.

EXAMPLE

An 8 cm ID tube of carbon-steel/stainless steel was coated with a coating of Hastelloy™-C-276 (a nickel-molybdenum-chromium wrought alloy known for corrosion resistance, available from Haynes International, Indiana, U.S.A.), using the process and apparatus of the present invention. The coating was deposited with a magnet package containing 8 magnets. The cathode assembly included a Hastelloy alloy tube, sized 1.25 cm (OD). Eight permanent annular shaped magnets of SaCo, with a diameter of 9.52 mm, $L_m$ of 9.52 mm, and $L_{ms}$ of 5 mm, were used as a magnet package. The magnet package length, $L_{pkg}$, was 110 mm, the shuttle distance, $L_{sh}$ was 230 mm, the coverage was 340 mm, the shuttle speed was 100 mm/s. The following sputtering parameters were used:

| | |
|---|---|
| Process Temperature (workpiece)[° C.] | 450 |
| Ultimate vacuum[Pa] | 0.04 |
| Process Gas Flow, Ar[sccm] | 2 |
| Process Gas Pressure P[Pa] | 0.7 |
| Average Current I[A] | 7.31 |
| Average Voltage[V] | 500.62 |
| Average Power P[kW] | 3.72 |
| Average Current Density J ave[mA/cm$^2$] | 53.9 |
| Local Current Density J [c][mA/cm$^2$] | 254.52 |
| Average Power Density P ave[W/cm$^2$] | 27.41 |
| Local Power Density P [c][W/cm$^2$] | 129.45 |
| Linear Power Density [kWh/m] | 17.8 |
| Total Energy Consumption [kWh] | 6.06 |
| Run time [min] | 98.73 |
| Sputtered Area [cm$^2$] | 136 |
| Active surface area [cm$^2$] | 29 |

Figure 18A:
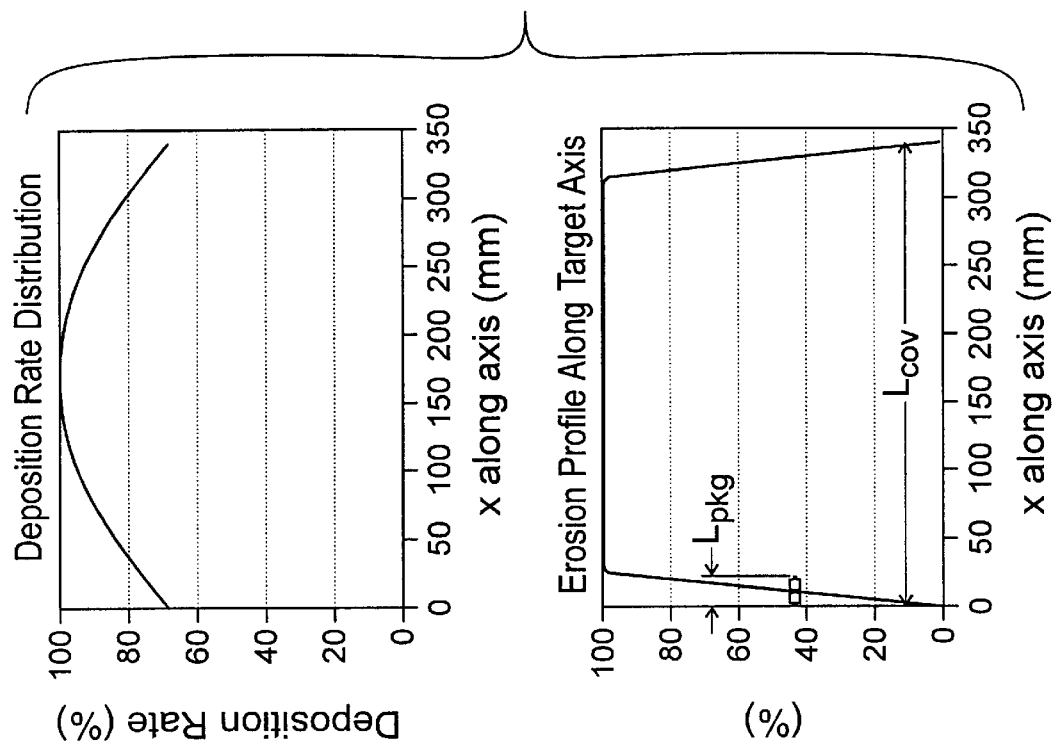
FIGS. 18a, 18b, 18c, and 18d are graphs showing deposition of a corrosion resistant alloy onto the inside surface of a cylindrical workpiece using various magnet arrangements in accordance with the present invention as described in the Example, with the top graph in each Figure showing the deposition rate distribution by plotting deposition rate (%) against the target axis in mm, and the bottom graph in each Figure showing the erosion profile along the target axis by plotting % erosion of the target against the target axis in mm. The bottom graph in each Figure further shows a schematic representation of the magnet arrangement and size for each deposition.
Figure 18B:
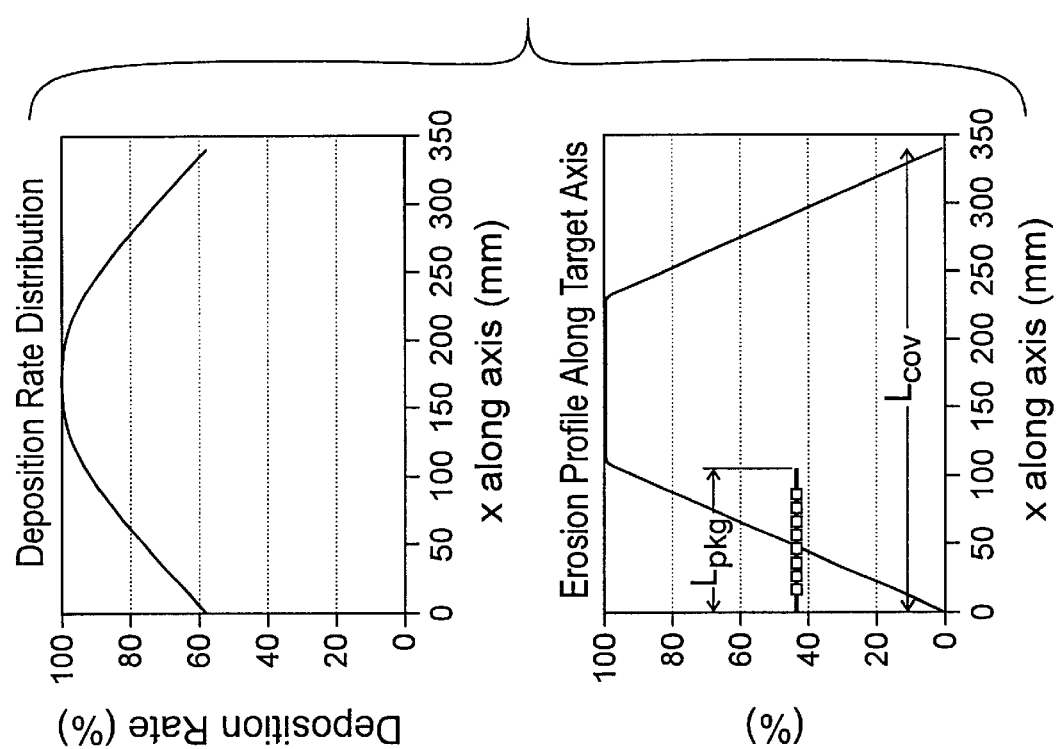
Figure 18D:
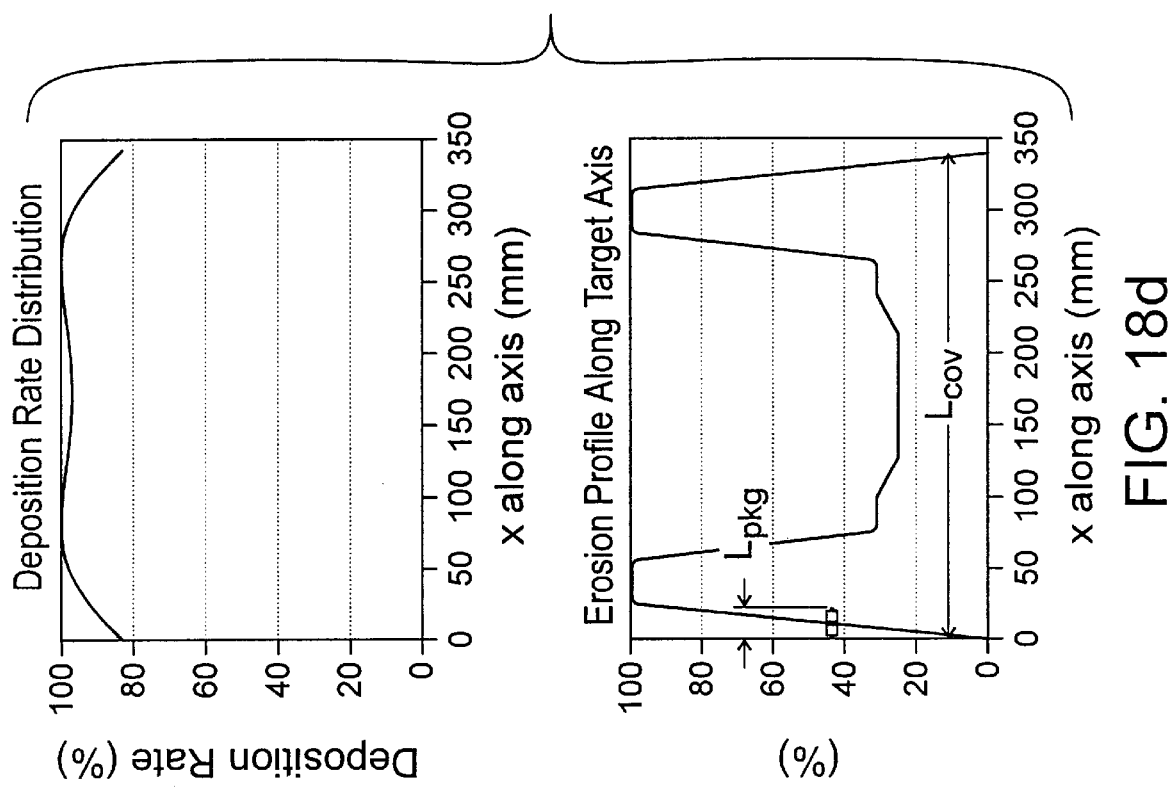
Figure 18C:
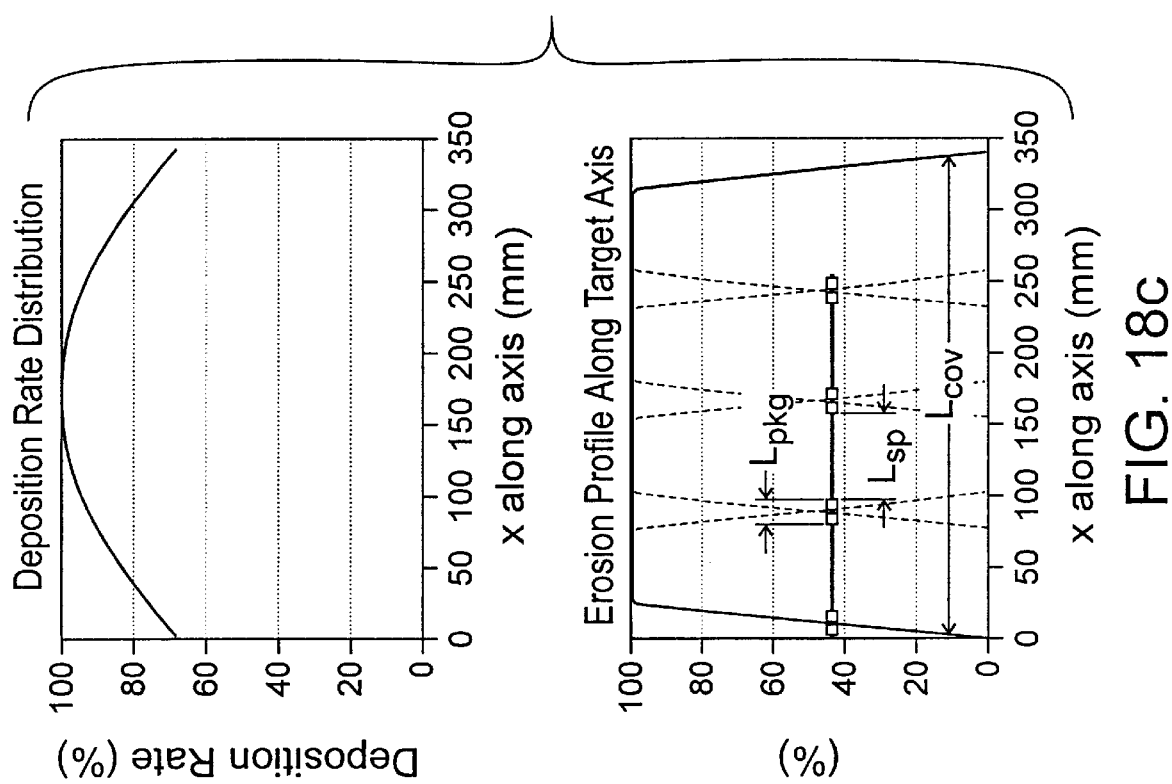

FIGS. 18a to 18d are theoretical models included to demonstrate the effects of altering the magnet package arrangement, in accordance with the present invention, on the deposition rate and erosion profile along the target axis. Each figure is a graphical representation of the theoretical distribution in the thickness of the coating of this experiment, the modeling being based on a cosine distribution of the material sputtered from the target surface, and measuring the cross sectional micrographs of coupons positioned along the axis tested the model. FIG. 18a, in the top graph shows the deposition rate (%) plotted along the target axis (mm), while the bottom graph shows the erosion profile along the target axis (mm), the magnet package for each being shown in the bottom graph to give its size relative to the erosion profile. In FIG. 18a, the coating is formed using one magnet package of 8 magnets, having a package length of 110 mm, a shuttle length of 230 mm, and a coverage length, $L_{cov}$ of 340 mm, as set out above. The coating thickness decreased significantly at the ends of the sputtered zone due to the end effect over the magnet package length. FIG. 18b shows an improved coating thickness distribution using a shorter, single magnet package of 2 magnets, a package length of 25 mm, a shuttle length of 315 mm, and a coverage length of 340 mm. Here the maximum average power density was reduced to 25% of that used for FIG. 18a, assuming that the local power density remained the same, which results in a run time of about 4 times as long for the same thickness of coating. FIG. 18c shows the coating thickness uniformity similar to 18b, can be obtained without an extended run time by using a magnet assembly consisting of 4 magnets packages of two magnets in each package, spaced so as to maintain the same sputtered length. The length of each package was 25 mm, and the magnet package spacing was 52.25 mm.

FIG. 18d shows the possibility of further improving the coating uniformity if a non-uniform erosion profile along the target axis is acceptable. The coating is formed using a magnet package of 2 magnets, as in FIG. 18b, but altering the shuttle velocity along the axis. An improved distribution is shown in this Figure, compared with FIG. 18b, by slowing down the shuttle velocity gradually near the ends to increase the active sputtering time in these zones. In this case, only 5 steps are used, however, a smooth change in the shuttle movement is easily programmed.

All publications mentioned in this specification are indicative of the level of skill of those skilled in the art to which this invention pertains. All publications are herein incorporated by reference to the same extent as if each individual publication was specifically and individually indicated to be incorporated by reference.

The terms and expressions used in this specification are used as terms of description and not of limitation. There is no intention, in using such terms and expressions, of excluding equivalents of the features shown and described.

We claim:

1. A cathode assembly for magnetron sputtering inside an annular cavity of a hollow, curved workpiece having a non-linear axis of symmetry, comprising: a tubular cathode having a sputtering length of $L_s$, and being generally curved along a non-linear axis of symmetry to follow the non-linear axis of symmetry of the annular cavity of the workpiece;
   one or a plurality of magnets held within the cathode such that a driving force applied to said one or a plurality of magnets imparts relative longitudinal movement between said one or a plurality of magnets and the cathode; and
   in the case of a plurality of magnets, said plurality of magnets being arranged in either
      i. one magnet package as spaced magnets of alternating polarity, or
      ii. in more than one magnet package with each magnet package including one magnet, or a plurality of spaced magnets arranged with alternating polarity.

2. The cathode assembly as set forth in claim 1, which further comprises means for cooling the cathode.

3. The cathode assembly as set forth in claim 1, wherein a plurality of magnets are provided, said plurality of magnets being arranged in either
   i. one magnet package as spaced magnets of alternating polarity, or
   ii. in more than one magnet package
with each magnet package including one magnet, or a plurality of spaced magnets arranged with alternating polarity, and wherein each magnet package is held within the cathode for shuttle movement.

4. The cathode assembly as set forth in claim 2, wherein a plurality of magnets are provided, said plurality of magnets being arranged in either
   i. one magnet package as spaced magnets of alternating polarity, or
   ii. in more than one magnet package
with each magnet package including one magnet, or a plurality of spaced magnets arranged with alternating polarity, and wherein each magnet package is held within the cathode for shuttle movement.

5. The cathode assembly as set forth in claim 1, wherein the cathode includes means for positioning, and preventing radial displacement of, the cathode generally along the axis of symmetry of the workpiece.

6. The cathode assembly as set forth in claim 2, wherein the cathode includes means for positioning, and preventing radial displacement of, the cathode generally along the axis of symmetry of the workpiece.

7. The cathode assembly as set forth in claim 3, wherein the cathode includes means for positioning, and preventing radial displacement of, the cathode generally along the axis of symmetry of the workpiece.

8. The cathode assembly as set forth in claim 4, wherein the cathode includes means for positioning, and preventing radial displacement of, the cathode generally along the axis of symmetry of the workpiece.

9. A cathode assembly for magnetron sputtering inside an annular cavity of a hollow, curved workpiece having a non-linear axis of symmetry, comprising:
   a tubular cathode having a sputtering length of $L_s$, wherein the cathode is bendable so as to be able to bend to follow the non-linear axis of symmetry of the workpiece, but is rigid so as to retain a bent shape, to allow for insertion and positioning along the non-linear axis of symmetry of the workpiece;
   means for cooling the cathode;
   one or a plurality of magnets held within the cathode such that a driving force applied to said one or a plurality of magnets imparts relative longitudinal movement between said one or a plurality of magnets and the cathode;
   in the case of a plurality of magnets, said plurality of magnets being arranged in either
      i. one magnet package as spaced magnets of alternating polarity, or
      ii. in more than one magnet package with each magnet package including one magnet, or a plurality of spaced magnets arranged with alternating polarity; and
   wherein said one or a plurality of magnets are mounted on a flexible rod extending generally along the non-linear axis of symmetry of the tubular cathode, such that a driving force applied to the flexible rod imparts longitudinal movement to said one or a plurality of magnets.

10. The cathode assembly as set forth in claim 9, wherein a plurality of magnets are provided, said plurality of magnets being arranged in either
   i. one magnet package as spaced magnets of alternating polarity, or
   ii. in more than one magnet package with each magnet package including one magnet, or a plurality of spaced magnets arranged with alternating polarity, and wherein each magnet package is held within the cathode for shuttle movement.

11. The cathode assembly as set forth in claim 9, wherein the cathode includes means for positioning, and preventing radial displacement of, the cathode generally along the axis of symmetry of the workpiece.

12. The cathode assembly as set forth in claim 10, wherein the cathode includes means for positioning, and preventing radial displacement of, the cathode generally along the axis of symmetry of the workpiece.

13. The cathode assembly as set forth in claim 12, which includes a target material to be sputtered in thermal contact with the cathode over a distance of at least $L_s$.

14. The cathode assembly as set forth in claim 13, wherein the target material is provided as a coating on the outer surface of the cathode.

15. The cathode assembly as set forth in claim 14, wherein the cathode is generally circular in cross section, and wherein said one or a plurality of magnets are generally cylindrical and are oriented generally symmetrically about the axis of symmetry of the cathode.

16. The cathode assembly as set forth in claim 15, wherein the cathode is generally U-shaped to coat the inside wall of U-shaped annular cavities in pipes or fittings.

17. The cathode assembly as set forth in claim 16, wherein the cathode is closed at one end to be generally finger-shaped, wherein the means for cooling the cathode comprises a fluid conduit within the flexible rod, and a coolant inlet and a coolant outlet at the end of the cathode which is not closed, such that a fluid coolant can be flowed in opposing directions in the fluid conduit and in an annular space between said one or a plurality of magnets and the inner cathode wall.

18. The cathode assembly as set forth in claim 16, wherein the means for cooling the cathode comprises a coolant inlet at one end of the cathode and a coolant outlet at the other end of the cathode, such that a fluid coolant can be flowed through an annular space between said one or a plurality of magnets and the inner cathode wall.

19. The cathode assembly as set forth in claim 15, wherein the cathode is closed at one end to be generally finger-shaped, wherein the means for cooling the cathode comprises a fluid conduit within the flexible rod, and a coolant inlet and a coolant outlet at the end of the cathode which is not closed, such that a fluid coolant can be flowed in opposing directions in the fluid conduit and in an annular space between said one or a plurality of magnets and the inner cathode wall.

20. The cathode assembly as set forth in claim 19, wherein the means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, and wherein an area of the workpiece is thereby shadowed by the insulating stand-offs.

21. The cathode assembly as set forth in claim 20, wherein the insulating stand-offs include channels or cut-outs to allow for evacuation and the flow of process gas in an annular space between the workpiece and the cathode.

22. The cathode assembly as set forth in claim 21, wherein the insulating stand-offs are formed with one or more annular grooves which are shadowed from a line of sight of the sputtering so as to prevent electrical shorting during sputtering.

23. The cathode assembly as set forth in claim 20, wherein the cathode is adapted for translating movement relative to the workpiece to be coated in order to move the cathode a distance sufficient to coat the workpiece in the area of the workpiece which is shadowed by the insulating stand-offs.

24. The cathode assembly as set forth in claim 23, wherein the cathode has a sputtering length of $L_s$ and where the combined length of all the magnet packages present and the spaces between the magnet packages if there is more than one magnet package present, is less than half of $L_s$.

25. The cathode assembly as set forth in claim 24, wherein the flexible rod and all the magnet packages present are moved with a velocity of $V_{sh}$ which can be varied by applying a variable driving force to the flexible rod.

26. The cathode assembly as set forth in claim 15, wherein the means for cooling the cathode comprises a coolant inlet at one end of the cathode and a coolant outlet at the other end of the cathode, such that a fluid coolant can be flowed through an annular space between said one or a plurality of magnets and the inner cathode wall.

27. The cathode assembly as set forth in claim 26, wherein the means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, and wherein an area of the workpiece is thereby shadowed by the insulating stand-offs.

28. The cathode assembly as set forth in claim 27, wherein the insulating stand-offs include channels or cut-outs to allow for evacuation and the flow of process gas in an annular space between the workpiece and the cathode.

29. The cathode assembly as set forth in claim 28, wherein the insulating stand-offs are formed with one or more annular grooves which are shadowed from a line of sight of the sputtering so as to prevent electrical shorting during sputtering.

30. The cathode assembly as set forth in claim 27, wherein the cathode is adapted for translating movement relative to the workpiece to be coated in order to move the cathode a distance sufficient to coat the workpiece in the area of the workpiece which is shadowed by the insulating stand-offs.

31. The cathode assembly as set forth in claim 30, wherein the cathode has a sputtering length of $L_s$ and where the combined length of all the magnet packages present, and the spaces between the magnet packages if there is more than one magnet package present, is less than half of $L_s$.

32. The cathode assembly as set forth in claim 31, wherein the flexible rod and all the magnet packages present are moved with a velocity of $V_{sh}$ which can be varied by applying a variable driving force to the flexible rod.

33. The cathode assembly as set forth in claim 1, 12, 25 or 32, wherein multiple cathode assemblies are combined for simultaneous coating of multiple workpieces.

34. A cathode assembly for magnetron sputtering inside an annular cavity of a hollow workpiece having a non-linear axis of symmetry, comprising:
   a tubular cathode having a sputtering length of $L_s$, and being generally shaped to follow the non-linear axis of symmetry of an annular cavity of the workpiece, the cathode being flexible so as to be able to continuously flex as it is positioned or moved along the non-linear axis of symmetry, while still being sufficiently rigid to be self-supporting along the non-linear axis of symmetry, to allow the cathode to be inserted into the annular cavity of the workpiece and to position, and optionally to move, the cathode generally along the non-linear axis of symmetry of the annular cavity of the workpiece;
   one or a plurality of magnets held within the cathode such that a driving force applied to said one or a plurality of magnets, or to the cathode, or to both said one or a plurality of magnets and to the cathode independently, imparts relative longitudinal movement between said one or a plurality of magnets and the cathode; and
   in the case of a plurality of magnets, said plurality of magnets being arranged in either
      i. one magnet package as spaced magnets of alternating polarity, or
      ii. in more than one magnet package with each magnet package including one magnet, or a plurality of spaced magnets arranged with alternating polarity.

35. The cathode assembly as set forth in claim 34, which further comprises means for cooling the cathode.

36. The cathode assembly as set forth in claim 35, wherein said one or a plurality of magnets are mounted on a flexible rod extending generally along the axis of symmetry of the tubular cathode, and wherein a driving force applied to the flexible rod imparts longitudinal movement to said one or a plurality of magnets.

37. The cathode assembly as set forth in claim 36, wherein the cathode includes flexible vacuum tight joints spaced along its length to allow it to generally follow the axis of symmetry of the annular cavity of the workpiece.

38. The cathode assembly as set forth in claim 37, wherein the cathode comprises a plurality of flexible vacuum tight bellow joints connecting rigid cylindrical cathode sections, and wherein at least one magnet package is included in each cylindrical cathode section for translating movement within that cylindrical cathode section.

39. The cathode assembly as set forth in claim 38, wherein the one or more magnet packages are held within the cathode for shuttle movement.

40. The cathode assembly as set forth in claim 35, 37, or 38, wherein the cathode includes means for positioning, and preventing radial displacement of, the cathode generally along the axis of symmetry of the workpiece.

41. The cathode assembly as set forth in claim 39, wherein the cathode includes means for positioning, and preventing radial displacement of, the cathode generally along the axis of symmetry of the workpiece.

42. The cathode assembly as set forth in claim 41, which includes a target material to be sputtered in thermal contact with the rigid cylindrical cathode sections over a distance of at least $L_s$.

43. The cathode assembly as set forth in claim 42, wherein the cathode includes alternating repeating sections of two or more different target materials to create two or more sets of sections of different target materials along the cathode in order to produce sequential, multi-layer coatings of the different target materials.

44. The cathode assembly as set forth in claim 43, wherein the one or more magnet packages are aligned for shuttle movement within only one of the sets of the sections of target material at a time, and wherein at least one of the cathode or the workpiece is adapted for relative translating movement in order to coat the workpiece with the target material with sequential layers of the different target materials.

45. The cathode assembly as set forth in claim 44, wherein the target material is provided as a coating on the outer surface of the rigid cylindrical cathode sections.

46. The cathode assembly as set forth in claim 45, wherein the cathode is generally circular in cross section, and wherein said one or a plurality of magnets are generally cylindrical and are oriented generally symmetrically about the axis of symmetry of the cathode.

47. The cathode assembly as set forth in claim 46, wherein the cathode is closed at one end to be generally finger-shaped, wherein the means for cooling the cathode comprises a fluid conduit within the flexible rod, and a coolant inlet and a coolant outlet at the end of the cathode which is not closed, such that a fluid coolant can be flowed in opposing directions in the fluid conduit and in an annular space between said one or a plurality of magnets and the inner cathode wall.

48. The cathode assembly as set forth in claim 46, wherein the means for cooling the cathode comprises a coolant inlet at one end of the cathode and a coolant outlet at the other end of the cathode, such that a fluid coolant can be flowed through an annular space between said one or a plurality of magnets and the inner cathode wall.

49. The cathode assembly as set forth in claim 46, wherein the cathode is flexible to allow it to assume an S-shape to coat the inner wall of an S-shaped annular cavity in a pipe or a fitting.

50. The cathode assembly as set forth in claim 49, wherein the cathode is closed at one end to be generally finger-shaped, and wherein the means for cooling the cathode comprises a fluid conduit within the flexible rod, and a coolant inlet and a coolant outlet at the end of the cathode which is not closed, such that a fluid coolant can be flowed in opposing directions in the fluid conduit and in an annular space between said one or a plurality of magnets and the inner cathode wall.

51. The cathode assembly as set forth in claim 50, wherein the means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, and wherein an area of the workpiece is thereby shadowed by the insulating stand-offs.

52. The cathode assembly as set forth in claim 51, wherein the insulating stand-offs include channels or cut-outs to allow for evacuation and the flow of process gas in an annular space between the workpiece and the cathode.

53. The cathode assembly as set forth in claim 52, wherein the insulating stand-offs are formed with one or more annular grooves which are shadowed from a line of sight of the sputtering so as to prevent electrical shorting during sputtering.

54. The cathode assembly as set forth in claim 53, wherein the cathode is adapted for translating movement relative to the workpiece to be coated in order to move the cathode a distance sufficient to coat the workpiece in the area of the workpiece which is shadowed by the insulating stand-offs.

55. The cathode assembly as set forth in claim 54, wherein the cathode has a sputtering length of $L_s$ and where the combined length of all the magnet packages present, and the spaces between the magnet packages if there is more than one magnet package present, is less than half of $L_s$.

56. The cathode assembly as set forth in claim 55, wherein the flexible rod and all the magnet packages present are moved with a velocity of $V_{sh}$ which can be varied by applying a variable driving force to the flexible rod.

57. The cathode assembly as set forth in claim 49, wherein the means for cooling the cathode comprises a coolant inlet at one end of the cathode and a coolant outlet at the other end of the cathode, such that a fluid coolant can be flowed through an annular space between said one or a plurality of magnets and the inner cathode wall.

58. The cathode assembly as set forth in claim 57, wherein the means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, and wherein an area of the workpiece is thereby shadowed by the insulating stand-offs.

59. The cathode assembly as set forth in claim 58, wherein the insulating stand-offs include channels or cut-outs to allow for evacuation and the flow of process gas in an annular space between the workpiece and the cathode.

60. The cathode assembly as set forth in claim 59, wherein the insulating stand-offs are formed with one or more annular grooves which are shadowed from a line of sight of the sputtering so as to prevent electrical shorting during sputtering.

61. The cathode assembly as set forth in claim 60, wherein the cathode is adapted for translating movement relative to the workpiece to be coated in order to move the cathode a distance sufficient to coat the workpiece in the area of the workpiece which is shadowed by the insulating stand-offs.

62. The cathode assembly as set forth in claim 61, wherein the cathode has a sputtering length of $L_s$ and where the combined length of all the magnet packages present, and the spaces between the magnet packages if there is more than one magnet package present, is less than half of $L_s$.

63. The cathode assembly as set forth in claim 62, wherein the flexible rod and all the magnet packages present are moved with a velocity of $V_{sh}$ which can be varied by applying a variable driving force to the flexible rod.

64. The cathode assembly as set forth in claim 35, 41, 56 or 63, wherein multiple cathode assemblies are combined for simultaneous coating of multiple workpieces.

65. A cathode assembly for magnetron sputtering of a workpiece, comprising:
a tubular cathode having a sputtering length of $L_s$,
a plurality of spaced magnet packages, each of the magnet packages including either one magnet or a plurality of spaced magnets of alternating polarity, and having a magnet package length $L_{pkg}$;
the magnet packages being held within the cathode, generally along the axis of symmetry of the cathode, such that a driving force applied to the magnet packages or to the cathode, or to both independently, imparts relative longitudinal movement between the magnet packages and the cathode, and wherein the spacing between the magnet packages, $L_{spc}$, is equal to or greater than $L_{pkg}$.

66. The cathode assembly as set forth in claim 65, which further comprises means for cooling the cathode.

67. The cathode assembly as set forth in claim 66, wherein the spacing between the magnet packages, $L_{spc}$, is sufficiently large compared to $L_{pkg}$, that, during sputtering the time averaged magnetic field over the cathode surface remains substantially uniform.

68. The cathode assembly as set forth in claim 66, wherein the combined length of all the magnet packages present, and the spaces between the magnet packages is less than half of $L_s$.

69. The cathode assembly as set forth in claim 66, wherein each magnet package includes a plurality of spaced magnets.

70. The cathode assembly as set forth in claim 68, wherein each magnet package includes a plurality of spaced magnets.

71. The cathode assembly as set forth in claim 70, wherein the magnet packages are held within the cathode such that a push and pull driving force applied to the magnet packages or to the cathode, or to both independently, imparts relative longitudinal shuttle movement between the magnet packages and the cathode.

72. The cathode assembly as set forth in claim 71, wherein the spacing between the magnet packages, $L_{spc}$, is equal to or greater than the magnet package length $L_{pkg}$, and wherein the shuttle distance, $L_{sh}$, is $L_{sh}=m(L_{spc}+L_{pkg})$, with m being an integer.

73. The cathode assembly as set forth in claim 72, wherein m=1.

74. The cathode assembly as set forth in claim 66 or 73, wherein the cathode includes one or more means for positioning, and preventing radial displacement of, the cathode generally along the axis of symmetry of the workpiece.

75. The cathode assembly as set forth in claim 73, wherein the cathode includes one or more means for positioning, and preventing radial displacement of, the cathode generally along the axis of symmetry of the workpiece.

76. The cathode assembly as set forth in claim 75, wherein the cathode is generally cylindrical and wherein said one or more means for positioning the cathode along the axis of symmetry of the workpiece comprises a cathode tension device at each end of the cylindrical cathode for holding the cathode in tension.

77. The cathode assembly as set forth in claim 75, wherein said one or more means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece.

78. The cathode assembly as set forth in claim 76, wherein said one or more means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece.

79. The cathode assembly as set forth in claim 75, wherein said one or more means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, and wherein the insulating stand-offs include channels or cut-outs to allow for evacuation and the flow of process gas in an annular space between the workpiece and the cathode.

80. The cathode assembly as set forth in claim 76, wherein said one or more means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, and wherein the insulating stand-offs include channels or cut-outs to allow for evacuation and the flow of process gas in an annular space between the workpiece and the cathode.

81. The cathode assembly as set forth in claim 75, wherein said one or more means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, wherein the insulating stand-offs include channels or cut-outs to allow for evacuation and the flow of process gas in an annular space between the workpiece and the cathode, and wherein the insulating stand-offs are formed with one or more annular grooves which are shadowed from a line of sight of the sputtering so as to prevent electrical shorting during sputtering.

82. The cathode assembly as set forth in claim 76, wherein said one or more means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, wherein the insulating stand-offs include channels or cut-outs to allow for evacuation and the flow of process gas in an annular space between the workpiece and the cathode, and wherein the insulating stand-offs are formed with one or more annular grooves which are shadowed from a line of sight of the sputtering so as to prevent electrical shorting during sputtering.

83. The cathode assembly as set forth in claim 75, wherein said one or more means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, wherein an area of the workpiece is thereby shadowed by the insulating stand-offs, wherein the insulating stand-offs include channels or cut-outs to allow for evacuation and the flow of process gas in an annular space between the workpiece and the cathode, wherein the insulating stand-offs are formed with one or more annular grooves which are shadowed from a line of sight of the sputtering so as to prevent electrical shorting during sputtering, and wherein the cathode is adapted for translating movement relative to the workpiece to be coated in order to move the cathode a distance sufficient to coat the area of the workpiece which is shadowed by the insulating stand-offs.

84. The cathode assembly as set forth in claim 73, 75 or 83, wherein the magnet packages are held within the cathode for simultaneous shuttle movement.

85. The cathode assembly as set forth in claim 66, 68 or 69, wherein the magnet packages are held within the cathode such that a push and pull driving force applied to the magnet packages or to the cathode, or to both independently, imparts relative longitudinal shuttle movement between the magnet packages and the cathode.

86. The cathode assembly as set forth in claim 76, wherein said one or more means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, wherein an area of the workpiece is thereby shadowed by the insulating stand-offs, wherein the insulating stand-offs include channels or cut-outs to allow for evacuation and the flow of process gas in an annular space between the workpiece and the cathode, wherein the insulating stand-offs are formed with one or more annular grooves which are shadowed from a line of sight of the sputtering so as to prevent electrical shorting during sputtering, and wherein the cathode is adapted for translating movement relative to the workpiece to be coated in order to move the cathode a distance sufficient to coat the area of the workpiece which is shadowed by the insulating stand-offs.

87. The cathode assembly as set forth in claim 86, wherein the magnet packages are held within the cathode for simultaneous shuttle movement.

88. The cathode assembly as set forth in claim 87, wherein the magnets may have an equal or unequal length of $L_m$, be spaced within a package by an equal or unequal magnet space of $L_{ms}$, having equal or unequal magnet package lengths $L_{pkg}$, and having equal or unequal spacing between magnet packages of $L_{spc}$, such that:

$$L_{pkg}^i \approx \sum_{j=1}^{k} L_m^{ij} + \sum_{j=1}^{k-1} L_{ms}^{ij}$$

$$L_\Sigma \approx \sum_{i=1}^{n} L_{pkg}^i + \sum_{i=1}^{n-1} L_{spc}^i$$

wherein k is the number of magnets in a magnet package, n is the number of magnet packages, $L_\Sigma$ is the combined length of a plurality of magnet packages.

89. The cathode assembly as set forth in claim 88, wherein k=1 and $L_{spc}$ is greater than one half of $L_m$.

90. The cathode assembly as set forth in claim 88, wherein k>1 and $L_{spc}$ is greater than $L_{ms}$.

91. The cathode assembly as set forth in claim 89, wherein $L_{spc}$ is greater than $L_{pkg}$.

92. The cathode assembly as set forth in claim 90, wherein $L_{spc}$ is greater than $L_{pkg}$.

93. The cathode assembly as set forth in claim 89, 90 or 91, wherein the magnet packages are held within the cathode for shuttle movement within the cathode with a shuttle distance $L_{sh}$ which is approximately equal to $L_s$–$L_\Sigma$.

94. The cathode assembly as set forth in claim 92, wherein the magnet packages are held within the cathode for shuttle movement within the cathode with a shuttle distance $L_{sh}$ which is approximately equal to $L_s$–$L_\Sigma$.

95. The cathode assembly as set forth in claim 89, 90 or 91, wherein the number of magnet packages is n, the magnet packages are generally of equal length and are generally equally spaced, the magnets within a package are generally equally spaced, and the magnet packages are held within the cathode for shuttle movement within the cathode with a shuttle distance $L_{sh}$, such that, in order to sputter over the length $L_s$, the number of magnet packages and the magnet spacing is such that $L_s=n*L_{pkg}+(n-1)*L_{spc}+L_{sh}$, wherein $L_{sh}=m(L_{spc}+L_{pkg})$, with m being an integer.

96. The cathode assembly as set forth in claim 94 wherein the number of magnet packages is n, the magnet packages are generally of equal length and are generally equally spaced, the magnets within a package are generally equally spaced, and the magnet packages are held within the cathode for shuttle movement within the cathode with a shuttle distance $L_{sh}$, such that, in order to sputter over the length $L_s$, the number of magnet packages and the magnet spacing is such that $L_s=n*L_{pkg}+(n-1)*L_{spc}+L_{sh}$, wherein $L_{sh}=m(L_{spc}+L_{pkg})$, with m being an integer.

97. The cathode assembly as set forth in claim 96, wherein m=1.

98. The cathode assembly as set forth in claim 88, wherein the cathode is curved for sputtering of an annular cavity of a hollow, curved workpiece.

99. The cathode assembly as set forth in claim 97, wherein the cathode is curved for sputtering of an annular cavity of a hollow, curved workpiece.

100. The cathode assembly as set forth in claim 66, 88, 97 or 98, which further comprises:
a central rod extending within the cathode along the axis of symmetry of the cathode; and
the magnet packages being held in spaced relationship on the central rod.

101. The cathode assembly as set forth in claim 99, which further comprises:
a central rod extending within the cathode along the axis of symmetry of the cathode; and the magnet packages being held in spaced relationship on the central rod.

102. The cathode assembly as set forth in claim 101, wherein the central rod is adapted for longitudinal shuttle movement, and the magnet packages therewith, relative to the cathode, when a push and pull driving force is applied to the central rod.

103. The cathode assembly as set forth in claim 102, wherein the central rod and magnet packages are moved with a velocity of $V_{sh}$ which can be varied by applying a variable driving force to the central rod.

104. The cathode assembly as set forth in claim 103, wherein the magnets are held in generally equally spaced relationship within the package by magnetic repulsion and wherein means are provided for retaining the magnets on the central rod in fixed relationship within and between each magnet package so that a ring-shaped magnetic field is generated around each magnet.

105. The cathode assembly as set forth in claim 104, which includes a target material to be sputtered in thermal contact with the cathode over a distance of at least $L_s$.

106. The cathode assembly as set forth in claim 105, wherein the cathode includes alternating repeating sections of two or more different target materials to create two or more sets of sections of different target material along the cathode in order to produce sequential, multi-layer coatings of the different target materials.

107. The cathode assembly as set forth in claim 106, wherein the one or more magnet packages are aligned for shuttle movement within only one set of the sections of target material at a time, in order to sputter only one of the different target materials at a time, and wherein at least one of the cathode or the workpiece is adapted for relative translating movement in order to coat the workpiece with the target material with sequential layers of the different target materials.

108. The cathode assembly as set forth in claim 107, wherein the target material is provided as a coating on the outer surface of the cathode.

109. The cathode assembly as set forth in claim 108, wherein the cathode is generally cylindrical, and wherein the magnets are generally cylindrical and are oriented generally symmetrically about the axis of symmetry of the cathode.

110. The cathode assembly as set forth in claim 103, wherein the magnets are generally equally spaced within a magnet package, and optionally at the ends of the magnet package, by spacers formed from soft magnetic material so as to generate a generally ring-shaped magnetic field.

111. The cathode assembly as set forth in claim 110, wherein means are provided for retaining the magnets on the central rod in fixed relationship within and between each package.

112. The cathode assembly as set forth in claim 111, which includes a target material to be sputtered in thermal contact with the cathode over a distance of at least $L_s$.

113. The cathode assembly as set forth in claim 112, wherein the target material is provided as a coating on the outer surface of the cathode.

114. The cathode assembly as set forth in claim 113, wherein the cathode is closed at one end to be generally finger-shaped.

115. The cathode assembly as set forth in claim 114, wherein the cathode is curved for coating inside an annular cavity of a hollow, curved workpiece, and wherein the central rod is flexible to allow for longitudinal shuttle movement within the curved cathode.

116. The cathode assembly as set forth in claim 115, wherein the cathode is generally shaped to follow an axis of symmetry of an annular cavity of a hollow workpiece to be coated, and wherein the central rod is flexible to allow for translating movement within the cathode.

117. The cathode assembly as set forth in claim 113, wherein the cathode is curved for coating inside an annular cavity of a hollow, curved workpiece, and wherein the central rod is flexible to allow for longitudinal shuttle movement within the curved cathode.

118. The cathode assembly as set forth in claim 117, wherein the cathode is generally shaped to follow an axis of symmetry of an annular cavity of a hollow workpiece to be coated, and wherein the central rod is flexible to allow for translating movement within the cathode.

119. The cathode assembly as set forth in claim 118, wherein the cathode is generally U-shaped to coat the inner wall of a U-shaped annular cavity in a pipe or fitting.

120. The cathode assembly as set forth in claim 118, wherein the cathode is generally elbow-shaped to coat the inner wall of an elbow-shaped annular cavity in a pipe or fitting.

121. The cathode assembly as set forth in claim 118, wherein the cathode is flexible to allow the cathode to be inserted into the annular cavity of the workpiece and to position, and optionally to move, the cathode generally along the axis of symmetry of the annular cavity of the workpiece.

122. The cathode assembly as set forth in claim 121, wherein the cathode includes flexible vacuum tight joints spaced along its length to allow it to generally follow the axis of symmetry of the annular cavity of the workpiece.

123. The cathode assembly as set forth in claim 122, wherein the cathode comprises a plurality of flexible vacuum tight bellow joints connecting rigid cylindrical cathode sections, and wherein at least one magnet package is included in each cylindrical cathode section for longitudinal shuttle movement within that cylindrical cathode section.

124. The cathode assembly as set forth in claim 123, wherein the cathode is provided with ring-shaped electrically insulating stand-offs on either side of each bellow joint to contact the inner surface of the workpiece to be coated and to position the cathode generally along the axis of symmetry of the workpiece, and wherein an area of the workpiece is thereby shadowed by the insulating stand-offs.

125. The cathode assembly as set forth in claim 124, wherein the insulating stand-offs include channels or cut-outs to allow for evacuation and the flow of process gas in an annular space between the workpiece and the cathode, and wherein an area of the workpiece is thereby shadowed by the insulating stand-offs.

126. The cathode assembly as set forth in claim 125, wherein the insulating stand-offs are formed with one or more annular grooves which are shadowed from a line of sight of the sputtering so as to prevent electrical shorting during sputtering.

127. The cathode assembly as set forth in claim 109, 118, 119, or 120, wherein the means for cooling the cathode comprises a coolant inlet at one end of cathode and a coolant outlet at the other end of the cathode, such that a fluid coolant can be flowed through an annular space between the magnet packages and the inner cathode wall.

128. The cathode assembly as set forth in claim 126, wherein the means for cooling the cathode comprises a coolant inlet at one end of cathode and a coolant outlet at the other end of the cathode, such that a fluid coolant can be flowed through an annular space between the magnet packages and the inner cathode wall.

129. The cathode assembly as set forth in claim 109, 118, 119, or 120, wherein the cathode is closed at one end to be generally finger-shaped, wherein the means for cooling the cathode comprises a fluid conduit within the central rod, and a coolant inlet and a coolant outlet at the end of the cathode which is not closed, such that a fluid coolant can be flowed in opposing directions in the fluid conduit and in an annular space between the magnet packages and the inner cathode wall.

130. The cathode assembly as set forth in claim 126, wherein the cathode is closed at one end to be generally finger-shaped, wherein the means for cooling the cathode comprises a fluid conduit within the central rod, and a coolant inlet and a coolant outlet at the end of the cathode which is not closed, such that a fluid coolant can be flowed in opposing directions in the fluid conduit and in an annular space between the magnet packages and the inner cathode wall.

131. The cathode assembly as set forth in claim 128, wherein the cathode is adapted for translating movement relative to the workpiece to be coated in order to move the cathode a distance sufficient to coat the workpiece in the area of the workpiece which is shadowed by the insulating stand-offs.

132. The cathode assembly as set forth in claim 130, wherein the cathode is adapted for translating movement relative to the workpiece to be coated in order to move the cathode a distance sufficient to coat the workpiece in the area of the workpiece which is shadowed by the insulating stand-offs.

133. The cathode assembly as set forth in claim 66, 101, 109, 117, 131 or 132, wherein multiple cathode assemblies are combined for simultaneous coating of multiple workpieces.

134. A cathode assembly for magnetron sputtering of a workpiece, comprising:
   a tubular cathode having a sputtering length of $L_s$;
   a magnet package including either one magnet or a plurality of spaced magnets of alternating polarity, and having a magnet package length $L_{pkg}$ which is less than $L_s$, the magnet package being mounted on a flexible rod, and extending generally along the axis of symmetry of the cathode, such that a driving force applied to the magnet package or to the cathode, or to both independently, imparts relative longitudinal movement between the magnet package and the cathode; and
   one or more means for positioning, and preventing radial displacement of, the cathode generally along the axis of symmetry of the workpiece, selected from
      i. a cathode tension device at each end of the cathode for holding the cathode in tension, in which case the cathode is generally cylindrical; or
      ii. one or more ring-shaped electrically insulating stand-offs along the outer surface of the cathode and between the ends of the cathode, wherein the insulating stand-offs are formed with one or more annular grooves which are shadowed from a line of sight of the sputtering so as to prevent electrical shorting during sputtering, and are sized to contact the inner surface of the workpiece to position the cathode generally along the axis of symmetry of the workpiece, and wherein an area of the workpiece is thereby shadowed by the insulating stand-offs.

135. The cathode assembly as set forth in claim 134, which further comprises means for cooling the cathode.

136. The cathode assembly as set forth in claim 135, wherein the means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, and wherein the insulating stand-offs include channels or cut-outs to allow for evacuation and the flow of process gas in an annular space between the workpiece and the cathode.

137. The cathode assembly as set forth in claim 135, wherein the means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, wherein the insulating stand-offs include channels or cut-outs to allow for evacuation and the flow of process gas in an annular space between the workpiece and the cathode, and wherein the insulating stand-offs are formed with one or more annular grooves which are shadowed from a line of sight of the sputtering so as to prevent electrical shorting during sputtering.

138. The cathode assembly as set forth in claim 135, wherein the means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, wherein an area of the workpiece is thereby shadowed by the insulating stand-offs, wherein the insulating stand-offs include channels or cut-outs to allow for evacuation and the flow of process gas in an annular space between the workpiece and the cathode, wherein the insulating stand-offs are formed with one or more annular grooves which are shadowed from a line of sight of the sputtering so as to prevent electrical shorting during sputtering, and wherein the cathode is adapted for translating movement relative to the workpiece to be coated in order to move the cathode a distance sufficient to coat the area of the workpiece which is shadowed by the insulating stand-offs.

139. The cathode assembly as set forth in claim 138, wherein the magnet package includes a plurality of spaced magnets, and wherein the length of the magnet package is less than half of $L_s$.

140. The cathode assembly as set forth in claim 139, wherein the magnet package is held within the cathode for relative shuttle movement.

141. The cathode assembly as set forth in claim 140, which further comprises:
   a central rod extending within the cathode along the axis of symmetry of the cathode; and
   the magnet package being mounted on the central rod.

142. The cathode assembly as set forth in claim 141, wherein the central rod is adapted for longitudinal shuttle movement, and the magnet package therewith, relative to the cathode, when a push and pull driving force is applied to the central rod.

143. The cathode assembly as set forth in claim 142, wherein the cathode includes alternating repeating sections of two or more different target materials to create two or more sets of sections of different target material along the cathode in order to produce sequential, multi-layer coatings of the different target materials.

144. The cathode assembly as set forth in claim 143, wherein the magnet package is aligned for shuttle movement within only one set of the sections of target material at a time, in order to sputter only one of the different target materials at a time, and wherein at least one of the cathode or the workpiece is adapted for relative translating movement in order to coat the workpiece with the target material with sequential layers of the different target materials.

145. The cathode assembly as set forth in claim 142, wherein the central rod and the magnet package are moved with a velocity of $V_{sh}$ which can be varied by applying a variable driving force to the central rod.

146. The cathode assembly as set forth in claim 144, wherein the central rod and the magnet package are moved with a velocity of $V_{sh}$ which can be varied by applying a variable driving force to the central rod.

147. The cathode assembly as set forth in claim 146, wherein the means for cooling the cathode comprises a coolant inlet at one end of cathode and a coolant outlet at the other end of the cathode, such that a fluid coolant can be flowed through an annular space between the magnets and the inner cathode wall.

148. The cathode assembly as set forth in claim 145, wherein the cathode is closed at one end to be generally finger-shaped, and wherein the means for cooling the cathode comprises a fluid conduit within the central rod, and a coolant inlet and a coolant outlet at the end of the cathode which is not closed, such that a fluid coolant can be flowed in opposing directions in the fluid conduit and in an annular space between the magnets and the inner cathode wall.

149. The cathode assembly as set forth in claim 147, which includes a plurality of spaced magnet packages and wherein the combined length of all the magnet packages present, and the spaces between the magnet packages, is less than half of $L_s$.

150. The cathode assembly as set forth in claim 148, which includes a plurality of spaced magnet packages and wherein the length of all the magnet packages present, and the spaces between the magnet packages, is less than half of $L_s$.

151. The cathode assembly as set forth in claim 149, wherein the spacing between all the magnet packages, $L_{spc}$, is sufficiently large compared to $L_{pkg}$, that, during sputtering the time averaged magnetic field over the cathode surface remains substantially uniform.

152. The cathode assembly as set forth in claim 150, wherein the spacing between all the magnet packages, $L_{spc}$, is sufficiently large compared to $L_{pkg}$, that, during sputtering the time averaged magnetic field over the cathode surface remains substantially uniform.

153. The cathode assembly as set forth in claim 151, wherein the spacing between all the magnet packages, $L_{spc}$, is equal to or greater than $L_{pkg}$.

154. The cathode assembly as set forth in claim 152, wherein the spacing between all the magnet packages, $L_{spc}$, is equal to or greater than $L_{pkg}$.

155. The cathode assembly as set forth in claim 135, 147, 148, 153 or 154, wherein multiple cathode assemblies are combined for simultaneous coating of multiple workpieces.

156. A magnetron sputtering apparatus for sputtering a coating inside an annular cavity of one or more workpieces which may have a linear or non-linear axis of symmetry, the magnetron apparatus including one or more cathode assemblies selected from the group consisting of:

a) a tubular cathode having a sputtering length of $L_s$, and being generally curved along a non-linear axis of symmetry to follow the non-linear axis of symmetry of the annular cavity of the workpiece;
one or a plurality of magnets held within the cathode such that a driving force applied to said one or a plurality of magnets imparts relative longitudinal movement between said one or a plurality of magnets and the cathode; and
in the case of a plurality of magnets, said plurality of magnets being arranged in either
i. one magnet package as spaced magnets of alternating polarity, or
ii. in more than one magnet package with each magnet package including one magnet, or a plurality of spaced magnets arranged with alternating polarity, b) a tubular cathode having a sputtering length of $L_s$, and being generally shaped to follow the non-linear axis of symmetry of an annular cavity of the workpiece, the cathode being flexible so as to be able to continuously flex as it is positioned or moved along the non-linear axis of symmetry, while still being sufficiently rigid to be self-supporting along the non-linear axis of symmetry, to allow the cathode to be inserted into the annular cavity of the workpiece and to position, and optionally to move, the cathode generally along the non-linear axis of symmetry of the annular cavity of the workpiece;
one or a plurality of magnets held within the cathode such that a driving force applied to said one or a plurality of magnets, or to the cathode, or to both said one or a plurality of magnets and to the cathode independently, imparts relative longitudinal movement between said one or a plurality of magnets and the cathode; and
in the case of a plurality of magnets, said plurality of magnets being arranged in either
i. one magnet package as spaced magnets of alternating polarity, or
ii. in more than one magnet package with each magnet package including one magnet, or a plurality of spaced magnets arranged with alternating polarity, c) a tubular cathode having a sputtering length of $L_s$,
a plurality of spaced magnet packages, each of the magnet packages including either one magnet or a plurality of spaced magnets of alternating polarity, and having a magnet package length $L_{pkg}$;
the magnet packages being held within the cathode, generally along the axis of symmetry of the cathode, such that a driving force applied to the magnet packages or to the cathode, or to both independently, imparts relative longitudinal movement between the magnet packages and the cathode, and wherein the spacing between the magnet packages, $L_{spc}$ is equal to or greater than $L_{pkg}$, and d) a tubular cathode having a sputtering length of $L_s$;
a magnet package including either one magnet or a plurality of spaced magnets of alternating polarity, and having a magnet package length $L_{pkg}$ which is less than LS, the magnet package being held within the cathode such that a driving force applied to the magnet package or to the cathode, or to both independently, imparts relative longitudinal movement between the magnet package and the cathode; and one or more means for positioning, and preventing radial displacement of, the cathode generally along the axis of symmetry of the workpiece, selected from
i. a cathode tension device at each end of the cathode for holding the cathode in tension, in which case the cathode is generally cylindrical; or
ii. one or more ring-shaped electrically insulating stand-offs along the outer surface of the cathode and between the ends of the cathode, wherein the insulating stand-offs are formed with one or more annular grooves which are shadowed from a line of sight of the sputtering so as to prevent electrical shorting during sputtering, and are sized to contact the inner surface of the workpiece to position the cathode generally along the axis of symmetry of the workpiece, and wherein an area of the workpiece is thereby shadowed by the insulating stand-offs.

157. The magnetron sputtering apparatus as set forth in claim 156, which further comprises:
an evacuable housing adapted to hold the workpiece at a defined electrical potential relative to the potential of the cathode;
means for admitting, and controlling the pressure of, one or more process gases to the housing;
the tubular cathode being provided within the housing and adapted to be positioned in coating proximity to the surface of the workpiece to be coated, the cathode having a sputtering length $L_s$;
a target material to be sputtered provided in thermal contact with the cathode over a distance of at least $L_s$;
means for applying a voltage to the cathode; and
one or more driving means for applying a driving force to said one or a plurality of magnet packages, or to both of the cathode and the workpiece, or independently to said one or a plurality of magnet packages, the cathode and the workpiece, so as to impart relative longitudinal movement between said one or a plurality of magnet packages and the cathode.

158. The sputtering apparatus as set forth in claim 157, which further comprises:
means for cooling the cathode.

159. The sputtering apparatus as set forth in claim 158, which further comprises:
means for heating the workpiece.

160. The sputtering apparatus as set forth in claim 159, wherein said one or more driving means includes a magnet driving means associated with said one or a plurality of magnet packages for imparting relative longitudinal movement between said one or a plurality of magnet packages and the cathode.

161. The sputtering apparatus as set forth in claim 160, wherein said one or more driving means includes a cathode driving means associated with the cathode for imparting relative longitudinal movement between said one or a plurality of magnet packages and the cathode.

162. The sputtering apparatus as set forth in claim 161, which further comprises a central rod extending within the cathode along the axis of symmetry of the cathode; and said one or a plurality of magnet packages are mounted on the central rod; wherein the magnet driving means comprises a linear magnet actuator connected to the central rod; and wherein the cathode driving means, if present, comprises a linear cathode actuator connected to one or both ends of the cathode.

163. The sputtering apparatus as set forth in claim 162, which further comprises:
multiple cathode assemblies, each providing a cathode positioned in coating proximity to the surface of one of a plurality of workpieces to be coated.

164. A method of sputtering a coating inside an annular cavity of one or more workpieces which may have a linear or non-linear axis of symmetry, within a housing by using one or more cathode assemblies comprising:
i) providing one or more tubular cathode assemblies selected from the group consisting of:

a) a tubular cathode having a sputtering length of $L_s$, and being generally curved along a non-linear axis of symmetry to follow the non-linear axis of symmetry of the annular cavity of the workpiece;
one or a plurality of magnets held within the cathode such that a driving force applied to said one or a plurality of magnets imparts relative longitudinal movement between said one or a plurality of magnets and the cathode; and
in the case of a plurality of magnets, said plurality of magnets being arranged in either
  i. one magnet package as spaced magnets of alternating polarity, or
  ii. in more than one magnet package with each magnet package including one magnet, or a plurality of spaced magnets arranged with alternating polarity,
b) a tubular cathode having a sputtering length of $L_s$, and being generally shaped to follow the non-linear axis of symmetry of an annular cavity of the workpiece, the cathode being flexible so as to be able to continuously flex as it is positioned or moved along the non-linear axis of symmetry, while still being sufficiently rigid to be self-supporting along the non-linear axis of symmetry, to allow the cathode to be inserted into the annular cavity of the workpiece and to position, and optionally to move, the cathode generally along the non-linear axis of symmetry of the annular cavity of the workpiece;
one or a plurality of magnets held within the cathode such that a driving force applied to said one or a plurality of magnets, or to the cathode, or to both said one or a plurality of magnets and to the cathode independently, imparts relative longitudinal movement between said one or a plurality of magnets and the cathode; and
in the case of a plurality of magnets, said plurality of magnets being arranged in either
  i. one magnet package as spaced magnets of alternating polarity, or
  ii. in more than one magnet package with each magnet package including one magnet, or a plurality of spaced magnets arranged with alternating polarity,
c) a tubular cathode having a sputtering length of $L_s$,
a plurality of spaced magnet packages, each of the magnet packages including either one magnet or a plurality of spaced magnets of alternating polarity, and having a magnet package length $L_{pkg}$;
the magnet packages being held within the cathode, generally along the axis of symmetry of the cathode, such that a driving force applied to the magnet packages or to the cathode, or to both independently, imparts relative longitudinal movement between the magnet packages and the cathode, and wherein the spacing between the magnet packages, $L_{spc}$, is equal to or greater than $L_{pkg}$, and
d) a tubular cathode having a sputtering length of $L_s$;
a magnet package including either one magnet or a plurality of spaced magnets of alternating polarity, and having a magnet package length $L_{pkg}$ which is less than $L_s$, the magnet package being held within the cathode such that a driving force applied to the magnet package or to the cathode, or to both independently, imparts relative longitudinal movement between the magnet package and the cathode; and one or more means for positioning, and preventing radial displacement of, the cathode generally along the axis of symmetry of the workpiece, selected from
  i. a cathode tension device at each end of the cathode for holding the cathode in tension, in which case the cathode is generally cylindrical; or
  ii. one or more ring-shaped electrically insulating stand-offs along the outer surface of the cathode and between the ends of the cathode, wherein the insulating stand-offs are formed with one or more annular grooves which are shadowed from a line of sight of the sputtering so as to prevent electrical shorting during sputtering, and are sized to contact the inner surface of the workpiece to position the cathode generally along the axis of symmetry of the workpiece, and wherein an area of the workpiece is thereby shadowed by the insulating stand-offs, and ii) providing the one or more workpieces in an evacuable housing and holding the workpieces at a defined electrical potential relative to the potential of the cathodes;

providing one of the cathode assemblies selected from (a) to (d) within each of the one or more workpieces such that the tubular cathode is positioned in coating proximity within each of the one or more workpieces to be coated;

iii) providing a target material to be sputtered in thermal contact with the cathode over a distance of at least $L_s$, wherein $L_s$ is the sputtering length of the cathode;

iv) evacuating the housing;

v) admitting, and controlling the pressure of, one or more process gases to the housing;

vi) applying a voltage to each cathode sufficient to generate a plasma discharge; and vii) applying a driving force to:
  (i) the one or a plurality of magnet packages, or
  (ii) to both of the cathode assembly and the workpiece, or
  (iii) independently to the one or a plurality of magnet packages, the cathode and the workpiece, so as to impart relative longitudinal movement between said one or a plurality of magnet packages, the cathode, and the workpiece, and to coat the one or more workpieces positioned in the housing of the one or more cathode assemblies.

165. The method as set forth in claim 164, which further comprises circulating a coolant within each cathode.

166. The method as set forth in claim 165, which further comprises heating the one or more workpieces during cooling.

167. The method as set forth in claim 166, for sputtering inside the annular cavity of one or more hollow, curved workpieces, which further comprises:

providing one or more cathode assemblies, one for each workpiece to be coated, wherein each cathode assembly comprises:

a tubular cathode which is bendable to allow for insertion and positioning along the axis of symmetry of an annular cavity of the workpiece;

one or a plurality of magnets within the cathode, mounted on a flexible rod extending along the axis of symmetry of the cathode, and in the case of a plurality of magnets, said plurality of magnets being arranged in either
  i. one magnet package as spaced magnets of alternating polarity, or
  ii. in more than one magnet package with each magnet package including one magnet, or a plurality of spaced magnets arranged with alternating polarity, and applying a driving force to the flexible rod to impart longitudinal movement to said one or a plurality of magnets.

168. The method as set forth in claim 167, wherein a plurality of magnets are provided within each cathode, said plurality of magnets being arranged in either
  i. one magnet package as spaced magnets of alternating polarity, or
  ii. in more than one magnet package with each magnet package including one magnet, or a plurality of spaced magnets arranged with alternating polarity, and wherein a linear magnet actuator is connected to the flexible rod for applying the driving force in both directions such that the magnet packages are provided with shuttle movement.

169. The method as set forth in claim 168, wherein each cathode includes means for positioning, and preventing radial displacement of, the cathode generally along the axis of symmetry of the workpiece.

170. The method as set forth in claim 169, wherein the target material is provided as a coating on the outer surface of each cathode.

171. The method as set forth in claim 170, wherein each cathode is generally circular in cross section, and wherein said one or a plurality of magnets are generally cylindrical and are oriented generally symmetrically about the axis of symmetry of the cathode.

172. The method as set forth in claim 171, wherein one or more of the cathodes are generally U-shaped to coat the inside wall of U-shaped annular cavities in one or more workpieces.

173. The method as set forth in claim 171, wherein one or more of the cathodes are closed at one end to be generally finger-shaped, and wherein each such finger-shaped cathode has a fluid conduit within the flexible rod, and a coolant inlet and a coolant outlet at the end of the cathode which is not closed, such that cooling is achieved by circulating a fluid coolant in opposing directions in the fluid conduit and in an annular space formed between said one or a plurality of magnets and the inner cathode wall.

174. The method as set forth in claim 172, wherein one or more of the cathodes are closed at one end to be generally finger-shaped, and wherein each such finger-shaped cathode has a fluid conduit within the flexible rod, and a coolant inlet and a coolant outlet at the end of the cathode which is not closed, such that cooling is achieved by circulating a fluid coolant in opposing directions in the fluid conduit and in an annular space formed between said one or a plurality of magnets and the inner cathode wall.

175. The method as set forth in claim 171, wherein one or more of the cathodes have a coolant inlet at one end and a coolant outlet at the other end, such that cooling is achieved by circulating a fluid coolant through an annular space formed between said one or a plurality of magnets and the inner cathode wall.

176. The method as set forth in claim 172, wherein one or more of the cathodes have a coolant inlet at one end and a coolant outlet at the other end, such that cooling is achieved by circulating a fluid coolant through an annular space formed between said one or a plurality of magnets and the inner cathode wall.

177. The method as set forth in claim 173, wherein the means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, and wherein an area of the workpiece is thereby shadowed by the insulating stand-offs.

178. The method as set forth in claim 175, wherein the means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, and wherein an area of the workpiece is thereby shadowed by the insulating stand-offs.

179. The method as set forth in claim 177, wherein the insulating stand-offs include channels or cut-outs to allow for evacuation and the flow of process gas in an annular space between the workpiece and the cathode.

180. The method as set forth in claim 178, wherein the insulating stand-offs include channels or cut-outs to allow for evacuation and the flow of process gas in an annular space between the workpiece and the cathode.

181. The method as set forth in claim 179, wherein the insulating stand-offs are formed with one or more annular grooves which are shadowed from a line of sight of the sputtering so as to prevent electrical shorting during sputtering.

182. The method as set forth in claim 180, wherein the insulating stand-offs are formed with one or more annular grooves which are shadowed from a line of sight of the sputtering so as to prevent electrical shorting during sputtering.

183. The method as set forth in claim 181, wherein each cathode is connected to a linear cathode actuator for translating movement relative to the workpiece to be coated in order to move the cathode a distance sufficient to coat the workpiece in the area of the workpiece which is shadowed by the insulating stand-offs.

184. The method as set forth in claim 182, wherein each cathode is connected to a linear cathode actuator for translating movement relative to the workpiece to be coated in order to move the cathode a distance sufficient to coat the workpiece in the area of the workpiece which is shadowed by the insulating stand-offs.

185. The method as set forth in claim 183, wherein each cathode has a sputtering length of $L_s$ and wherein the combined length of all the magnet packages present, and the spaces between the magnet packages if there is more than one magnet package present, is less than half of $L_s$.

186. The method as set forth in claim 184, wherein each cathode has a sputtering length of $L_s$ and wherein the combined length of all the magnet packages present, and the spaces between the magnet packages if there is more than one magnet package present, is less than half of $L_s$.

187. The method as set forth in claim 185, wherein the flexible rod and all the magnet packages present are moved with a velocity of $V_{sh}$ which can be varied by applying a variable driving force to the flexible rod.

188. The method as set forth in claim 186, wherein the flexible rod and all the magnet packages present are moved with a velocity of $V_{sh}$ which can be varied by applying a variable driving force to the flexible rod.

189. The method as set forth in claim 166, for sputtering inside an annular cavity of one or more hollow workpieces, which further comprises:

providing one or more cathode assemblies, one for each workpiece to be coated, wherein each cathode assembly comprises:

a tubular cathode generally shaped to follow an axis of symmetry of an annular cavity of the workpiece, the cathode being flexible to allow the cathode to be inserted into an annular cavity of the workpiece and to position, and optionally to move, the cathode generally along the axis of symmetry of the annular cavity of the workpiece; and one or a plurality of magnets within the cathode mounted on a flexible rod extending generally along the axis of symmetry of the tubular cathode, in the case of a plurality of magnets, said plurality of magnets being arranged in either i. one magnet package as spaced magnets of alternating polarity, or ii. in more than one magnet package with each magnet package including one magnet, or a plurality of spaced magnets arranged with alternating polarity; and applying a driving force to said one or a plurality of magnets to impart relative longitudinal movement between said one or a plurality of magnets and the cathode.

190. The method as set forth in claim 189, wherein each cathode includes flexible vacuum tight joints spaced along its length to allow it to generally follow the axis of symmetry of the annular cavity of the workpiece.

191. The method as set forth in claim 190, wherein each cathode comprises a plurality of flexible vacuum tight bellow joints connecting rigid cylindrical cathode sections, and wherein at least one magnet package is included in each cylindrical cathode section for translating movement within that cylindrical cathode section.

192. The method as set forth in claim 191, wherein a linear magnet actuator is connected to the flexible rod for applying the driving force in both directions such that one or more magnet packages are provided with shuttle movement.

193. The method as set forth in claim 192, wherein each cathode includes means for positioning, and preventing radial displacement of, the cathode generally along the axis of symmetry of the workpiece.

194. The method as set forth in claim 193 wherein each cathode includes alternating repeating sections of two or more different target materials to create two or more sets of sections of different target materials along the cathode in order to produce sequential, multi-layer coatings of the different target materials.

195. The method as set forth in claim 194, wherein the one or more magnet packages are aligned for shuttle movement within only one of the sets of the sections of target material at a time, in order to sputter only one of the different target materials at a time, and wherein at least one of the cathode or the workpiece is adapted for relative translating movement in order to coat the workpiece with the target material with sequential layers of the different target materials.

196. The method as set forth in claim 195, wherein the target material is provided as a coating on the outer surface of the rigid cylindrical cathode sections.

197. The method as set forth in claim 196, wherein each cathode is generally circular in cross section, and wherein said one or a plurality of magnets are generally cylindrical and are oriented generally symmetrically about the axis of symmetry of the cathode.

198. The method as set forth in claim 197, wherein each cathode is generally S-shaped to coat the inner wall of an elbow-shaped annular cavity in a pipe or a fitting.

199. The method as set forth in claim 197, wherein each cathode is closed at one end to be generally finger-shaped, and wherein each cathode has a fluid conduit within the flexible rod, and a coolant inlet and a coolant outlet at the end of the cathode which is not closed, such that cooling is achieved by circulating a fluid coolant in opposing directions in the fluid conduit and in an annular space formed between said one or a plurality of magnets and the inner cathode wall.

200. The method as set forth in claim 197, wherein each cathode has a coolant inlet at one end and a coolant outlet at the other end, such that cooling is achieved by circulating a fluid coolant through an annular space formed between said one or a plurality of magnets and the inner cathode wall.

201. The method as set forth in claim 199, wherein the means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, and wherein an area of the workpiece is thereby shadowed by the insulating stand-offs.

202. The method as set forth in claim 200, wherein the means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, and wherein an area of the workpiece is thereby shadowed by the insulating stand-offs.

203. The method as set forth in claim 201, wherein the insulating stand-offs include channels or cut-outs to allow for evacuation and the flow of process gas in an annular space between the workpiece and the cathode.

204. The method as set forth in claim 202, wherein the insulating stand-offs include channels or cut-outs to allow for evacuation and the flow of process gas in an annular space between the workpiece and the cathode.

205. The method as set forth in claim 203, wherein the insulating stand-offs are formed with one or more annular grooves which are shadowed from a line of sight of the sputtering so as to prevent electrical shorting during sputtering.

206. The method as set forth in claim 204, wherein the insulating stand-offs are formed with one or more annular grooves which are shadowed from a line of sight of the sputtering so as to prevent electrical shorting during sputtering.

207. The method as set forth in claim 205, wherein each cathode is connected to a linear cathode actuator for translating movement relative to the workpiece to be coated in order to move the cathode a distance sufficient to coat the workpiece in the area of the workpiece which is shadowed by the insulating stand-offs.

208. The method as set forth in claim 207, wherein each cathode is connected to a linear cathode actuator for translating movement relative to the workpiece to be coated in order to move the cathode a distance sufficient to coat the workpiece in the area of the workpiece which is shadowed by the insulating stand-offs.

209. The method as set forth in claim 207, wherein each cathode has a sputtering length of $L_s$ and wherein the combined length of all the magnet packages present, and the spaces between the magnet packages if there is more than one magnet package present, is less than half of $L_s$.

210. The method as set forth in claim 208, wherein each cathode has a sputtering length of $L_s$ and wherein the combined length of all the magnet packages present, and the spaces between the magnet packages if there is more than one magnet package present, is less than half of $L_s$.

211. The method as set forth in claim 209, wherein the flexible rod and all the magnet packages present are moved with a velocity of $V_{sh}$ which can be varied by applying a variable driving force to the flexible rod.

212. The method as set forth in claim 210, wherein the flexible rod and all the magnet packages present are moved with a velocity of $V_{sh}$ which can be varied by applying a variable driving force to the flexible rod.

213. The method as set forth in claim 166, which further comprises:

providing one or more cathode assemblies, one for each workpiece, wherein each cathode assembly comprises:

a tubular cathode having a sputtering length of $L_s$;

a plurality of spaced magnet packages, each of the magnet packages including either one magnet or a plurality of spaced magnets of alternating polarity, and having a magnet package length $L_{pkg}$; and the magnet packages being held within the cathode, generally along the axis of symmetry of the cathode; and applying a driving force to the plurality of spaced magnet packages to impart relative longitudinal movement between the plurality of spaced magnet packages and the cathode.

214. The method as set forth in claim 213, wherein the spacing between the magnet packages, $L_{spc}$, is sufficiently large compared to $L_{pkg}$, that, during sputtering the time averaged magnetic field over the cathode surface remains substantially uniform.

215. The method as set forth in claim 213, wherein the combined length of all the magnet packages and the spaces between the magnet packages, is less than half of $L_s$.

216. The method as set forth in claim 215, wherein each magnet package includes a plurality of spaced magnets.

217. The method as set forth in claim 216, wherein the spacing between the magnet packages, $L_{spc}$, is equal to or greater than $L_{pkg}$.

218. The method as set forth in claim 217, further comprising applying a push and pull driving force to the magnet packages to impart relative longitudinal shuttle movement between the magnet packages and the cathode.

219. The method as set forth in claim 218, wherein the spacing between the magnet packages, $L_{spc}$, is equal to or greater than the magnet package length $L_{pkg}$, and wherein the shuttle distance, $L_{sh}$, is $L_{sh}=m(L_{spc}+L_{pkg})$, with m being an integer.

220. The method as set forth in claim 219, wherein m=1.

221. The method as set forth in claim 220, wherein each cathode includes one or more means for positioning, and preventing radial displacement of, the cathode generally along the axis of symmetry of the workpiece.

222. The method as set forth in claim 221, wherein said one or more means for positioning and preventing radial displacement of the cathode along the axis of symmetry of the workpiece comprises one or more ring-shaped electrically insulating stand-offs along the outer surface of each cathode sized to contact the inner surface of the workpiece to position the cathode generally along the axis of symmetry of the workpiece.

223. The method as set forth in claim 221, wherein said one or more means for positioning and preventing radial displacement of the cathode along the axis of symmetry of the workpiece comprises one or more ring-shaped electrically insulating stand-offs along the outer surface of each cathode sized to contact the inner surface of the workpiece to position the cathode generally along the axis of symmetry of the workpiece, and wherein the insulating stand-offs include channels or cut-outs to allow for evacuation and the flow of process gas in an annular space between the workpiece and the cathode.

224. The method as set forth in claim 221, wherein said one or more means for positioning and preventing radial displacement of the cathode along the axis of symmetry of the workpiece comprises one or more ring-shaped electrically insulating stand-offs along the outer surface of each cathode sized to contact the inner surface of the workpiece to position the cathode generally along the axis of symmetry of the workpiece, wherein the insulating stand-offs include channels or cut-outs to allow for evacuation and the flow of process gas in an annular space between the workpiece and the cathode, and wherein the insulating stand-offs are formed with one or more annular grooves which are shadowed from a line of sight of the sputtering so as to prevent electrical shorting during sputtering.

225. The method as set forth in claim 221, wherein said one or more means for positioning and preventing radial displacement of the cathode along the axis of symmetry of the workpiece comprises one or more ring-shaped electrically insulating stand-offs along the outer surface of each cathode sized to contact the inner surface of the workpiece to position the cathode generally along the axis of symmetry of the workpiece, wherein an area of the workpiece is thereby shadowed by the insulating stand-offs, wherein the insulating stand-offs include channels or cut-outs to allow for evacuation and the flow of process gas in an annular space between the workpiece and the cathode, wherein the insulating stand-offs are formed with one or more annular grooves which are shadowed from a line of sight of the sputtering so as to prevent electrical shorting during sputtering, and wherein each cathode is connected to a linear cathode actuator for translating movement relative to the workpiece to be coated in order to move the cathode a distance sufficient to coat the workpiece in the area of the workpiece which is shadowed by the insulating stand-offs.

226. The method as set forth in claim 225, wherein the magnets may have an equal or unequal length of $L_m$, be spaced within a package by an equal or unequal magnet space of $L_{ms}$, having equal or unequal magnet package lengths $L_{pkg}$, and having equal or unequal spacing between magnet packages of $L_{spc}$, such that:

$$L_{pkg}^i \approx \sum_{j=1}^{k} L_m^{ij} + \sum_{j=1}^{k-1} L_{ms}^{ij}$$

$$L_\Sigma \approx \sum_{i=1}^{n} L_{pkg}^i + \sum_{i=1}^{n-1} L_{spc}^i$$

wherein k is the number of magnets in a magnet package, n is the number of magnet packages, $L_\Sigma$ is the combined length of a plurality of magnet packages.

227. The method as set forth in claim 226, wherein k=1 and $L_{spc}$ is greater than one half of $L_m$.

228. The method as set forth in claim 227, wherein k>1 and $L_{spc}$ is greater than $L_{ms}$.

229. The method as set forth in claim 227, wherein $L_{spc}$ is greater than $L_{pkg}$.

230. The method as set forth in claim 229, wherein the magnet packages are held within the cathode for shuttle movement within the cathode with a shuttle distance $L_{sh}$ which is approximately equal to $L_s-L_\Sigma$.

231. The method as set forth in claim 230, wherein the number of magnet packages is n, the magnet packages are generally of equal length and are generally equally spaced, the magnets within a package are generally equally spaced, and the magnet packages are held within the cathode for shuttle movement within the cathode with a shuttle distance $L_{sh}$, such that, in order to sputter over the length $L_s$, the number of magnet packages and the magnet spacing is such that $L_s=n*L_{pkg}+(n-1)*L_{spc}+L_{sh}$, wherein $L_{sh}=m(L_{spc}+L_{pkg})$, with m being an integer.

232. The method as set forth in claim 231, wherein m=1.

233. The method as set forth in claim 232, wherein the cathode is curved for sputtering inside an annular cavity of a hollow, curved workpiece.

234. The method as set forth in claim 221, wherein each cathode is generally cylindrical and wherein said one or more means for positioning and preventing radial displacement of the cathode along the axis of symmetry of the workpiece comprises a cathode tension device at each end of the cylindrical cathode for holding the cathode in tension.

235. The method as set forth in claim 234, wherein said one or more means for positioning and preventing radial displacement of the cathode along the axis of symmetry of the workpiece comprises one or more ring-shaped electrically insulating stand-offs along the outer surface of each cathode sized to contact the inner surface of the workpiece to position the cathode generally along the axis of symmetry of the workpiece.

236. The method as set forth in claim 234, wherein said one or more means for positioning and preventing radial displacement of the cathode along the axis of symmetry of the workpiece comprises one or more ring-shaped electrically insulating stand-offs along the outer surface of each cathode sized to contact the inner surface of the workpiece to position the cathode generally along the axis of symmetry of the workpiece, and wherein the insulating stand-offs include channels or cut-outs to allow for evacuation and the flow of process gas in an annular space between the workpiece and the cathode.

237. The method as set forth in claim 234, wherein said one or more means for positioning and preventing radial displacement of the cathode along the axis of symmetry of the workpiece comprises one or more ring-shaped electrically insulating stand-offs along the outer surface of each cathode sized to contact the inner surface of the workpiece to position the cathode generally along the axis of symmetry of the workpiece, wherein the insulating stand-offs include channels or cut-outs to allow for evacuation and the flow of process gas in an annular space between the workpiece and the cathode, and wherein the insulating stand-offs are formed with one or more annular grooves which are shadowed from a line of sight of the sputtering so as to prevent electrical shorting during sputtering.

238. The method as set forth in claim 234, wherein said one or more means for positioning and preventing radial displacement of the cathode along the axis of symmetry of the workpiece comprises one or more ring-shaped electrically insulating stand-offs along the outer surface of each cathode sized to contact the inner surface of the workpiece to position the cathode generally along the axis of symmetry of the workpiece, wherein an area of the workpiece is thereby shadowed by the insulating stand-offs, wherein the insulating stand-offs include channels or cut-outs to allow for evacuation and the flow of process gas in an annular space between the workpiece and the cathode, wherein the insulating stand-offs are formed with one or more annular grooves which are shadowed from a line of sight of the sputtering so as to prevent electrical shorting during sputtering, and wherein each cathode is connected to a linear cathode actuator for translating movement relative to the workpiece to be coated in order to move the cathode a distance sufficient to coat the workpiece in the area of the workpiece which is shadowed by the insulating stand-offs.

239. The method as set forth in claim 238, wherein the magnets may have an equal or unequal length of $L_m$, be spaced within a package by an equal or unequal magnet space of $L_{ms}$, having equal or unequal magnet package lengths $L_{pkg}$, and having equal or unequal spacing between magnet packages of $L_{spc}$, such that:

$$L_{pkg}^i \approx \sum_{j=1}^{k} L_m^{ij} + \sum_{j=1}^{k-1} L_{ms}^{ij}$$

$$L_\Sigma \approx \sum_{i=1}^{n} L_{pkg}^i + \sum_{i=1}^{n-1} L_{spc}^i$$

wherein k is the number of magnets in a magnet package, n is the number of magnet packages, $L_\Sigma$ is the combined length of a plurality of magnet packages.

240. The method as set forth in claim 239, wherein k=1 and $L_{spc}$ is greater than one half of $L_m$.

241. The method as set forth in claim 240, wherein k>1 and $L_{spc}$ is greater than $L_{ms}$.

242. The method as set forth in claim 241, wherein $L_{spc}$ is greater than $L_{pkg}$.

243. The method as set forth in claim 242, wherein the magnet packages are held within the cathode for shuttle movement within the cathode with a shuttle distance $L_{sh}$ which is approximately equal to $L_s-L_\Sigma$.

244. The method as set forth in claim 243, wherein the number of magnet packages is n, the magnet packages are generally of equal length and are generally equally spaced, the magnets within a package are generally equally spaced, and the magnet packages are held within the cathode for shuttle movement within the cathode with a shuttle distance $L_{sh}$, such that, in order to sputter over the length $L_s$, the number of magnet packages and the magnet spacing is such that $L_s=n*L_{pkg}+(n-1)*L_{spc}+L_{sh}$, wherein $L_{sh}=m(L_{spc}+L_{pkg})$, with m being an integer.

245. The method as set forth in claim 244, wherein m=1.

246. The method as set forth in claim 245, wherein the cathode is curved for sputtering inside an annular cavity of a hollow, curved workpiece.

247. The method as set forth in claim 246, each cathode assembly further comprises:
 a central rod extending within the cathode along the axis of symmetry of the cathode; and
 the magnet packages being held in spaced relationship on the central rod; and
 wherein a linear magnet actuator is connected to the central rods for applying the driving force to the magnet packages.

248. The method as set forth in claim 247, wherein each central rod is adapted for longitudinal shuttle movement, and the magnet packages therewith, relative to the cathode, when a push and pull driving force is applied by the linear magnet actuator to the central rods.

249. The method as set forth in claim 248, wherein each central rod and the magnet packages are moved with a velocity of $V_{sh}$ which can be varied by applying a variable driving force through the linear magnet actuator to the central rods.

250. The method as set forth in claim 249, wherein the magnets are generally equally spaced within a magnet package, and optionally at the ends of the magnet package, by spacers formed from soft magnetic material so as to generate a generally ring-shaped magnetic field.

251. The method as set forth in claim 250, wherein means are provided for retaining the magnets on the central rod in fixed relationship within and between each package.

252. The method as set forth in claim 249, wherein the magnets are held in generally equally spaced relationship within the package by magnetic repulsion and wherein means are provided for retaining the magnets on the central rod in fixed relationship within and between each magnet package so that a ring-shaped magnetic field is generated around each magnet.

253. The method as set forth in claim 252, wherein each cathode includes alternating repeating sections of two or more different target materials to create two or more sets of sections of different target material along the cathode in order to produce sequential, multi-layer coatings of the different target materials.

254. The method as set forth in claim 253, wherein one or more magnet packages are aligned for shuttle movement within only one set of the sections of target material at a time, in order to sputter only one of the different target materials at a time, and wherein at least one of the cathode or the workpiece is adapted for relative translating movement in order to coat the workpiece with the target material with sequential layers of the different target materials.

255. The method as set forth in claim 254, wherein the target material is provided as a coating on the outer surface of each cathode.

256. The method as set forth in claim 255, wherein each cathode is generally cylindrical, and wherein the magnets are generally cylindrical and are oriented generally symmetrically about the axis of symmetry of the cathode.

257. The method as set forth in claim 256, wherein each cathode is curved for coating inside an annular cavity of a hollow, curved workpiece, and wherein each central rod is flexible to allow for longitudinal shuttle movement within the curved cathode.

258. The method as set forth in claim 257, wherein each cathode is generally shaped to follow an axis of symmetry of an annular cavity of a hollow workpiece to be coated, and wherein each central rod is flexible to allow for translating movement within the cathode.

259. The method as set forth in claim 258, wherein at least one cathode is generally U-shaped to coat the inner wall of a U-shaped annular cavity in a workpiece.

260. The method as set forth in claim 258, wherein at least one cathode is generally elbow-shaped to coat the inner wall of an elbow-shaped annular cavity in a workpiece.

261. The method as set forth in claim 255, wherein at least one cathode is closed at one end to be generally finger-shaped.

262. The method as set forth in claim 261, wherein at least one cathode is curved for coating inside an annular cavity of a hollow, curved workpiece, and wherein the central rod in the curved cathode is flexible to allow for longitudinal shuttle movement within the curved cathode.

263. The method as set forth in claim 262, wherein at least one cathode is generally shaped to follow an axis of symmetry of an annular cavity of a hollow workpiece to be coated, and wherein the central rod in that shaped cathode is flexible to allow for translating movement within the cathode.

264. The method as set forth in claim 258, wherein at least one cathode is flexible to allow that flexible cathode to be inserted into the annular cavity of the workpiece and to position, and optionally to move, that flexible cathode generally along the axis of symmetry of the annular cavity of the workpiece.

265. The method as set forth in claim 264, wherein the shaped cathode includes flexible vacuum tight joints spaced along its length to allow it to generally follow the axis of symmetry of the annular cavity of the workpiece.

266. The method as set forth in claim 263, wherein the shaped cathode comprises a plurality of flexible vacuum tight bellow joints connecting rigid cylindrical cathode sections, and wherein at least one magnet package is included in each cylindrical cathode section for longitudinal shuttle movement within that cylindrical cathode section.

267. The method as set forth in claim 266, wherein the shaped cathode is provided with ring-shaped electrically insulating stand-offs on either side of each bellow joint to contact the inner surface of the workpiece to be coated and to position the cathode generally along the axis of symmetry of the workpiece, and wherein an area of the workpiece is shadowed by the insulating stand-offs.

268. The method as set forth in claim 267, wherein the insulating stand-offs include channels or cut-outs to allow for evacuation and the flow of process gas in an annular space between the workpiece and the cathode.

269. The method as set forth in claim 268, wherein the insulating stand-offs are formed with one or more annular grooves which are shadowed from a line of sight of the sputtering so as to prevent electrical shorting during sputtering.

270. The method as set forth in claim 269, wherein each cathode has a coolant inlet at one end and a coolant outlet at the other end, such that cooling is achieved by circulating a fluid coolant through an annular space formed between the magnets and the inner cathode wall.

271. The method as set forth in claim 269, wherein each cathode is closed at one end to be generally finger-shaped, and wherein each cathode has a fluid conduit within the flexible rod, and a coolant inlet and a coolant outlet at the end of the cathode which is not closed, such that cooling is achieved by circulating a fluid coolant in opposing directions in the fluid conduit and in an annular space formed between the magnets and the inner cathode wall.

272. The method as set forth in claim 270, wherein each cathode is adapted for translating movement relative to the workpiece to be coated in order to move the cathode a distance sufficient to coat the workpiece in the area of the workpiece which is shadowed by the insulating stand-offs.

273. The method as set forth in claim 271, wherein each cathode is adapted for translating movement relative to the workpiece to be coated in order to move the cathode a distance sufficient to coat the workpiece in the area of the workpiece which is shadowed by the insulating stand-offs.

274. The method as set forth in claim 256, 258, 259, or 260, wherein each cathode is closed at one end to be generally finger-shaped, and wherein each cathode has a fluid conduit within the flexible rod, and a coolant inlet and a coolant outlet at the end of the cathode which is not closed, such that cooling is achieved by circulating a fluid coolant in opposing directions in the fluid conduit and in an annular space formed between the magnets and the inner cathode wall.

275. The method as set forth in claim 256, 258, 259, or 260, wherein each cathode has a coolant inlet at one end and a coolant outlet at the other end, such that cooling is achieved by circulating a fluid coolant through an annular space formed between the magnets and the inner cathode wall.

276. The method as set forth in claim 166, which further comprises: providing one more cathode assemblies, one for each workpiece, wherein each cathode assembly comprises:
   a tubular cathode having a sputtering length of $L_s$;
   a magnet package within the cathode, said magnet package including either one magnet or a plurality of spaced magnets of alternating polarity, and having a magnet package length $L_{pkg}$ which is less than $L_s$;
   one or more means for positioning, and preventing radial displacement of, the cathode generally along the axis of symmetry of the workpiece, selected from
      i. a cathode tension device at each end of the cathode for holding the cathode in tension, in which case the cathode is generally cylindrical; or
      ii. one or more ring-shaped electrically insulating stand-offs along the outer surface of the cathode and between the ends of the cathode, sized to contact the inner surface of the workpiece to position the cathode generally along the axis of the symmetry of the workpiece; and
   applying a driving force to the magnet package to impart relative longitudinal movement between the magnet package and the cathode.

277. The method as set forth in claim 276, wherein the means for positioning and preventing radial displacement of the cathode along the axis of symmetry of the workpiece comprises one or more ring-shaped electrically insulating stand-offs along the outer surface of each cathode sized to contact the inner surface of the workpiece to position the cathode generally along the axis of symmetry of the workpiece, and wherein the insulating stand-offs include channels or cut-outs to allow for evacuation and the flow of process gas in an annular space between the workpiece and the cathode.

278. The method as set forth in claim 276, wherein the means for positioning and preventing radial displacement of the cathode along the axis of symmetry of the workpiece comprises one or more ring-shaped electrically insulating stand-offs along the outer surface of the cathode sized to contact the inner surface of the workpiece to position the cathode generally along the axis of symmetry of the workpiece, wherein the insulating stand-offs include channels or cut-outs to allow for evacuation and the flow of process gas in an annular space between the workpiece and the cathode, and wherein the insulating stand-offs are formed with one or more annular grooves which are shadowed from a line of sight of the sputtering so as to prevent electrical shorting during sputtering.

279. The method as set forth in claim 276, wherein the means for positioning and preventing radial displacement of the cathode along the axis of symmetry of the workpiece comprises one or more ring-shaped electrically insulating stand-offs along the outer surface of each cathode sized to contact the inner surface of the workpiece to position the cathode generally along the axis of symmetry of the workpiece, wherein an area of the workpiece is thereby shadowed by the insulating stand-offs, wherein the insulating stand-offs include channels or cut-outs to allow for evacuation and the flow of process gas in an annular space between the workpiece and the cathode, wherein the insulating stand-offs are formed with one or more annular grooves which are shadowed from a line of sight of the sputtering so as to prevent electrical shorting during sputtering, and wherein each cathode is connected to a linear cathode actuator for translating movement relative to the workpiece to be coated in order to move the cathode a distance sufficient to coat the workpiece in the area of the workpiece which is shadowed by the insulating stand-offs.

280. The method as set forth in claim 279, wherein the magnet package includes a plurality of spaced magnets, and wherein the length of the magnet package is less than half of $L_s$.

281. The method as set forth in claim 281, wherein each cathode assembly further comprises:
- a central rod extending within the cathode along the axis of symmetry of the cathode; and
- the magnet package being mounted on the central rod; and
- wherein a linear magnet actuator is connected to the central rods for applying the driving force to the magnet package.

282. The method as set forth in claim 281, wherein each central rod is adapted for longitudinal shuttle movement, and the magnet package therewith, relative to the cathode, when a push and pull driving force is applied by the linear magnet actuator to the central rods.

283. The method as set forth in claim 282, wherein each cathode includes alternating repeating sections of two or more different target materials to create two or more sets of sections of different target material along the cathode in order to produce sequential, multi-layer coatings of the different target materials.

284. The method as set forth in claim 283, wherein the magnet package is aligned for shuttle movement within only one set of the sections of target material at a time, in order to sputter only one of the different target materials at a time, and wherein at least one of the cathode or the workpiece is adapted for relative translating movement in order to coat the workpiece with the target material with sequential layers of the different target materials.

285. The method as set forth in claim 282, wherein the central rod and the magnet package are moved with a velocity of $V_{sh}$ which can be varied by applying a variable driving force to the central rod.

286. The method as set forth in claim 284, wherein the central rod and the magnet package are moved with a velocity of $V_{sh}$ which can be varied by applying a variable driving force to the central rod.

287. The method as set forth in claim 285, wherein each cathode is closed at one end to be generally finger-shaped, and wherein each cathode has a fluid conduit within the flexible rod, and a coolant inlet and a coolant outlet at the end of the cathode which is not closed, such that cooling is achieved by circulating a fluid coolant in opposing directions in the fluid conduit and in an annular space formed between the magnets and the inner cathode wall.

288. The method as set forth in claim 285, wherein each cathode has a coolant inlet at one end and a coolant outlet at the other end, such that cooling is achieved by circulating a fluid coolant through an annular space formed between the magnets and the inner cathode wall.

289. The method as set forth in claim 287, which includes a plurality of spaced magnet packages and wherein the combined length of all the magnet packages and the spaces between the magnet packages is less than half of $L_s$.

290. The method as set forth in claim 288, which includes a plurality of spaced magnet packages and wherein the combined length of all the magnet packages and the spaces between the magnet packages is less than half of $L_s$.

* * * * *